US012740164B2

(12) United States Patent
Jin et al.

(10) Patent No.: US 12,740,164 B2
(45) Date of Patent: Sep. 15, 2026

(54) LIGHT DETECTION DEVICE AND ELECTRONIC DEVICE

(71) Applicant: SONY SEMICONDUCTOR SOLUTIONS CORPORATION, Kanagawa (JP)

(72) Inventors: Shengji Jin, Kanagawa (JP); Yusuke Moriya, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 309 days.

(21) Appl. No.: 18/551,173

(22) PCT Filed: Mar. 1, 2022

(86) PCT No.: PCT/JP2022/008653

§ 371 (c)(1),
(2) Date: Sep. 18, 2023

(87) PCT Pub. No.: WO2022/202151

PCT Pub. Date: Sep. 29, 2022

(65) Prior Publication Data

US 2024/0194700 A1 Jun. 13, 2024

(30) Foreign Application Priority Data

Mar. 26, 2021 (JP) ................................. 2021-053035

(51) Int. Cl.
*H10F 39/00* (2025.01)
*H10F 39/18* (2025.01)

(52) U.S. Cl.
CPC ......... *H10F 39/802* (2025.01); *H10F 39/011* (2025.01); *H10F 39/182* (2025.01); *H10F 39/8053* (2025.01); *H10F 39/8063* (2025.01)

(58) Field of Classification Search
CPC .. H10F 39/802; H10F 39/182; H10F 39/8063; H10F 39/011; H10F 39/8053
See application file for complete search history.

(56) References Cited

U.S. PATENT DOCUMENTS 8,853,758 B2 * 10/2014 Ootsuka .............. H10F 39/8063 257/435
2010/0134663 A1 * 6/2010 Yokozawa .......... H10F 39/8063 348/E5.091

(Continued)

FOREIGN PATENT DOCUMENTS

JP 2010-272654 A 12/2010
JP 2013-156463 A 8/2013

(Continued)

OTHER PUBLICATIONS ip.com search (Year: 2025).*

(Continued)

*Primary Examiner* — Zandra V Smith
*Assistant Examiner* — Andre C Stevenson
(74) *Attorney, Agent, or Firm* — CHIP LAW GROUP

(57) ABSTRACT

Provided is a light detection device capable of reducing an inter-same-color sensitivity difference Provided are: a color filter layer including a plurality of color filters each transmitting light of a predetermined wavelength component contained in light condensed by a microlens; and a low-refractive-index layer that is at least partially arranged between the color filters and contains air or a low-refractive-index material having a lower refractive index than a material of an adjacent layer. Then, the low-refractive-index layer has a first width on the microlens side and a second width, narrower than the first width, on a side closer to a substrate than a portion having the first width.

22 Claims, 53 Drawing Sheets

(56) References Cited

U.S. PATENT DOCUMENTS

| | | | | |
|---|---|---|---|---|
| 2015/0054103 | A1 | 2/2015 | Mackey | |
| 2015/0270298 | A1* | 9/2015 | Lin | H10F 39/8063<br>438/70 |
| 2019/0369355 | A1* | 12/2019 | Fukuyama | G03B 3/10 |
| 2020/0098813 | A1 | 3/2020 | Huang et al. | |

FOREIGN PATENT DOCUMENTS

| | | | |
|---|---|---|---|
| JP | 2013-211413 | A | 10/2013 |
| JP | 2016-096323 | A | 5/2016 |
| JP | 2016-219770 | A | 12/2016 |
| JP | 2017-028241 | A | 2/2017 |
| JP | 2018-082138 | A | 5/2018 |
| WO | 2017/073321 | A1 | 5/2017 |
| WO | 2019/097936 | A1 | 5/2019 |
| WO | 2020/137285 | A1 | 7/2020 |
| WO | 2020/158443 | A1 | 8/2020 |
| WO | 2020/175195 | A1 | 9/2020 |

OTHER PUBLICATIONS ip.com search (Year: 2026).*

International Search Report and Written Opinion of PCT Application No. PCT/JP2022/008653, issued on May 24, 2022, 12 pages of ISRWO.

* cited by examiner 17
14
16
S4
15
13
2
G
R
24
27
Wwide
Or
Og
26 (26f)
26 (26e)
26 (26d)
25
S1
S3
22
23
20
21

17
14
16
S4
15
13
2
G
R
27
24
Wwide
Or
Og
25
S1
S3
22
23
20
21

17
14
16
S4
15
13
2
G
R
27
24
SIDE CLOSER TO CENTRAL PORTION OF PIXEL REGION
26(26b)
26(26a)
25
S1
S3
22
23
20
21

24
27
32
33
16
F
F
Wwide
S4
17
26 (26b)
25
26 (26a)
Og
Or
R
G
15
S1
S3
13
22
23
20
21
14
2

S5
S7
S6
24
27
33
16
S8
S4
17
25
26 (26b)
26 (26a)
R
G
S1
S3
15
13
22
23
20
21
2
14
SIDE CLOSER TO CENTRAL PORTION OF PIXEL REGION

S5
S7
S9
S6
24
27
33
34
16
S8
S4
17
25
26 (26b)
26 (26a)
S1
R
G
15
S3
13
22
23
20
21
14
2
SIDE CLOSER TO CENTRAL PORTION OF PIXEL REGION 17
14
16
S8
S4
15
13
2
34
33
G
S10
27
24
R
32
S6
S9
32
S7
S5
26 (26b)
26 (26a)
25
S1
S3
22
23
20
21
SIDE CLOSER TO CENTRAL PORTION OF PIXEL REGION

S7
S6
24
27
33
32b
32a
32b
32
16
S5
S8
S4
17
26 (26b)
26 (26a)
25
R
G
S1
15
S3
13
22
23
20
21
14
2
SIDE CLOSER TO CENTRAL PORTION OF PIXEL REGION

1001 LENS GROUP

1002 SOLID-STATE IMAGING DEVICE

1003 DSP CIRCUIT

1004 FRAME MEMORY

1005 MONITOR

1006 MEMORY

1007

LIGHT DETECTION DEVICE AND ELECTRONIC DEVICE

CROSS REFERENCE TO RELATED APPLICATIONS

This application is a U.S. National Phase of International Patent Application No. PCT/JP2022/008653 filed on Mar. 1, 2022, which claims priority benefit of Japanese Patent Application No. JP 2021-053035 filed in the Japan Patent Office on Mar. 26, 2021. Each of the above-referenced applications is hereby incorporated herein by reference in its entirety.

TECHNICAL FIELD

The present disclosure relates to a light detection device and an electronic device.

BACKGROUND ART

Conventionally, a light detection device having a structure in which one microlens is shared by four adjacent photoelectric conversion units is proposed (see, for example, Patent Document 1). In the light detection device described in Patent Document 1, a distance to a subject can be calculated on the basis of a difference among signal charges of the four photoelectric conversion units. Therefore, all pixels can be used as autofocus sensors.

CITATION LIST

Patent Document

Patent Document 1: Japanese Patent Application Laid-Open No. 2013-211413

SUMMARY OF THE INVENTION

Problems to be Solved by the Invention

In such a light detection device, however, when overlay misalignment (manufacturing error) of the microlenses occur, for example, a center of a light-condensed spot of incident light is misaligned from a center of the four photoelectric conversion units, and there is a possibility that a light receiving sensitivity difference (inter-same-color sensitivity difference) is generated between among the photoelectric conversion units.

An object of the present disclosure is to provide a light detection device and an electronic device capable of reducing an inter-same-color sensitivity difference.

Solutions to Problems

A light detection device according to the present disclosure includes: (a) a substrate having a plurality of photoelectric conversion units arranged in a two-dimensional array; (b) a microlens layer that is arranged on a side close to a light receiving surface of the substrate and includes a plurality of microlenses formed to correspond to a photoelectric conversion unit group including at least two adjacent photoelectric conversion units; (c) a color filter layer that is arranged between the substrate and the microlens layer, and includes a plurality of color filters transmitting light of a predetermined wavelength component contained in light condensed by the microlens; and (d) a low-refractive-index layer that is at least partially arranged between the color filters, and contains air or a low-refractive-index material having a lower refractive index than a material of an adjacent layer, (e) the low-refractive-index layer having a first width on a side close to the microlens and having a second width narrower than the first width on a side closer to the substrate than a portion having the first width.

An electronic device of the present disclosure includes a light detection device including: (a) a substrate having a plurality of photoelectric conversion units arranged in a two-dimensional array; (b) a microlens layer that is arranged on a side close to a light receiving surface of the substrate and includes a plurality of microlenses formed to correspond to a photoelectric conversion unit group including at least two adjacent photoelectric conversion units; (c) a color filter layer that is arranged between the substrate and the microlens layer, and includes a plurality of color filters transmitting light of a predetermined wavelength component contained in light condensed by the microlens; and (d) a low-refractive-index layer that is at least partially arranged between the color filters, and contains air or a low-refractive-index material having a lower refractive index than a material of an adjacent layer, (e) the low-refractive-index layer having a first width on a side close to the microlens and having a second width narrower than the first width on a side closer to the substrate than a portion having the first width.

BRIEF DESCRIPTION OF DRAWINGS

FIG. 32 is a view illustrating a cross-sectional configuration of a solid-state imaging device according to a modification.

FIG. 33 is a view illustrating a cross-sectional configuration of a solid-state imaging device according to a modification.

FIG. 49 is a schematic configuration diagram of an electronic device according to a second embodiment.

MODE FOR CARRYING OUT THE INVENTION

Hereinafter, examples of a light detection device and an electronic device according to an embodiment of the present disclosure will be described with reference to FIGS. 1, 2A, 2B, 3, 4, 5, 6, 7, 8, 9, 10, 11, 12, 13A, 13B, 14, 15, 16, 17, 18, 19, 20, 21, 22A, 22B, 23A, 23B, 24, 25, 26, 27A, 27B, 27C, 27D, 28, 29, 30, 31, 32, 33, 34, 35A, 35B, 36, 37, 38, 39, 40, 41, 42, 43, 44, 45, 46, 47, 48, and 49. The embodiments of the present disclosure will be described in the following order. Note that the present disclosure is not limited to the following examples. Furthermore, effects described in the present specification are examples and are not limited, and other effects may be present.

1. First embodiment: solid-state imaging device 1-1 Overall configuration of solid-state imaging device 1-2 Configuration of main part 1-3 Modifications 2. Second embodiment: example of application to electronic device

1. First Embodiment: Solid-State Imaging Device

[1-1 Overall Configuration of Solid-State Imaging Device]

Figure 1:
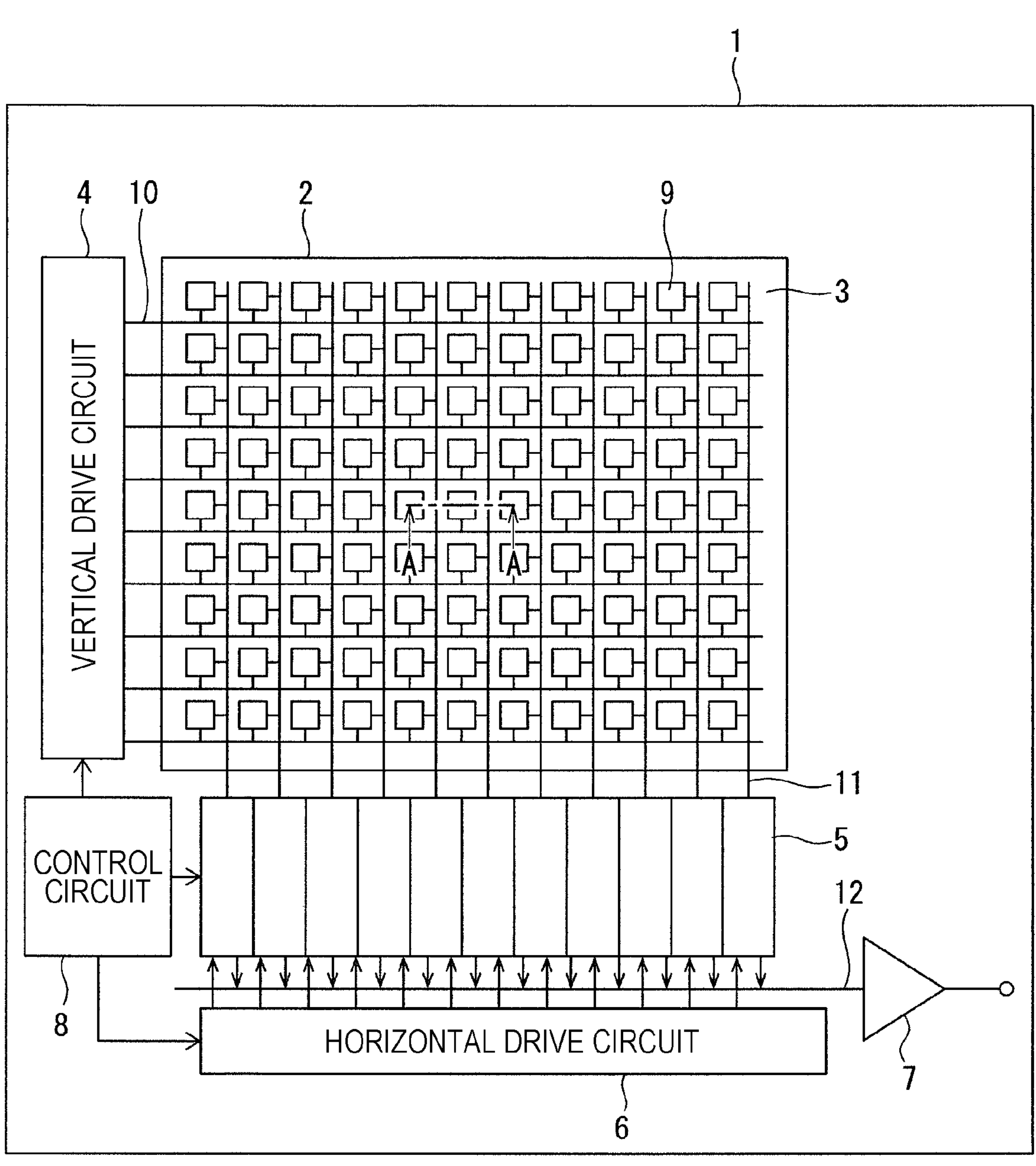
FIG. 1 is a diagram illustrating an overall configuration of a solid-state imaging device according to a first embodiment.

A solid-state imaging device 1 (in a broad sense, a "light detection device") according to a first embodiment of the present disclosure will be described. FIG. 1 is a schematic configuration diagram illustrating the entire solid-state imaging device 1 according to the first embodiment.

Figure 49:
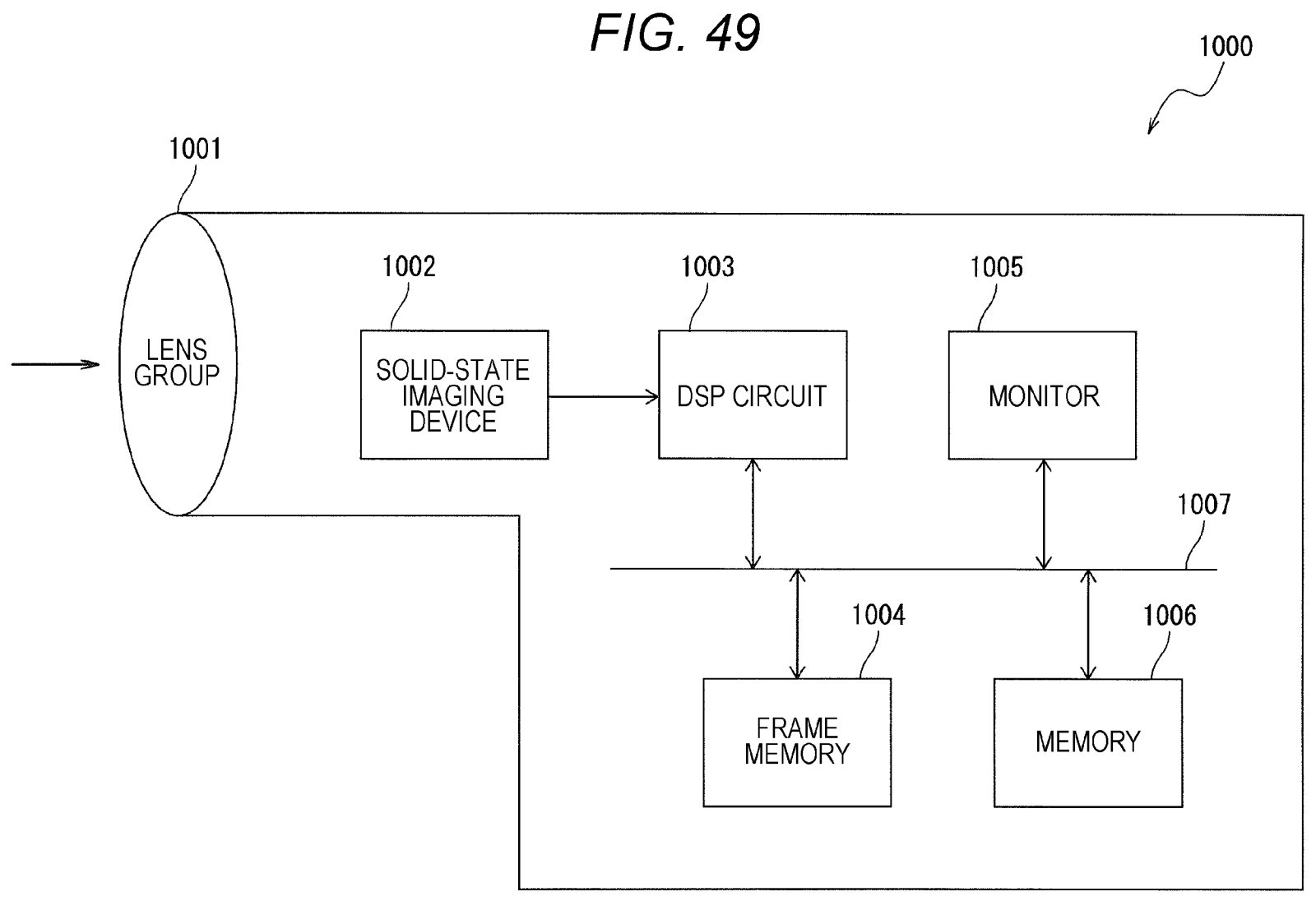

The solid-state imaging device 1 in FIG. 1 is a back-illuminated complementary metal oxide semiconductor (CMOS) image sensor. As depicted in FIG. 49, the solid-state imaging device 1 (1002) takes image light (incident light) from a subject via a lens group 1001, converts a light amount of the incident light formed on an imaging surface into an electric signal in units of pixels, and outputs the electric signal as a pixel signal.

As illustrated in FIG. 1, the solid-state imaging device 1 includes a substrate 2, a pixel region 3, a vertical drive circuit 4, a column signal processing circuit 5, a horizontal drive circuit 6, an output circuit 7, and a control circuit 8.

The pixel region 3 has a plurality of pixels 9 regularly arrayed in a two-dimensional array on the substrate 2. The pixel 9 includes a photoelectric conversion unit 20 illustrated in FIG. 2A and a plurality of pixel transistors (not illustrated). As the plurality of pixel transistors, for example, four transistors of a transfer transistor, a reset transistor, a selection transistor, and an amplification transistor can be adopted. Furthermore, for example, three transistors excluding the selection transistor may be adopted.

The vertical drive circuit 4 is configured using, for example, a shift register, selects a desired pixel drive wiring 10, supplies a pulse for driving the pixels 9 to the selected pixel drive wiring 10, and drives the respective pixels 9 in units of rows. That is, the vertical drive circuit 4 selectively scans each of the pixels 9 in the pixel region 3 sequentially in a vertical direction on a row basis, and supplies a pixel signal based on a signal charge generated in accordance with an amount of received light in the photoelectric conversion unit 20 of each of the pixels 9, to the column signal processing circuit 5 through a vertical signal line 11.

The column signal processing circuit 5 is arranged, for example, for each column of the pixels 9, and performs signal processing, such as noise removal, on signals output from the pixels 9 of one row for each pixel column. For example, the column signal processing circuit 5 performs signal processing such as correlated double sampling (CDS) for removing fixed pattern noise unique to pixels, and analog-digital (AD) conversion.

The horizontal drive circuit 6 includes, for example, a shift register, sequentially outputs a horizontal scanning pulse to the column signal processing circuit 5, sequentially selects each of the column signal processing circuits 5, and causes each of the column signal processing circuits 5 to output a pixel signal subjected to signal processing to a horizontal signal line 12.

The output circuit 7 performs signal processing on the pixel signals sequentially supplied from each of the column signal processing circuits 5 through the horizontal signal line 12, and outputs the pixel signals. As the signal processing, for example, buffering, black level adjustment, column variation correction, various types of digital signal processing, and the like can be used.

The control circuit 8 generates a clock signal and a control signal serving as a reference of operations of the vertical drive circuit 4, the column signal processing circuit 5, the horizontal drive circuit 6, and the like, on the basis of a vertical synchronization signal, a horizontal synchronization signal, and a master clock signal. Then, the control circuit 8 outputs the clock signal or control signal thus generated to the vertical drive circuit 4, the column signal processing circuit 5, the horizontal drive circuit 6, and the like.

[1-2 Configuration of Main Part]

Figure 2A:
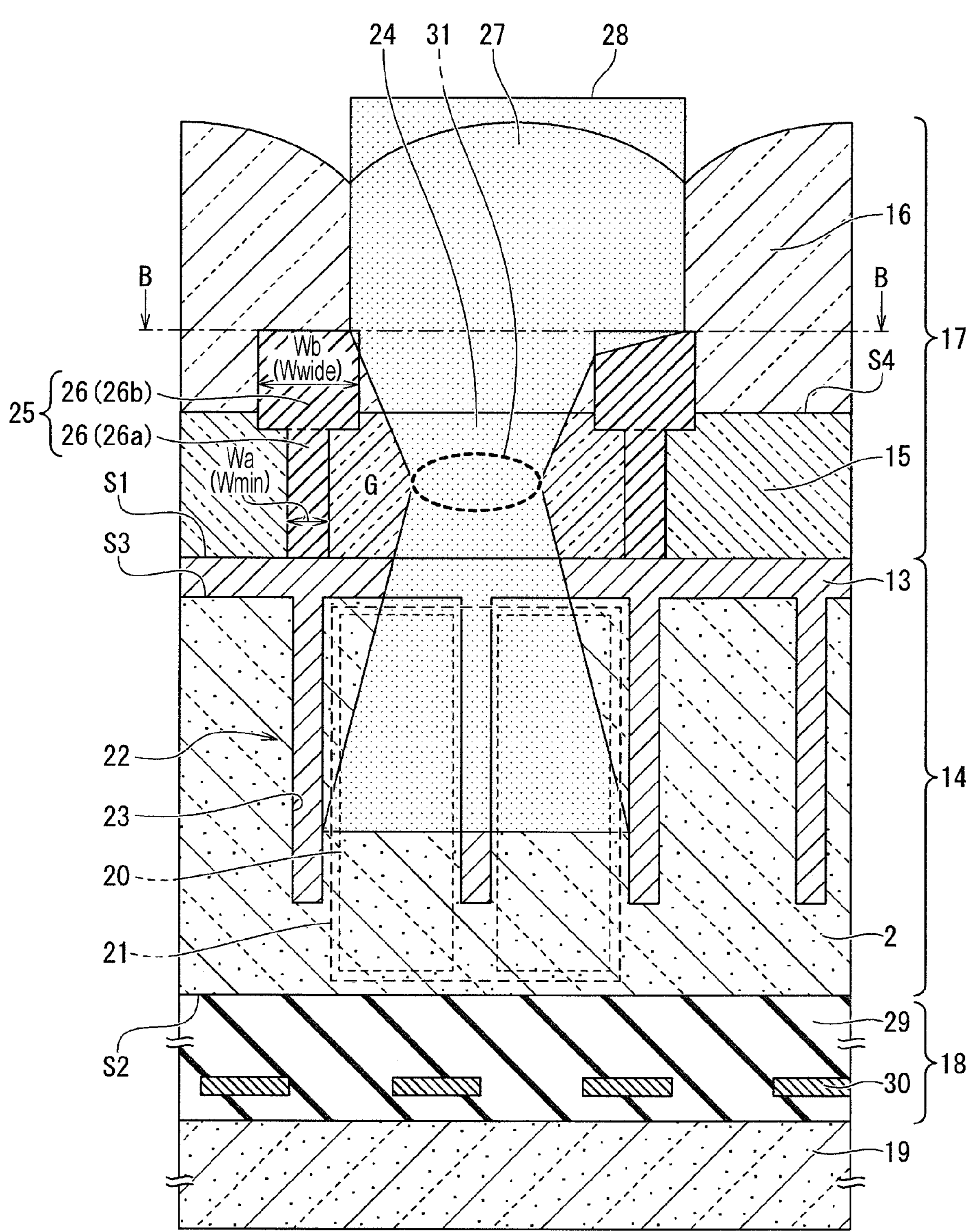
FIG. 2A is a view illustrating a cross-sectional configuration of the solid-state imaging device taken along line A-A in FIG. 1.
Figure 2B:
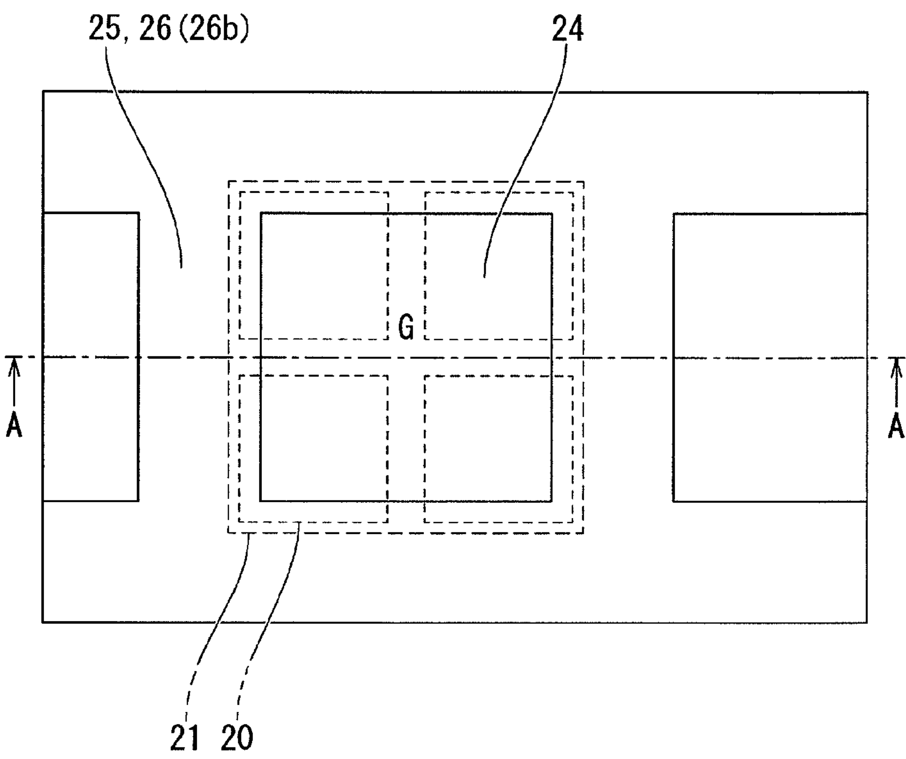
FIG. 2B is a view illustrating a cross-sectional configuration of the solid-state imaging device taken along line B-B in FIG. 2A.

Next, a detailed structure of the solid-state imaging device 1 in FIG. 1 will be described. FIG. 2A is a view illustrating a cross-sectional configuration of the solid-state imaging device 1 in a case of being taken along line A-A in FIG. 1. FIG. 2B is a view illustrating a cross-sectional configuration of the solid-state imaging device 1 in a case of being taken along line B-B in FIG. 2A. Note that a microlens 27 is omitted in FIG. 2B to make a color filter 24 apparent.

As illustrated in FIG. 2A, the solid-state imaging device 1 includes a light receiving layer 14 formed by laminating a substrate 2 and an insulating film 13 in this order. Furthermore, a light condensing layer 17, formed by laminating a color filter layer 15 and a microlens layer 16 in this order, is formed on a surface (hereinafter, also referred to as a "back surface S1") of the light receiving layer 14 on the insulating film 13 side. In other words, it can be said that the color filter layer 15 is arranged between the substrate 2 and the microlens layer 16. Moreover, a wiring layer 18 and a support substrate 19 are laminated in this order on a surface (hereinafter, also referred to as a "front surface S2") of the light receiving layer 14 on the substrate 2 side. Note that in the following description, a back surface of the insulating film 13 is also referred to as the "back surface S1". Furthermore, a front surface of the substrate 2 is also referred to as the "front surface S2".

The substrate 2 is configured using a semiconductor substrate including, for example, silicon (Si), and forms the pixel region 3. In the pixel region 3, the plurality of pixels 9 each including the photoelectric conversion unit 20 is arranged in a two-dimensional array. Each of the photoelectric conversion units 20 is embedded in the substrate 2 to form a photodiode, generates a signal charge corresponding to an amount of incident light 28, and accumulates the generated signal charge.

At least two adjacent photoelectric conversion units 20 of the photoelectric conversion units 20 constitute a photoelectric conversion unit group 21. In the first embodiment, the photoelectric conversion unit group 21 includes four (2×2) photoelectric conversion units 20 as illustrated in FIG. 2B. FIG. 2B illustrates a case where four photoelectric conversion units 20, aligned in a row direction and a column direction and adjacent to each other, constitute the photoelectric conversion unit group 21. Furthermore, a plurality of the photoelectric conversion unit groups 21 is formed using all the photoelectric conversion units 20. Therefore, the photoelectric conversion unit groups 21 are arranged in a two-dimensional array in the pixel region 3.

Furthermore, a pixel separation portion 22 is formed between adjacent photoelectric conversion units 20. The pixel separation portion 22 is formed in a lattice shape so as to surround the periphery of each of the photoelectric conversion units 20. The pixel separation portion 22 includes a bottomed trench 23 (groove) formed in a depth direction from a surface (hereinafter, also referred to as a "back surface S3") of the substrate 2 opposing the insulating film 13. The trench 23 is formed in a lattice shape such that such that an inner side surface and a bottom surface define an outer shape of the pixel separation portion 22. Furthermore, the insulating film 13 covering the back surface S3 side of the substrate 2 is embedded inside the trench 23.

The insulating film 13 continuously covers the entire back surface S3 side (the entire light receiving surface side) of the substrate 2 and the inside of the trench 23. As a material of the insulating film 13, for example, an insulator can be used. Specifically, silicon oxide ($SiO_2$) and silicon nitride (SiN) can be adopted.

The color filter layer 15 includes a plurality of the color filters 24 formed on the back surface S1 side of the insulating film 13 and arranged corresponding to the photoelectric conversion unit group 21. That is, each of the plurality of color filters 24 has a structure in which one color filter 24 is shared by four adjacent photoelectric conversion units 20. Furthermore, the plurality of color filters 24 includes a plurality of types of color filters transmitting light (for example, red light, green light, and blue light) having different wavelengths. Therefore, each of the plurality of color filters 24 transmits light of a predetermined wavelength for each type of the color filter, and causes the transmitted light to be incident on the photoelectric conversion unit 20. As an array pattern of the color filters 24, for example, a Bayer array can be adopted. Furthermore, as a material of the color filter 24, for example, a color resist having a refractive index of 1.4 to 1.9 can be adopted.

Furthermore, a low-refractive-index layer 25 is formed between the adjacent color filters 24. The low-refractive-index layer 25 is formed on the back surface S1 side of the insulating film 13 similarly to the color filter 24, and is formed in a lattice shape so as to surround the periphery of each of the color filters 24. In the first embodiment, the low-refractive-index layer 25 includes a plurality of stages of partition layers 26 aligned in a direction perpendicular to the back surface S3 (light receiving surface) of the substrate 2. FIG. 2A illustrates a case where the low-refractive-index layer 25 is formed by laminating (integrally forming) the partition layers 26 in two stages. Each of the plurality of stages of the partition layers 26 is formed in a lattice shape so as to form each part of the low-refractive-index layer 25. Furthermore, in FIG. 2A, the entire partition layer 26 on the substrate 2 side (hereinafter, also referred to as a "lower partition layer 26*a*") is present between the color filters 24 and has a lower end being located in the same plane as an interface between the color filter 24 and the insulating film 13, and the partition layer 26 on the microlens 27 side (hereinafter, also referred to as an "upper partition layer 26*b*") has a portion on the microlens 27 side protruding into the microlens 27. That is, it can be said that at least a part of the low-refractive-index layer 25 is arranged between the color filters 24.

As a material of the partition layer 26 (that is, a material of the low-refractive-index layer 25), for example, a low-refractive-index material having a lower refractive index than materials of adjacent layers (that is, adjacent substances) or air can be adopted. The materials of the adjacent layers are materials of layers in contact with the partition layer 26 (substances in contact with the partition layer 26) in a direction parallel to S3 (light receiving surface) of the substrate 2. Examples thereof include the material of the color filter layer 15 and a material of the microlens layer 16. Furthermore, examples of the low-refractive-index material include a low-refractive-index resin having a refractive index of 1.0 to 1.2. Therefore, the color filter 24, the microlens 27, and the low-refractive-index layer 25 form a waveguide with the color filter 24 and the microlens 27 as a core and the low-refractive-index layer 25 as a cladding.

A surface of the partition layer 26 on the color filter 24 side extends in a direction perpendicular to the back surface S3 (light receiving surface) of the substrate 2. That is, in a cross section perpendicular to the back surface S3 (light receiving surface) of the substrate 2, a cross-sectional shape of the partition layer 26 is a rectangular shape having a constant width. Furthermore, the partition layers 26 in adjacent stages have mutually different widths. Here, the width of the partition layer 26 is a width of the partition layer 26 in the direction parallel to the back surface S3 of the substrate 2 in the cross section perpendicular to the back surface S3 of the substrate 2. Specifically, it can be said that the width of the partition layer 26 is a width of the partition layer 26 in a direction passing through centers of the adjacent color filters 24. Furthermore, a width in the similar direction is also used as a width of the low-refractive-index layer 25. FIG. 2A illustrates a case where a width Wb of the upper partition layer 26*b* is wider than a width Wa of the lower partition layer 26*a*. That is, in the cross section perpendicular to the back surface S3 (light receiving surface) of the substrate 2, a cross-sectional shape of the low-refractive-index layer 25 is a T-shape. Therefore, the low-refractive-index layer 25 has the width Wb (in a broad sense, a "first width Wwide") on the microlens 27 side, and has the width Wa (in a broad sense, a "second width Wmin") narrower than the width Wb on the substrate 2 side with respect to a portion having the width Wb. The width Wb of the upper partition layer 26*b* and the width Wa of the lower partition layer 26*a* are set to satisfy the following Formula (1).

$$1.0 < Wb/Wa \leq 15.0 \quad (1)$$

Note that a ratio between the width and a height of the partition layer 26 is not particularly limited.

The microlens layer 16 is formed on a back surface S4 side (light receiving surface side) of the color filter layer 15, and includes a plurality of the microlenses 27 arranged corresponding to the photoelectric conversion unit group 21. That is, each of the plurality of microlenses 27 has a structure in which one microlens 27 is shared by four adjacent photoelectric conversion units 20. Therefore, each of the microlenses 27 condenses image light (the incident light 28) from a subject, and guides the condensed incident light 28 into the photoelectric conversion units 20 via the waveguide including the color filter 24, the microlens 27, and the low-refractive-index layer 25. As the material of the microlens 27, for example, a transparent resin having a refractive index of 1.4 to 1.9 can be adopted. FIG. 2A illustrates a case where an overlay misalignment of the microlens 27 occurs and a center of the microlens 27 is misaligned from a center of the photoelectric conversion unit group 21.

The wiring layer 18 is formed on the front surface S2 side of the substrate 2, and includes an interlayer insulating film 29 and a wiring 30 that is laminated in a plurality of layers with the interlayer insulating film 29 interposed therebetween. Then, the wiring layer 18 drives a pixel transistor constituting each of the pixels 9 via the plurality of layers of the wiring 30.

The support substrate 19 is formed on a surface of the wiring layer 18 on a side opposite to a side facing the substrate 2. The support substrate 19 is a substrate configured to secure the strength of the substrate 2 at a manufacturing step of the solid-state imaging device 1. As a material of the support substrate 19, for example, silicon (Si) can be used.

In the solid-state imaging device 1 having the above configuration, light is irradiated from the back surface S3 side of the substrate 2 (the back surface S1 side of the light receiving layer 14), the irradiated light is transmitted through the microlens 27 and the color filter 24 (waveguide), and the transmitted light is photoelectrically converted by the photoelectric conversion unit 20, thereby a signal charge is generated. Then, the generated signal charge is output as a pixel signal by the vertical signal line 11 in FIG. 1, which is formed by the wiring 30, via the pixel transistor formed on the front surface S2 side of the substrate 2.

Furthermore, since one microlens 27 is shared by at least two adjacent photoelectric conversion units 20 (the photoelectric conversion unit group 21), a difference occurs between the signal charges of the photoelectric conversion units 20 included in the photoelectric conversion unit group 21 depending on a distance to the subject. Therefore, the distance to the subject can be calculated on the basis of such a difference between the signal charges in the solid-state imaging device 1.

Figure 3:
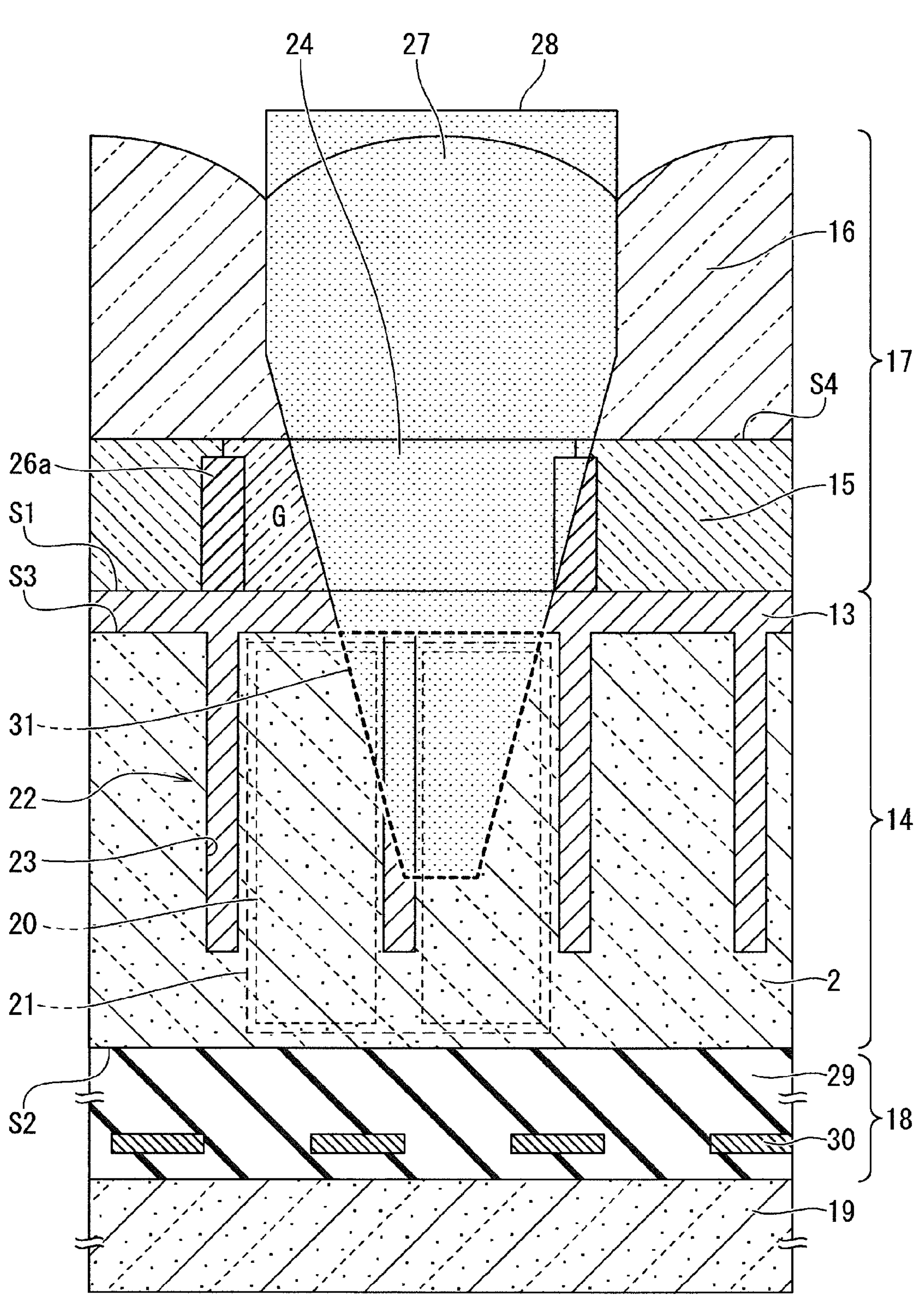
FIG. 3 is a view illustrating a state of light in a conventional solid-state imaging device.

Here, since a curved surface of the microlens 27 is formed by a heating reflow process in which a transparent resin is once melted by heating to form a spherical surface using surface tension, it is difficult to control the shape thereof. Therefore, as illustrated in FIG. 3, there has been a possibility that the center of the microlens 27 is misaligned from the center of the photoelectric conversion unit group 21 in a plan view, and a center of a light-condensed spot 31 of the incident light 28 by the microlens 27 and the center of the photoelectric conversion unit group 21 are misaligned. Therefore, for example, in a case where the upper partition layer 26*b* does not exist, there is a possibility that unevenness occurs in light receiving sensitivity between the photoelectric conversion units 20, and a light receiving sensitivity difference (inter-same-color sensitivity difference) occurs between the photoelectric conversion units 20.

On the other hand, in the first embodiment, as illustrated in FIG. 2A, the low-refractive-index layer 25 containing the material having the lower refractive index than the materials of the adjacent layers or air is formed between the color filters 24, and the low-refractive-index layer 25 has the width Wb (first width Wwide) on the microlens 27 side and has the width Wa (second width Wmin) narrower than the width Wb on the substrate 2 side with respect to the portion having the width Wb. Therefore, out of the incident light 28 having passed through the microlens 27, the incident light 28 of a portion deviating from the center of the photoelectric conversion unit group 21 hits the low-refractive-index layer 25 and is diffracted toward the center side of the color filter 24 due to the wide width Wb of the portion of the low-refractive-index layer 25 on the microlens 27 side. Specifically, since the refractive index of the material of the low-refractive-index layer 25 is low and the low-refractive-index layer 25 hardly propagates light, the incident light 28 is diffracted at the interface between the microlens 27 and the color filter 24 such that the incident light 28 passes while avoiding the low-refractive-index layer 25. FIG. 2A illustrates a case where the incident light 28 hitting an upper surface of the low-refractive-index layer 25 on the right side is diffracted, and the diffracted incident light 28 is directed from a side surface of the low-refractive-index layer 25 toward the center side of the photoelectric conversion unit group 21. Therefore, a position of the light-condensed spot 31 can be moved to the vicinity of the center of the color filter 24 in a width direction and to be closer to the microlens side in a height direction of the color filter 24 as compared with FIG. 3. Note that a part of the incident light 28 is transmitted through the low-refractive-index layer 25.

Furthermore, the incident light 28 having passed through the light-condensed spot 31 in the vicinity of the center of the color filter 24 spreads over a wide range as the width Wa of the portion of the low-refractive-index layer 25 on the substrate 2 side is narrowed. Therefore, the incident light 28 can be spread in the photoelectric conversion unit 20. Therefore, the unevenness in the light receiving sensitivity between the photoelectric conversion units 20 can be suppressed, and the light receiving sensitivity difference between the photoelectric conversion units 20 can be reduced. Therefore, the inter-same-color sensitivity difference can be reduced according to the solid-state imaging device 1 of the first embodiment.

Figure 4:
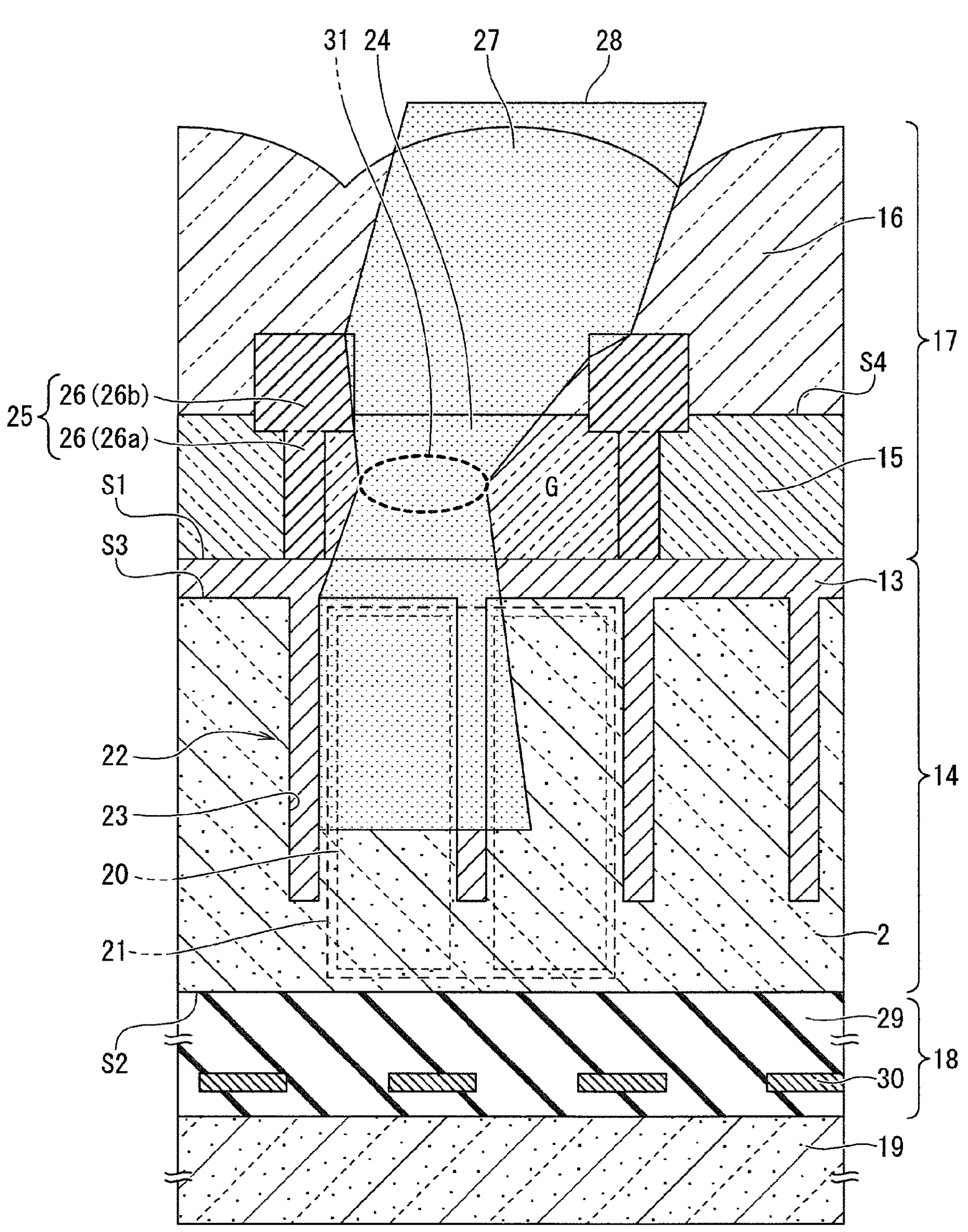
FIG. 4 is a view illustrating a state of light in the solid-state imaging device according to the first embodiment.

Furthermore, in the first embodiment, as illustrated in FIG. 4, when a traveling direction of the incident light 28 is inclined with respect to the back surface S3 (light receiving surface) of the substrate 2, a portion of the incident light 28 on the opposite side (right side in FIG. 4) to an inclination direction of the traveling direction hits the low-refractive-index layer 25 on the opposite side (right side in FIG. 4) to the inclination direction of the traveling direction and is diffracted toward the center side of the color filter 24. Therefore, the position of the light-condensed spot 31 can be moved to the microlens side in the height direction of the color filter 24 as compared with FIG. 3, and can be moved to the inclination direction side (left side in FIG. 4) of the incident light 28. Therefore, the incident light 28 having passed through the light-condensed spot 31 can be biased to the inclination direction side (left side in FIG. 4) in the color filter 24 and the photoelectric conversion unit 20. Therefore, the light receiving sensitivity difference between the photoelectric conversion units 20 can be increased. Therefore, a split ratio can be improved according to the solid-state imaging device 1 of the first embodiment.

Note that FIG. 4 illustrates a case where the center of the microlens 27 is misaligned from the center of the photoelectric conversion unit group 21, but the effect of improving the split ratio can be obtained even in a case where the centers are not misaligned.

Figure 5:
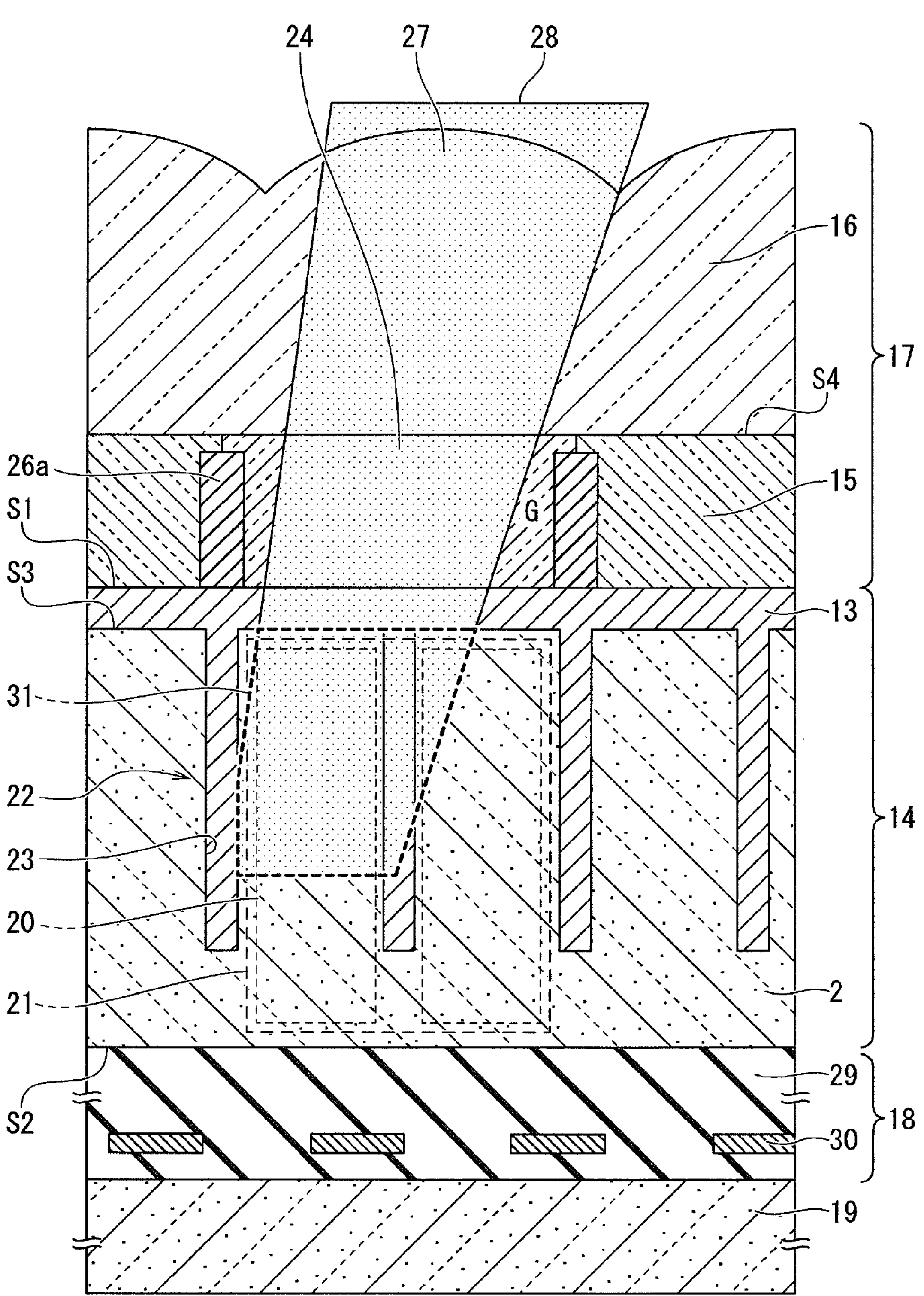
FIG. 5 is a view illustrating a state of light in the conventional solid-state imaging device.

Meanwhile, for example, as illustrated in FIG. 5, in a case where the low-refractive-index layer 25 includes only the lower partition layer 26*a*, when a traveling direction of the incident light 28 is inclined with respect to the back surface S3 (light receiving surface) of the substrate 2, a portion of the incident light 28 on the opposite side (the right side in FIG. 5) to an inclination direction in the traveling direction does not hit the low-refractive-index layer 25 on the opposite side (the right side in FIG. 5) to the inclination direction in the traveling direction, but passes through the color filter 24 and travels toward the photoelectric conversion unit group 21 as the light-condensed spot 31 is formed closer to the back surface S3 (light-receiving surface) side as compared with FIG. 4. Therefore, as compared with the solid-state imaging device 1 of the first embodiment, a light receiving sensitivity difference between the photoelectric conversion units 20 is smaller, and a split ratio is deteriorated.

[1-3 Modifications]

Figure 6:
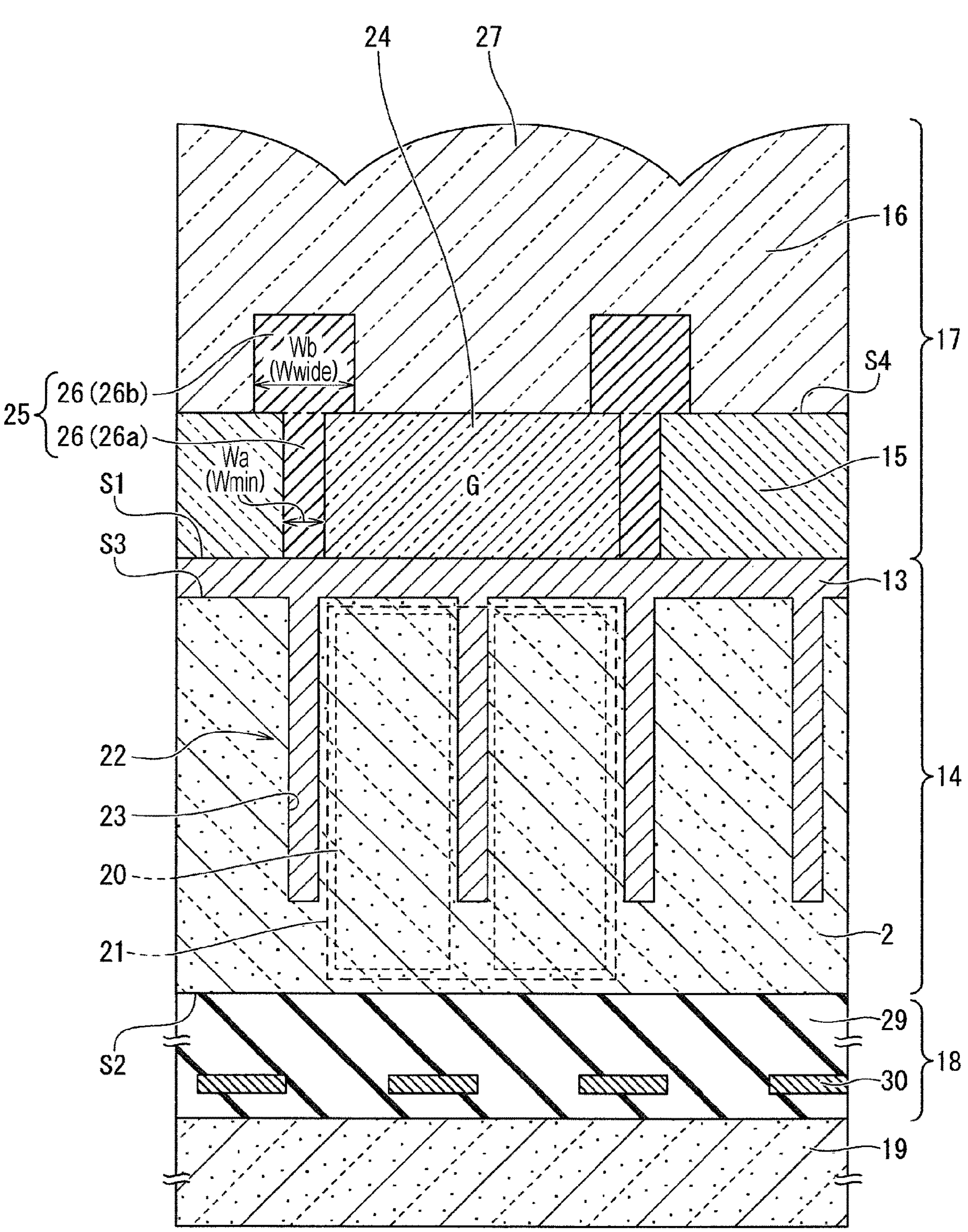
FIG. 6 is a view illustrating a cross-sectional configuration of a solid-state imaging device according to a modification.

(1) Note that an example in which the portion of the upper partition layer 26*b* on the microlens 27 side protrudes into the microlens has been described in the first embodiment, but other configurations may be adopted. For example, as illustrated in FIG. 6, a configuration may be adopted in which the lower partition layer 26*a* is entirely present between the color filters 24, and the upper partition layer 26*b* is present closer to the microlens 27 side than the back surface S4 (light receiving surface) of the color filter 24. FIG. 6 illustrates a case where a boundary between the upper partition layer 26*b* and the lower partition layer 26*a* is located in the same plane as the interface between the microlens 27 and the color filter 24, and the upper partition layer 26*b* is entirely presents inside the microlens 27. Therefore, for example, the upper partition layer 26*b* (the low-refractive-index layer 25) can be easily manufactured as compared with a case where the upper partition layer 26*b* is present over a portion between the color filters 24 and the inside of the microlens 27.

Figure 7:
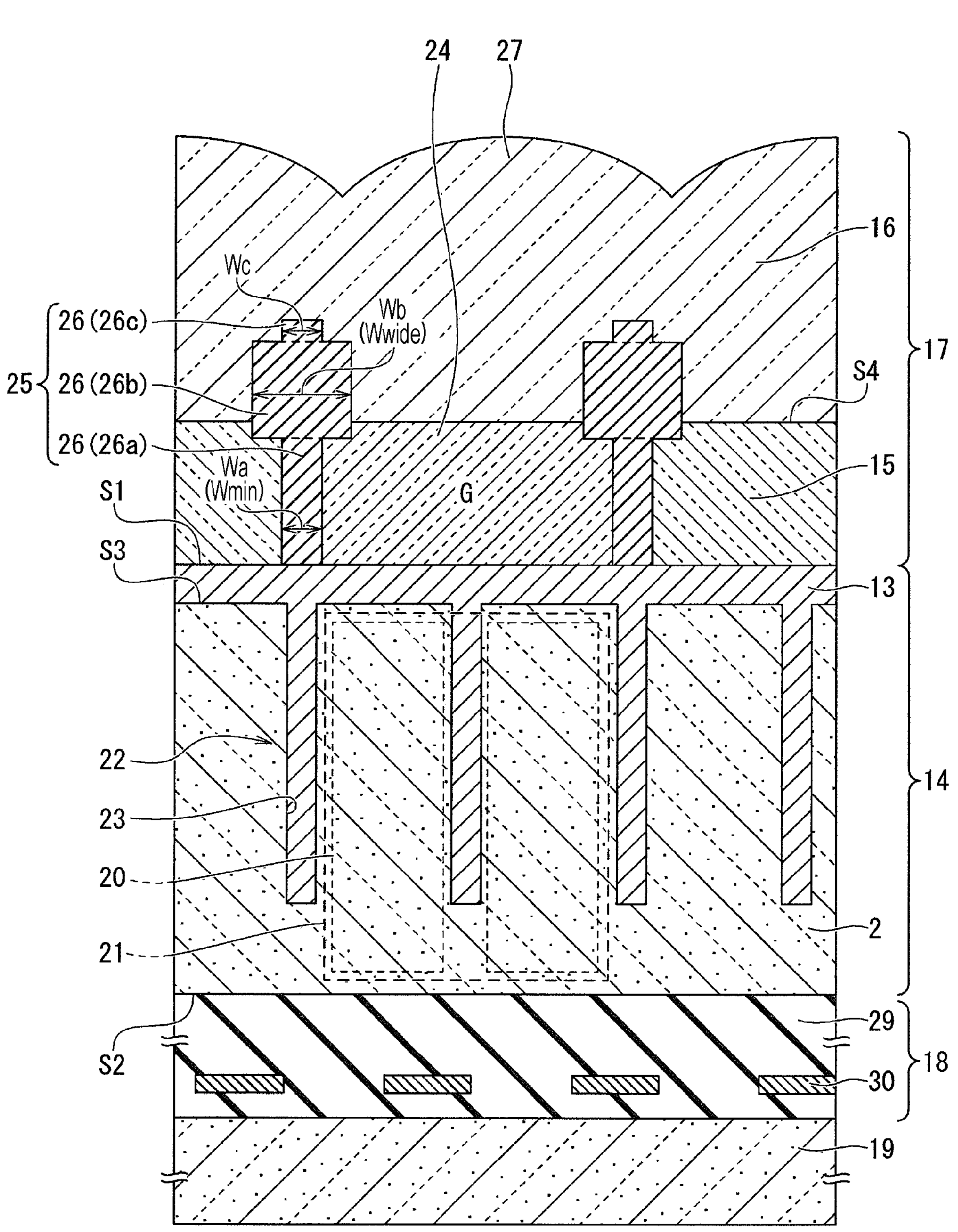
FIG. 7 is a view illustrating a cross-sectional configuration of a solid-state imaging device according to a modification.
Figure 8:
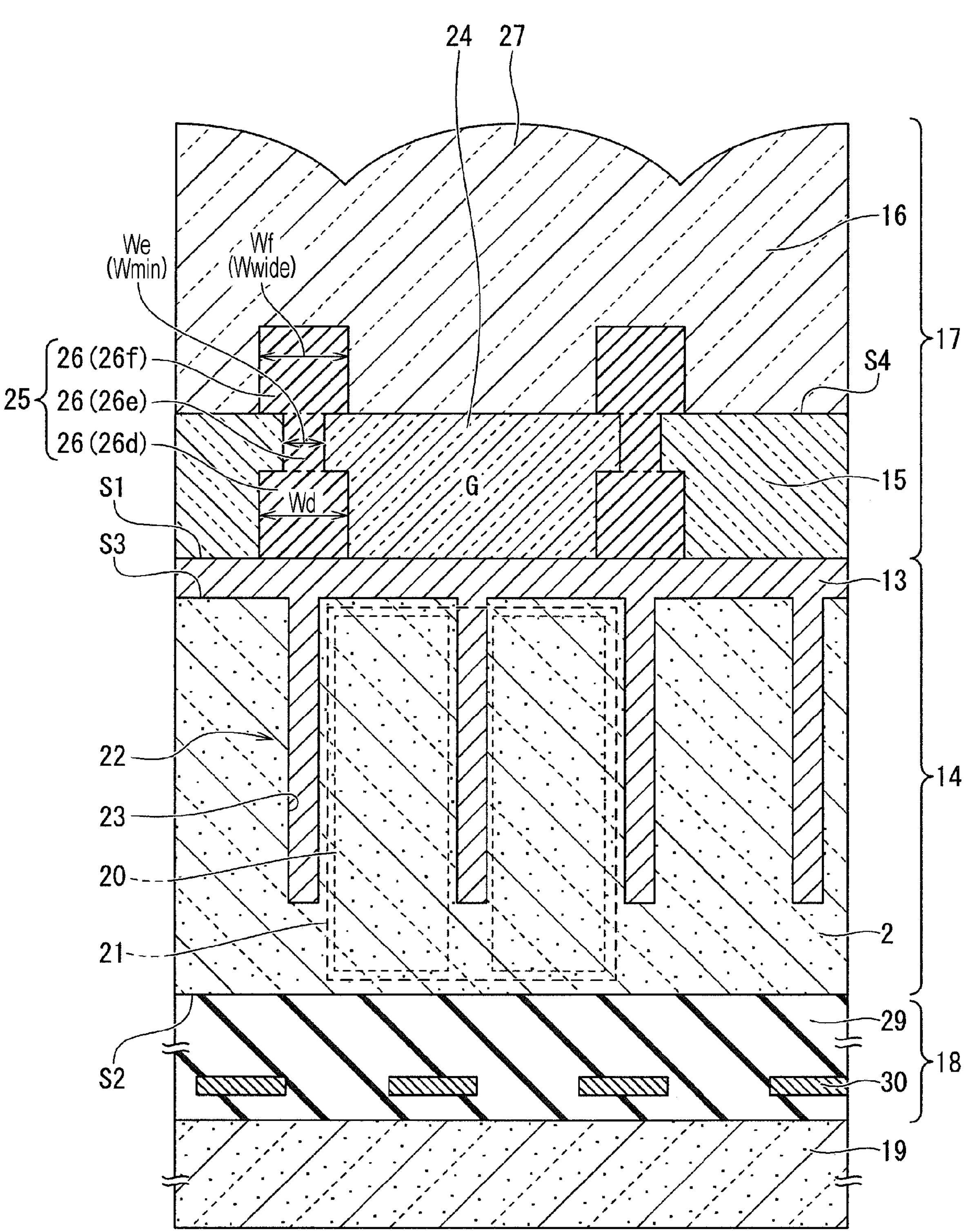
FIG. 8 is a view illustrating a cross-sectional configuration of a solid-state imaging device according to a modification.

(2) Furthermore, an example in which the number of stages of the partition layers 26 included in the low-refractive-index layer 25 is two has been described in the first embodiment, but other configurations can also be adopted. For example, as illustrated in FIGS. 7 and 8, the number of stages may be more than two. FIG. 7 illustrates a case where the low-refractive-index layer 25 includes the partition layers 26 in three stages, and another partition layer 26 (hereinafter, also referred to as an "uppermost partition layer 26*c*") is laminated on the microlens 27 side of the upper partition layer 26*b* in addition to the lower partition layer 26*a* and the upper partition layer 26*b* illustrated in FIG. 2A to constitute the low-refractive-index layer 25. In FIG. 7, a width Wc of the uppermost partition layer 26*c* is narrower than the width Wb of the upper partition layer 26*b*, and is the same as the width Wa of the lower partition layer 26*a*.

FIG. 8 illustrates a case where the low-refractive-index layer 25 includes the partition layers 26 in three stages, and a width Wf of the partition layer 26 (hereinafter, also referred to as an "upper partition layer 26*f*") in a stage closest to the microlens side and a width Wd of the partition layer 26 (hereinafter, also referred to as a "lower partition layer 26*d*") in a stage closest to the substrate 2 side are wider than a width We of the partition layer 26 (hereinafter, also referred to as a "middle partition layer 26*e*") in a stage therebetween. Specifically, Wd=We>Wf. That is, in the cross section perpendicular to the back surface S3 (light receiving surface) of the substrate 2, a cross-sectional shape of the low-refractive-index layer 25 is an I-shape.

In this case, as illustrated in FIG. 8, the width Wf of the upper partition layer 26*f* corresponds to the "first width Wwide". Furthermore, the width We of the middle partition layer 26*e* corresponds to the "second width Wmin". Furthermore, in FIG. 8, a sum of a height of the middle partition layer 26*e* and a height of the lower partition layer 26*d* is equal to a height of the color filter 24, and the entire upper partition layer 26*f* is present inside the microlens 27.

Figure 9:
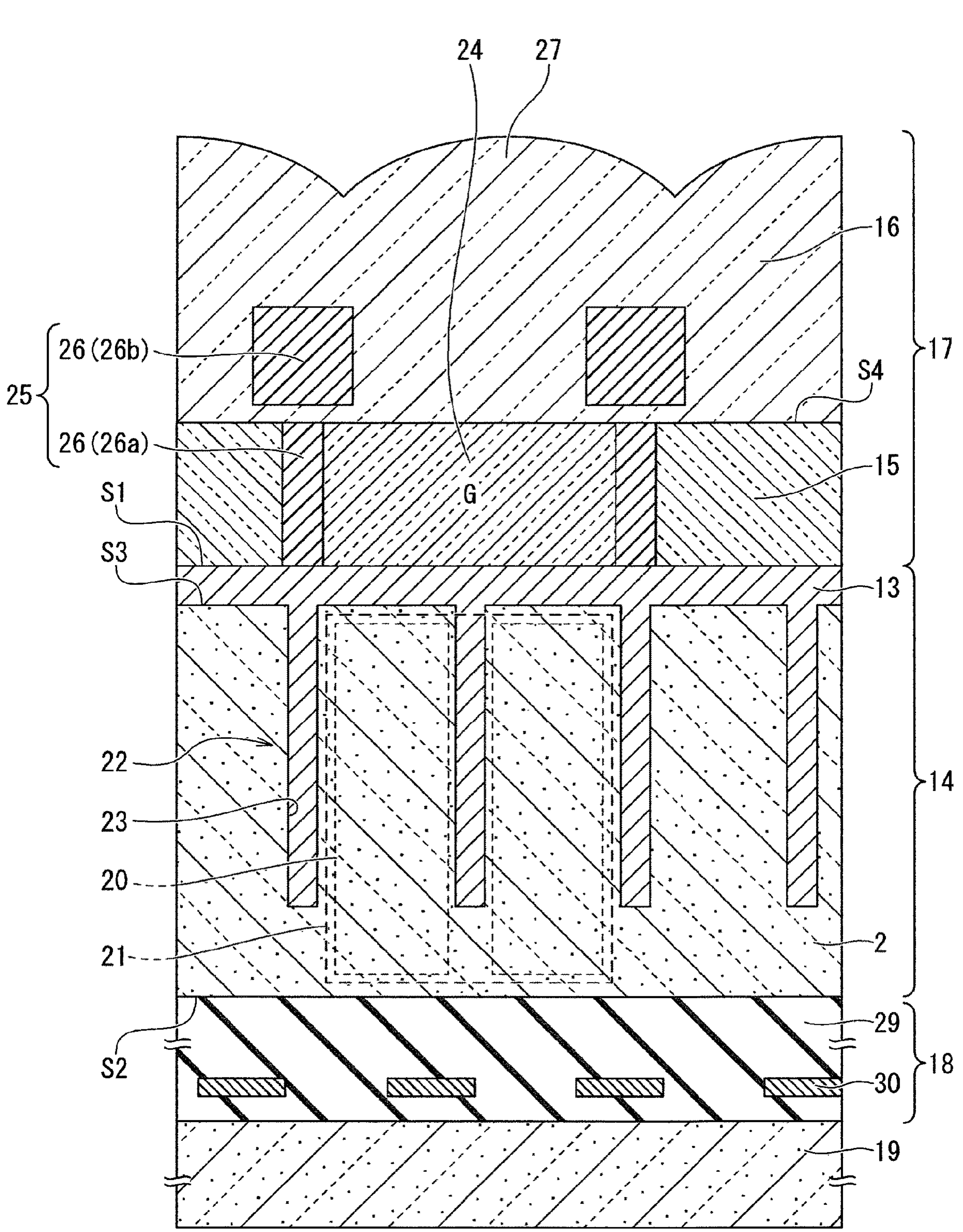
FIG. 9 is a view illustrating a cross-sectional configuration of a solid-state imaging device according to a modification.

(3) Furthermore, an example in which the lower partition layer 26*a* and the upper partition layer 26*b* are laminated (in contact with each other) has been described in the first embodiment, but other configurations can also be adopted. For example, as illustrated in FIG. 9, a configuration may be adopted in which the partition layer 26 in one stage among the plurality of stages of the partition layers 26 and the partition layer 26 in another stage adjacent to the partition layer 26 in the one stage are separated from each other. FIG. 9 illustrates a case where the low-refractive-index layer 25 includes the partition layers 26 in two stages (the lower partition layer 26*a* and the upper partition layer 26*b*), and the lower partition layer 26*a* and the upper partition layer 26*b* are separated from each other.

Figure 10:
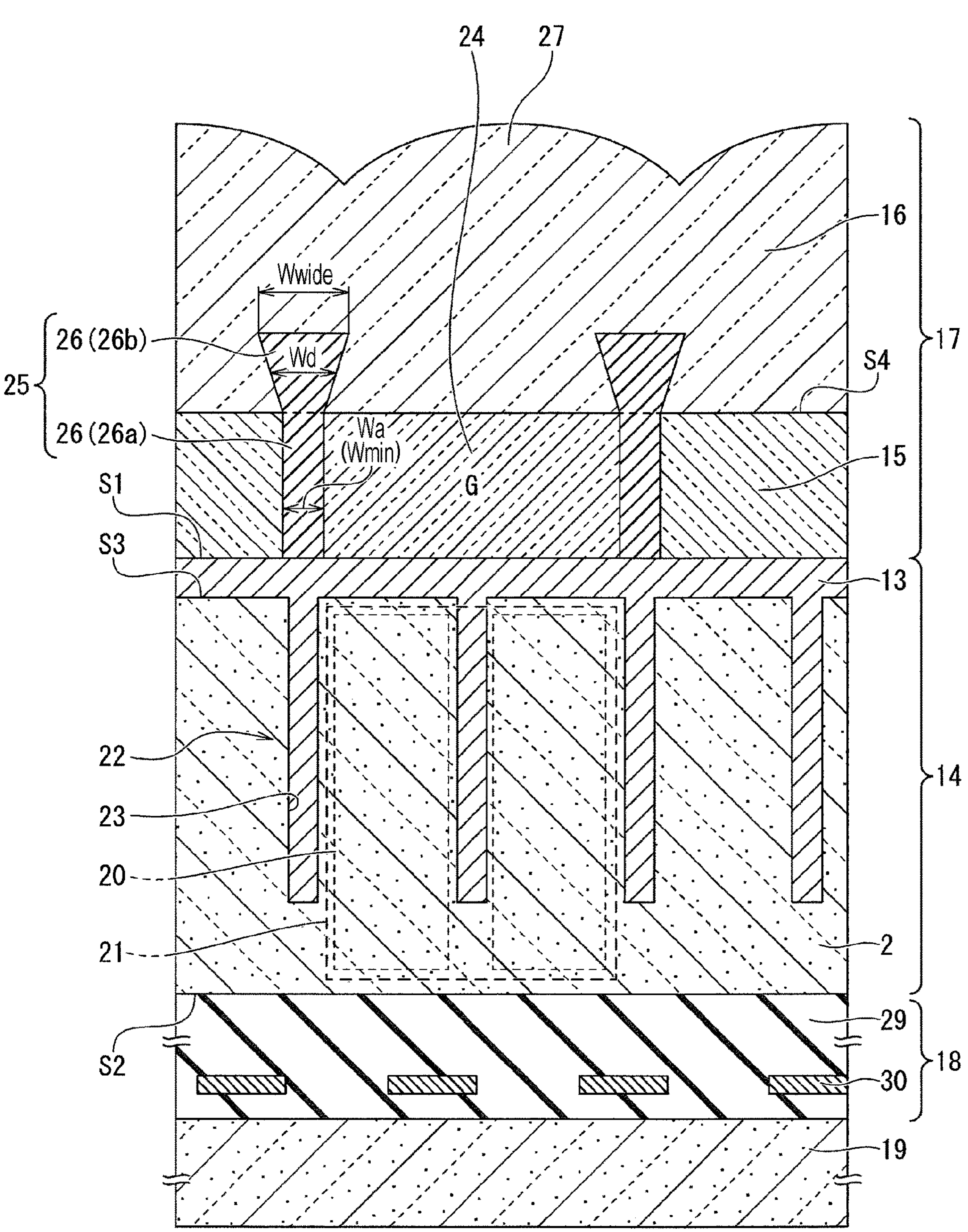
FIG. 10 is a view illustrating a cross-sectional configuration of a solid-state imaging device according to a modification.

(4) Furthermore, an example in which each of the width of the lower partition layer 26*a* and the width of the upper partition layer 26*b* is a constant width has been described in the first embodiment, but other configurations can also be adopted. For example, as illustrated in FIG. 10, the width Wb of the upper partition layer 26*b* may be continuously increased toward the microlens 27 side (the light receiving surface side of the microlens 27). That is, in a cross section perpendicular to the back surface S3 (light receiving surface) of the substrate 2, a cross-sectional shape of the low-refractive-index layer 25 may be a shape in which a trapezoid having an upper base wider than a lower base and a rectangle are combined in series.

In this case, as illustrated in FIG. 10, the width Wb of an end portion of the upper partition layer 26*b* on the microlens 27 side corresponds to the "first width Wwide". Furthermore, the width Wb is equal to or larger than the width Wa of the lower partition layer 26*a* at an interface between the upper partition layer 26*b* and the lower partition layer 26*a*. In FIG. 10, Wb=Wa is satisfied at the interface. In FIG. 10, a height of the lower partition layer 26*a* is equal to a height of the color filter 24, and the entire upper partition layer 26*b* is present inside the microlens 27.

Figure 11:
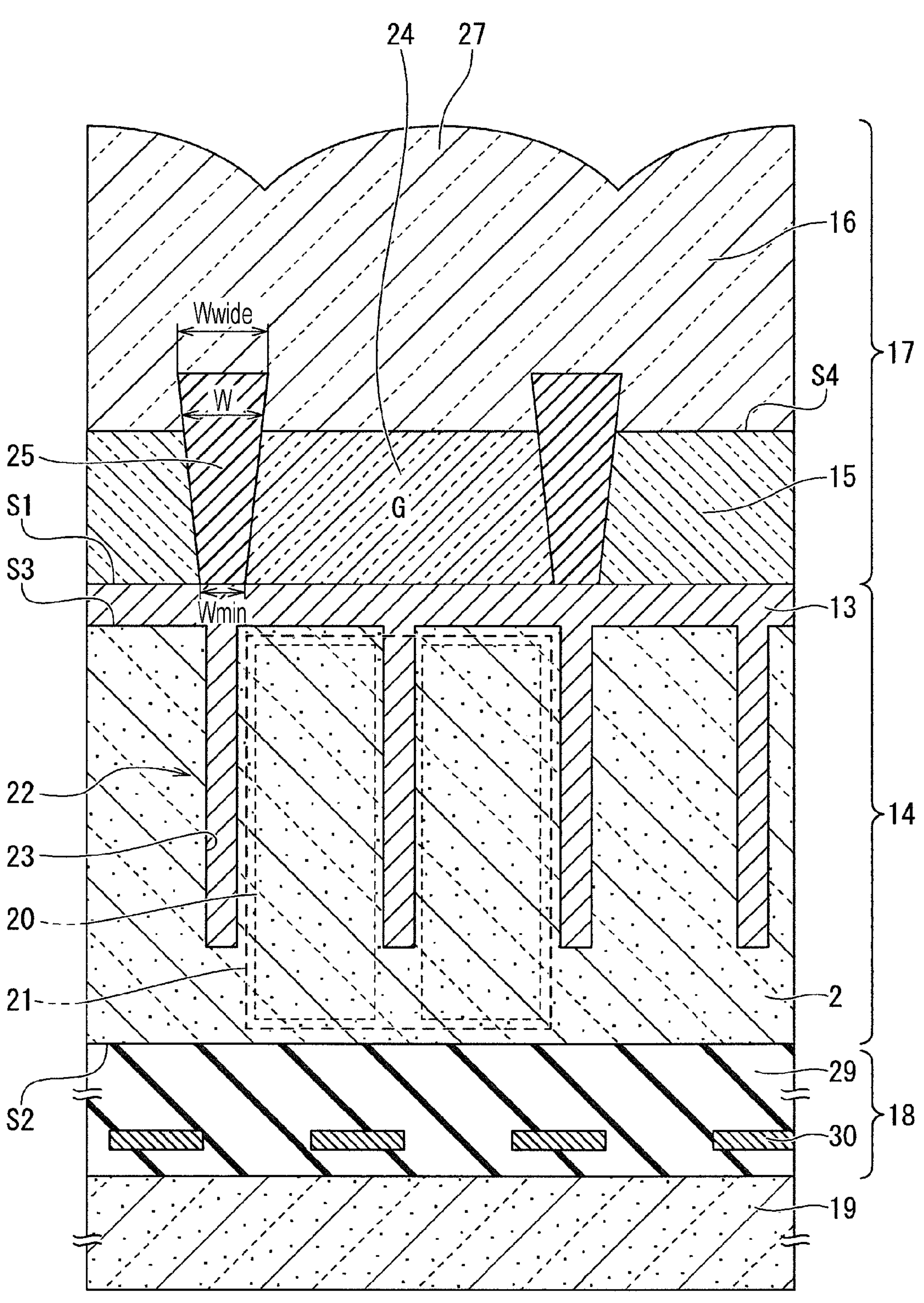
FIG. 11 is a view illustrating a cross-sectional configuration of a solid-state imaging device according to a modification.

(5) Furthermore, an example in which the low-refractive-index layer 25 includes the partition layers 26 in a plurality of stages has been described in the first embodiment, but other configurations can also be adopted. For example, as illustrated in FIG. 11, the low-refractive-index layer 25 may have a configuration in which a width W continuously increases toward the microlens 27 side over the entire low-refractive-index layer 25. That is, in a cross section perpendicular to the back surface S3 (light receiving surface) of the substrate 2, a cross-sectional shape of the low-refractive-index layer 25 may be a trapezoid in which an upper base is wider than a lower base.

In this case, as illustrated in FIG. 11, the width W of an end portion of the low-refractive-index layer 25 on the microlens 27 side corresponds to the "first width Wwide", and the width W of an end portion on the substrate 2 side corresponds to the "second width Wmin".

Figure 12:
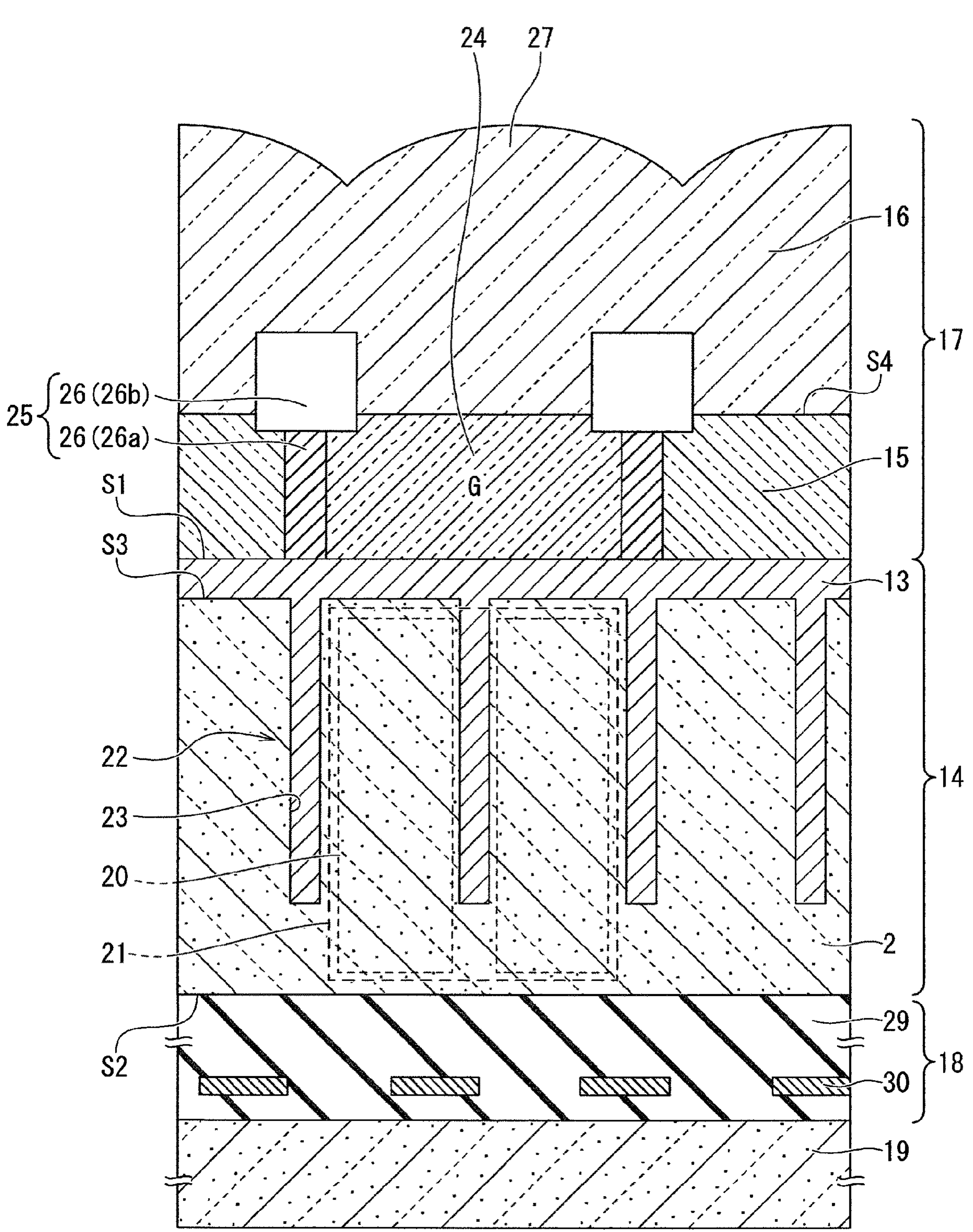
FIG. 12 is a view illustrating a cross-sectional configuration of a solid-state imaging device according to a modification.

(6) Furthermore, an example in which the same material is used as the material of the lower partition layer 26*a* and the material of the upper partition layer 26*b*, and the inside of the low-refractive-index layer 25 has a constant refractive index has been described in the first embodiment, but other configurations can also be adopted. For example, as illustrated in FIG. 12, the low-refractive-index layer 25 may be configured to have a refractive index different at each height position in the low-refractive-index layer 25. Here, the height position in the low-refractive-index layer 25 is a height position in the low-refractive-index layer 25 from the back surface S3 of the substrate 2 in a direction perpendicular to the back surface S3 (light receiving surface) of the substrate 2. FIG. 12 illustrates a case where a low-refractive-index resin is used as a material of the lower partition layer 26*a*, air is used as a material of the upper partition layer 26*b*, and the lower partition layer 26*a* and the upper partition layer 26*b* have different refractive indexes.

Figure 13A:
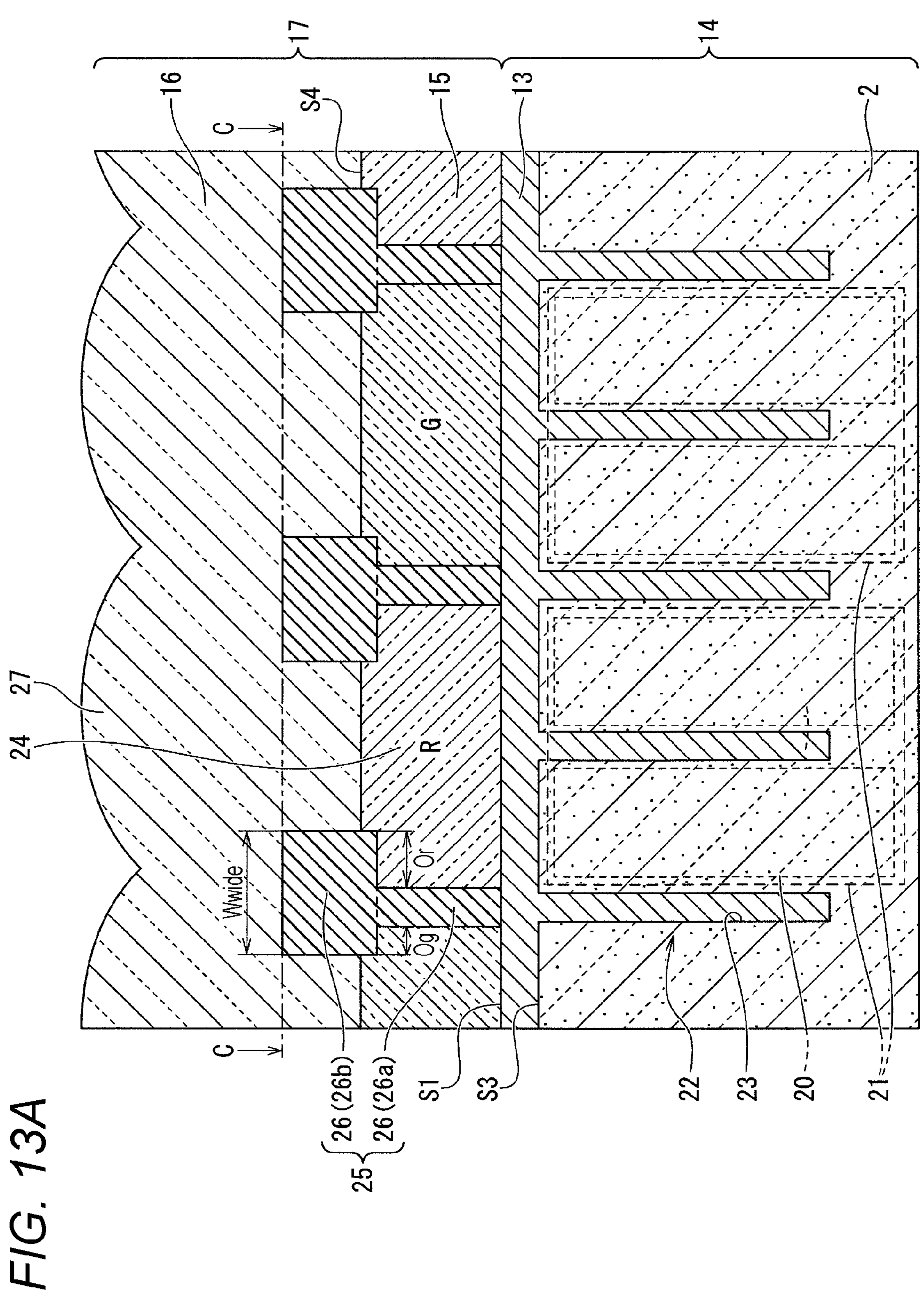
FIG. 13A is a view illustrating a cross-sectional configuration of a solid-state imaging device according to a modification.
Figure 13B:
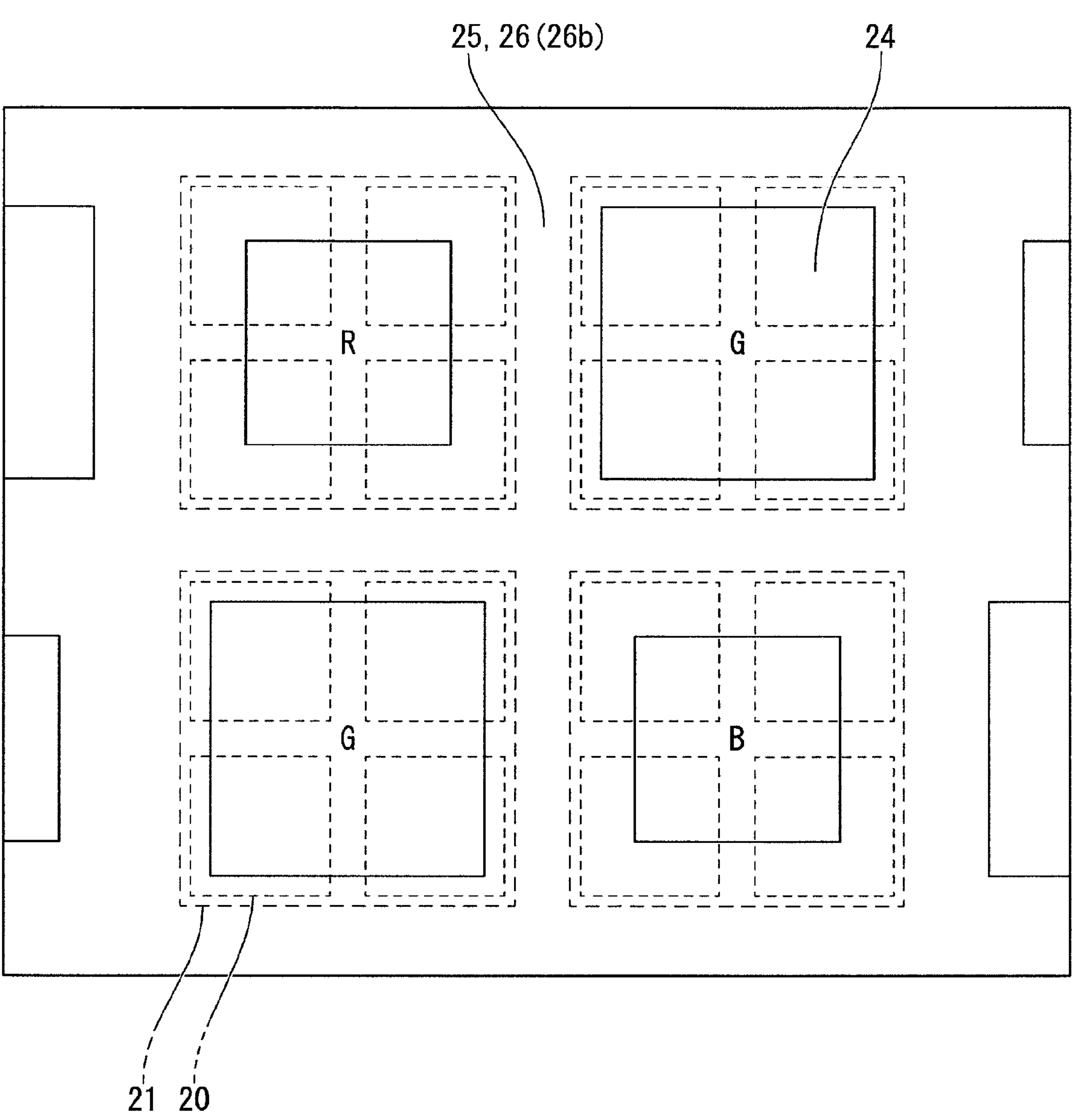
FIG. 13B is a view illustrating a cross-sectional configuration of the solid-state imaging device taken along line C-C in FIG. 13A.
Figure 14:
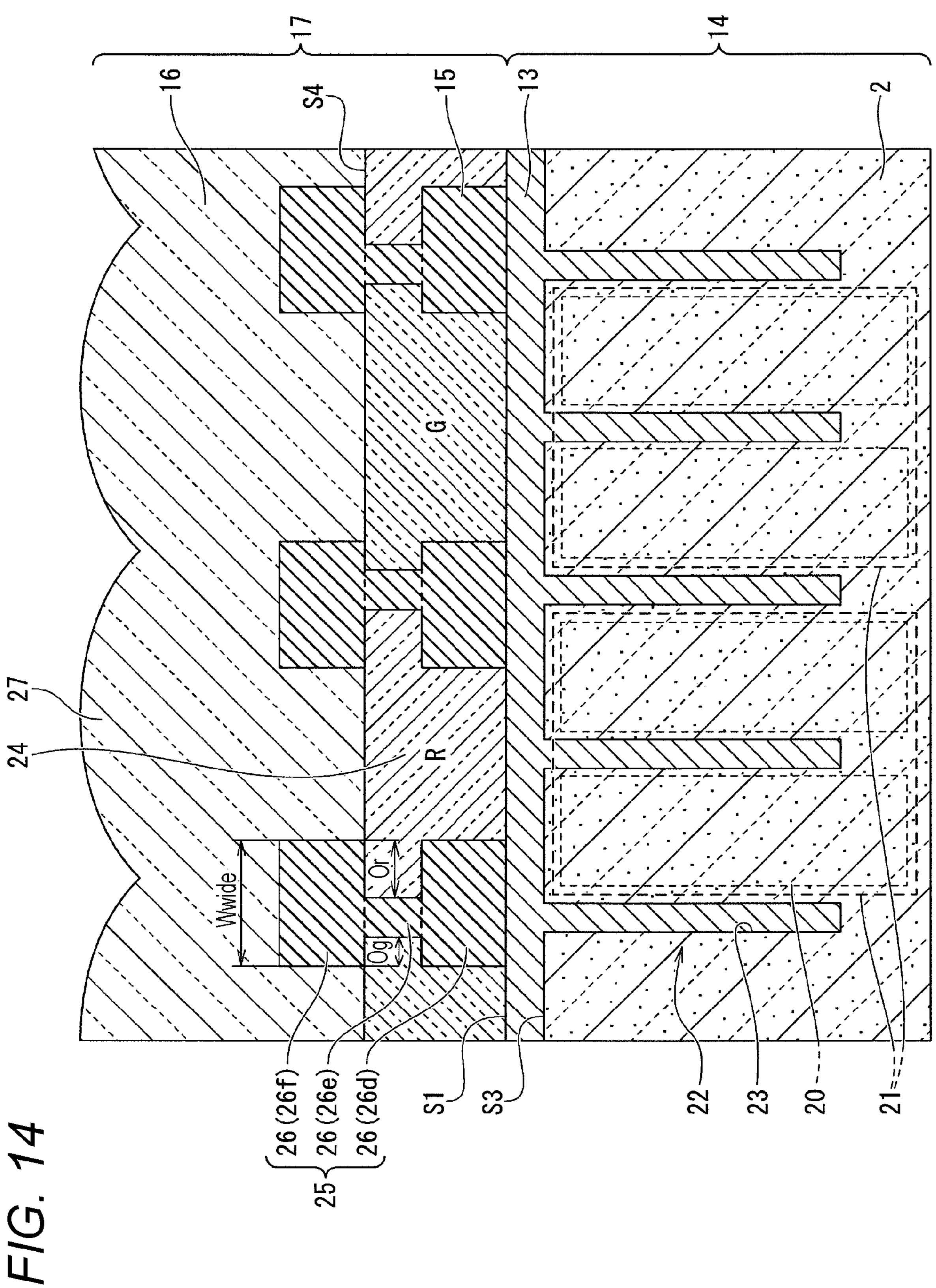
FIG. 14 is a view illustrating a cross-sectional configuration of a solid-state imaging device according to a modification.
Figure 15:
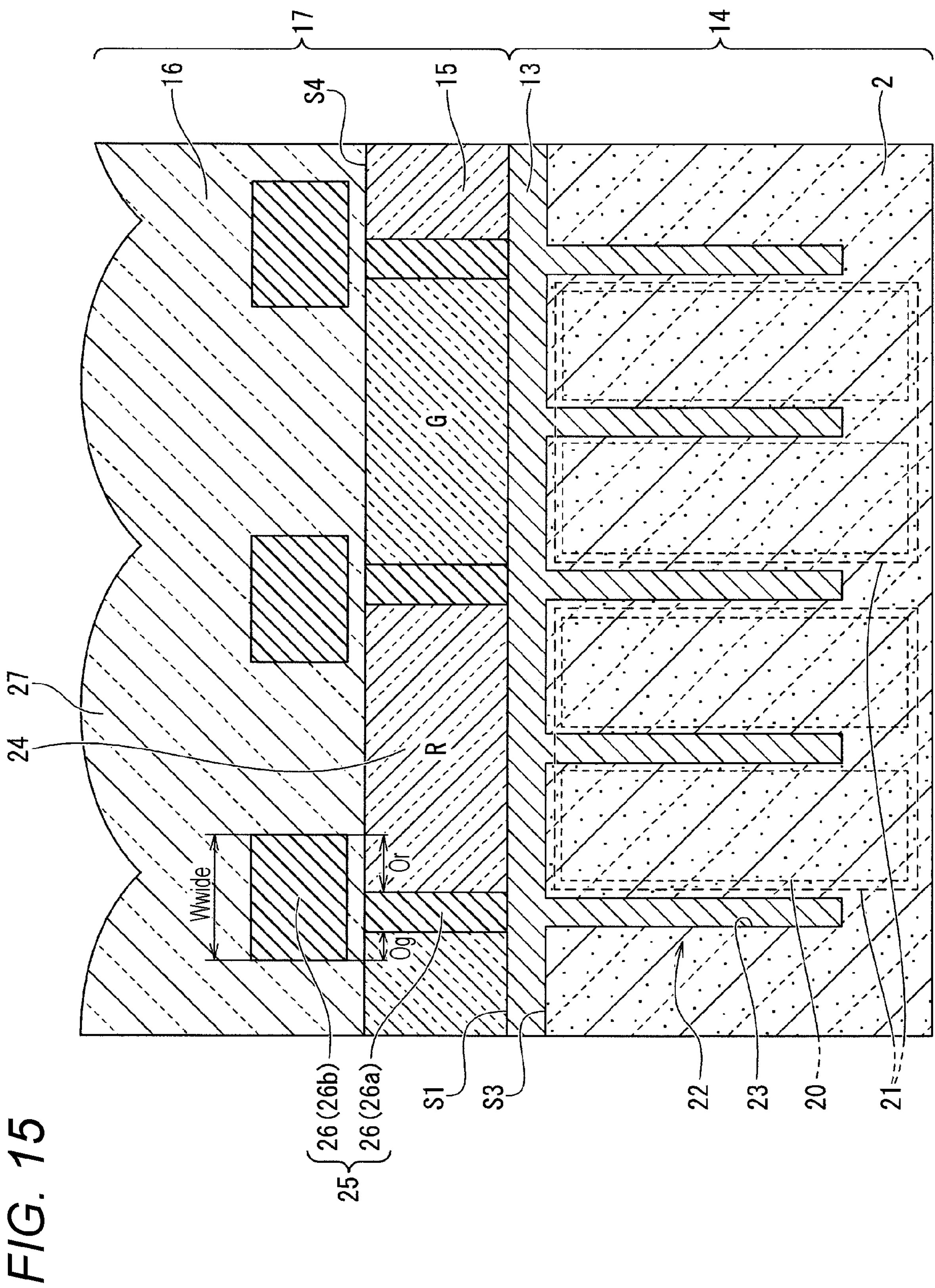
FIG. 15 is a view illustrating a cross-sectional configuration of a solid-state imaging device according to a modification.
Figure 16:
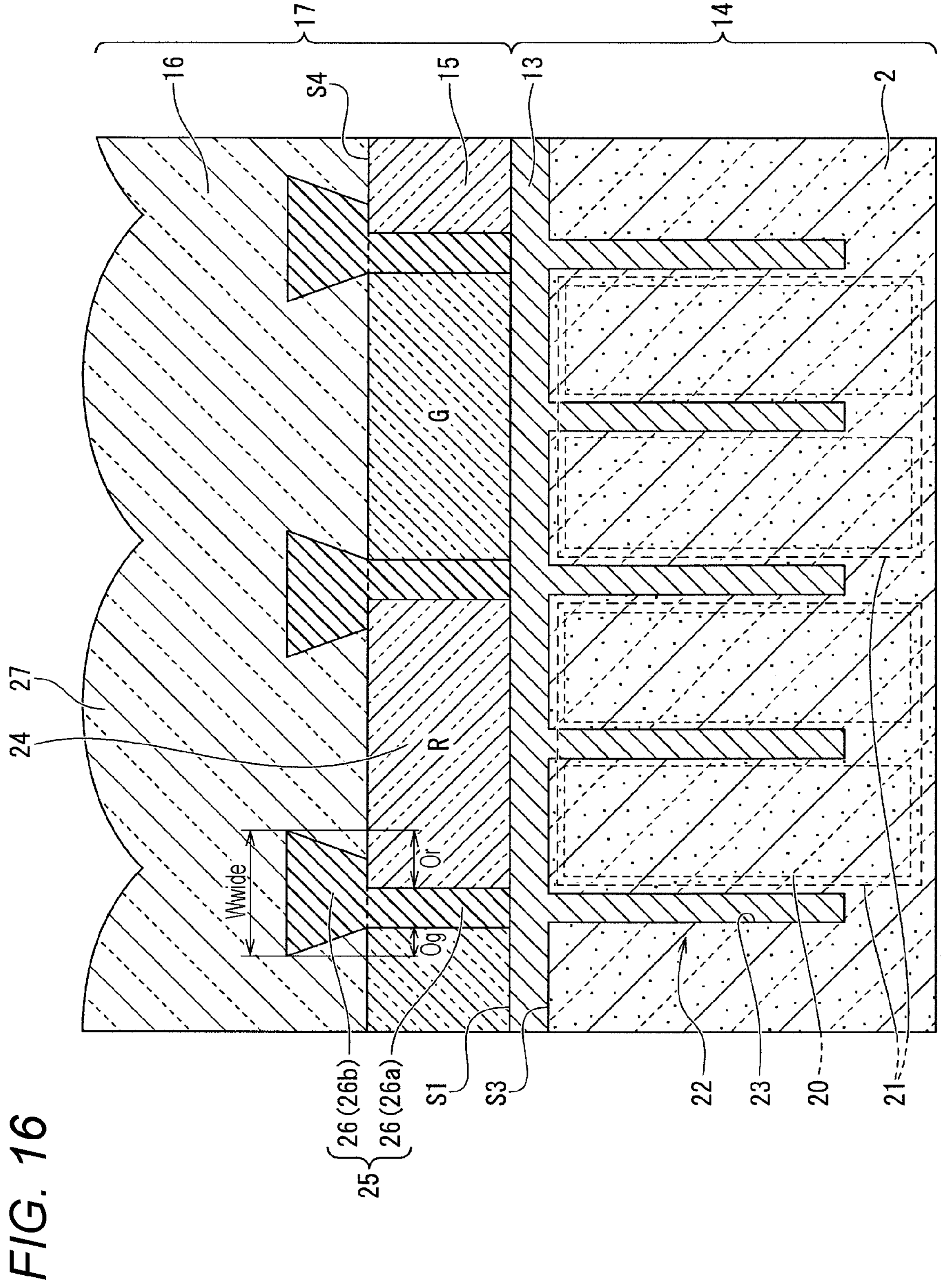
FIG. 16 is a view illustrating a cross-sectional configuration of a solid-state imaging device according to a modification.
Figure 17:
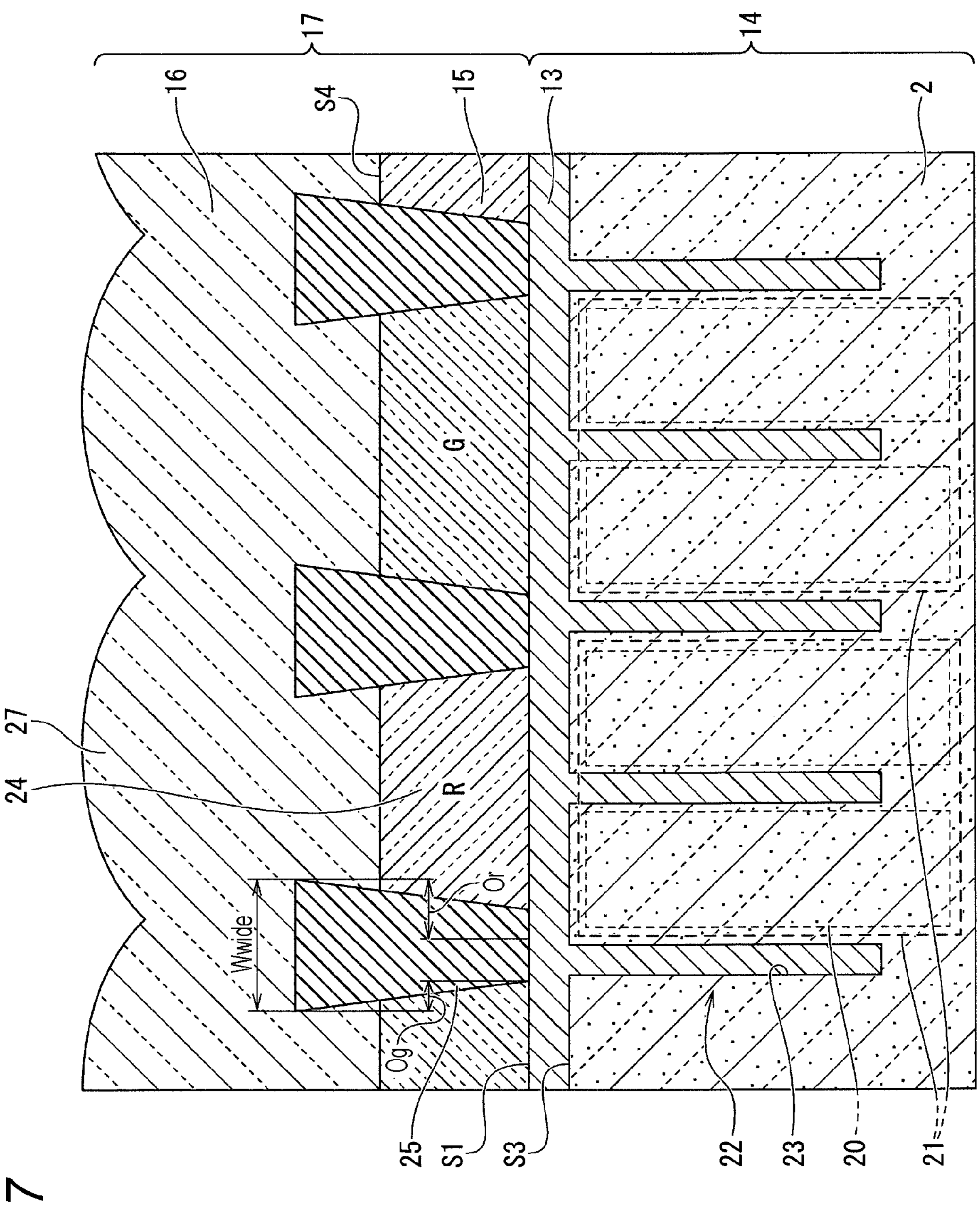
FIG. 17 is a view illustrating a cross-sectional configuration of a solid-state imaging device according to a modification.
Figure 18:
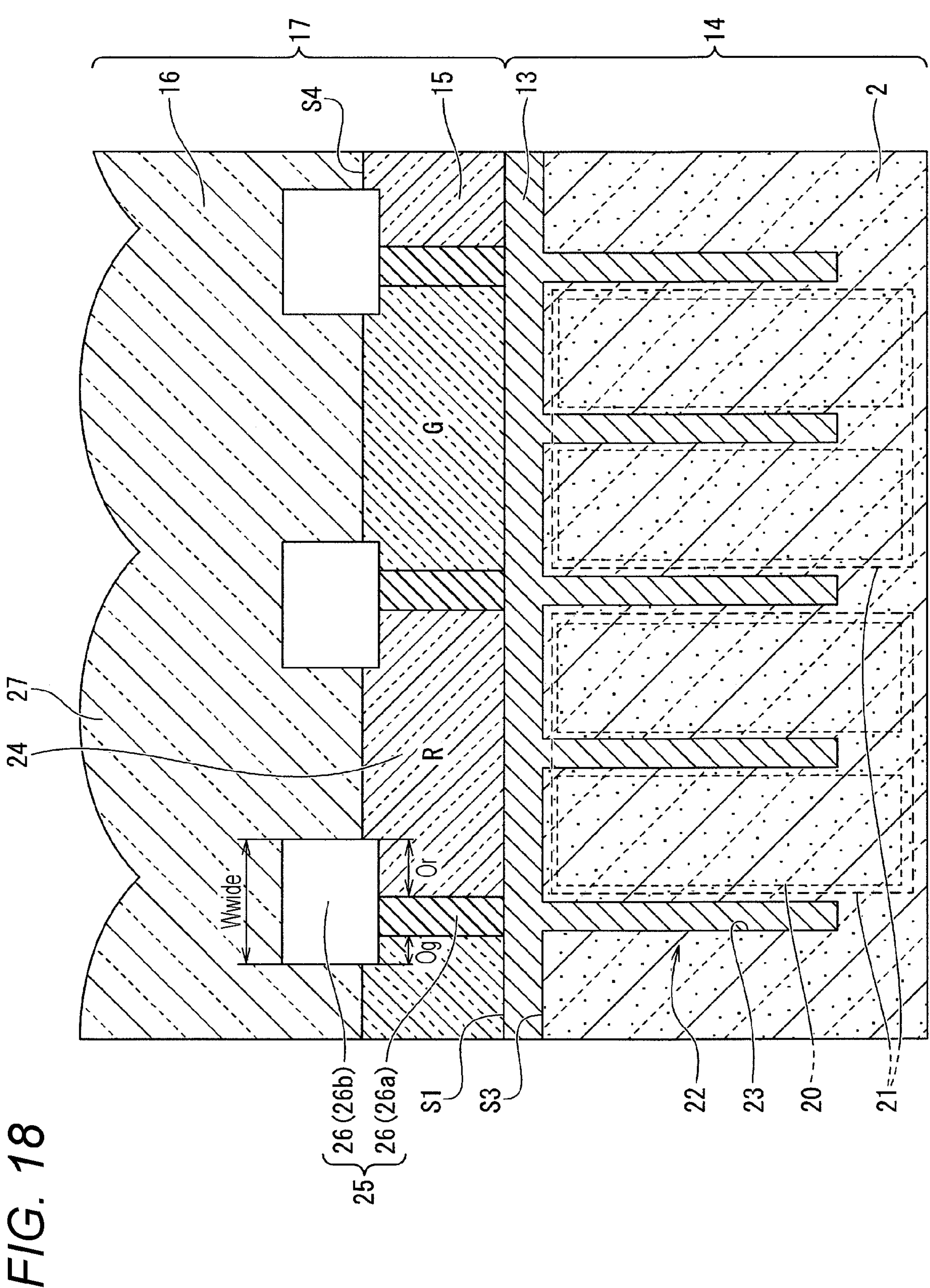
FIG. 18 is a view illustrating a cross-sectional configuration of a solid-state imaging device according to a modification.

(7) Furthermore, for example, as illustrated in FIGS. 13A, 13B, 14, 15, 16, 17, and 18, a configuration may be adopted in which a width of the low-refractive-index layer 25 is varied in a horizontally and vertically asymmetric manner according to any one of an incident wavelength, an incident angle (CRA), a pixel array, and a height of the low-refractive-index layer 25. FIGS. 13A and 13B illustrate a case of being applied to the solid-state imaging device 1 illustrated in FIGS. 2A and 2B. Similarly, FIGS. 14, 15, 16, 17, and 18 illustrate cases of being applied to the solid-state imaging devices 1 illustrated in FIGS. 8, 9, 10, 11, and 12, respectively. Each of FIGS. 13A and 14 to 18 illustrates a case of adopting a configuration in which width-direction protruding amounts Or, Og, and Ob of a portion (the upper partition layer 26*b*) having the first width Wwide of the low-refractive-index layer 25 with respect to the color filter 24 side are made different for each type of the color filter 24 to which the portion protrudes. As an example, the width-direction protruding amount Or with respect to the color filter 24 that transmits red light=the width-direction protruding amount Ob with respect to the color filter 24 that transmits blue light>the width-direction protruding amount Og with respect to the color filter 24 that transmits green light. Therefore, for example, even if diffraction characteristics of light are different depending on a type, a wavelength, and a peripheral structure of the color filter 24, the light-condensed spot 31 can be formed at a more appropriate position by setting the width-direction protruding amounts Or, Og, and Ob of the low-refractive-index layer 25 to obtain the light-condensed spot 31 at the same position.

Figure 19:
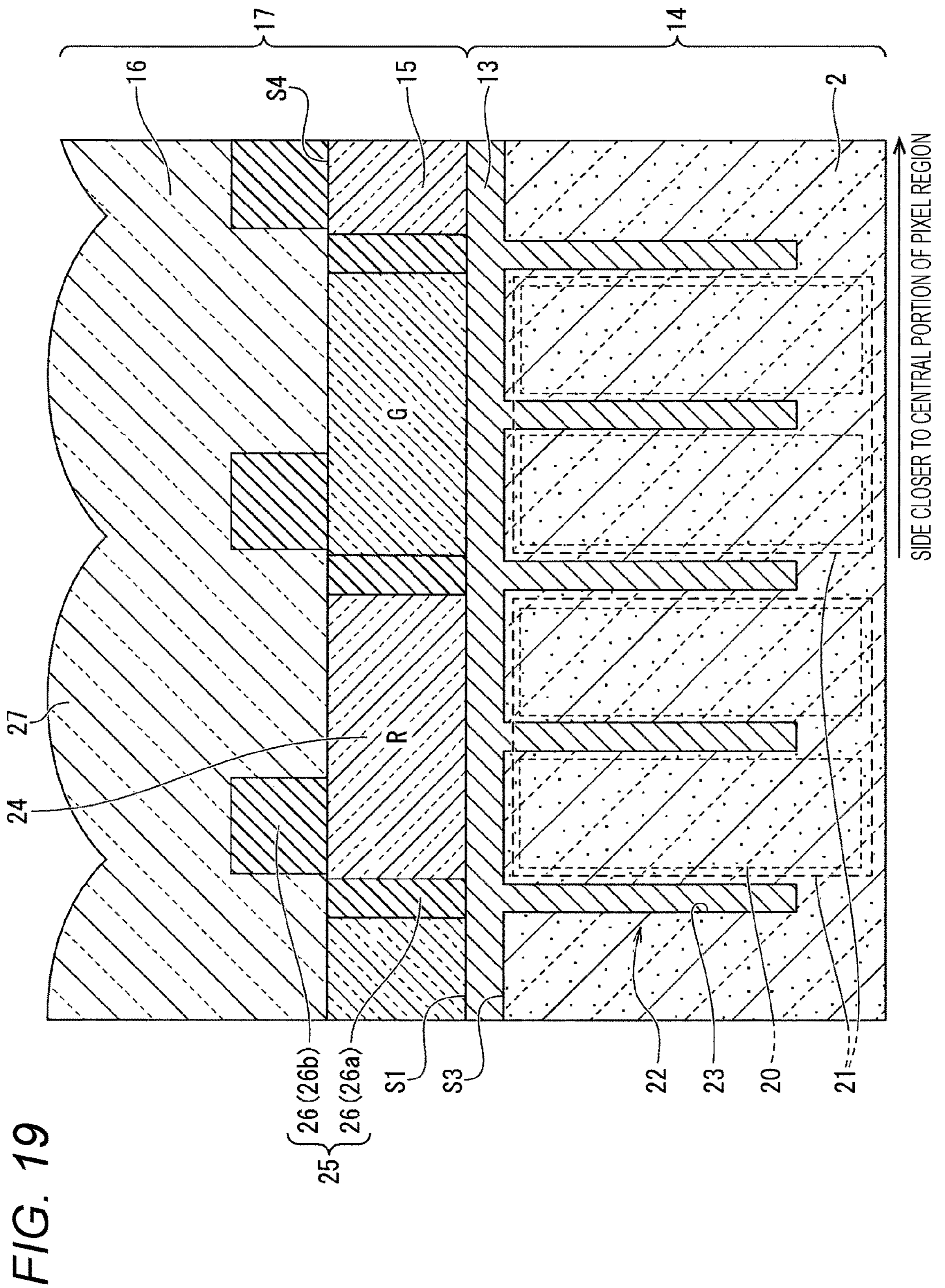
FIG. 19 is a view illustrating a cross-sectional configuration of a solid-state imaging device according to a modification.

(8) Furthermore, as illustrated in FIG. 19, a configuration may be adopted in which the low-refractive-index layer 25 is arranged at a position obtained by pupil correction. FIG. 19 illustrates a case where the upper partition layer 26*b* is arranged at a position obtained by the pupil correction. That is, from a central portion to an end portion side of the pixel region 3, linear portions constituting a lattice of the upper partition layer 26*b* in a plan view are shifted to a side closer to the central portion of the pixel region 3 than linear portions constituting a lattice of the pixel separation portion 22. The arrangement at the position obtained by the pupil correction enables suppression of unevenness in light receiving sensitivity between the photoelectric conversion units 20 included in the photoelectric conversion unit group 21 on the end portion side (high image height side) of the pixel region 3, and enables reduction in a light receiving sensitivity difference (inter-same-color sensitivity difference) between the photoelectric conversion units 20. Note that correction amounts of the color filter 24, the lower partition layer 26*a*, the upper partition layer 26*b*, and the microlens 27 may be different from each other in the pupil correction.

Figure 20:
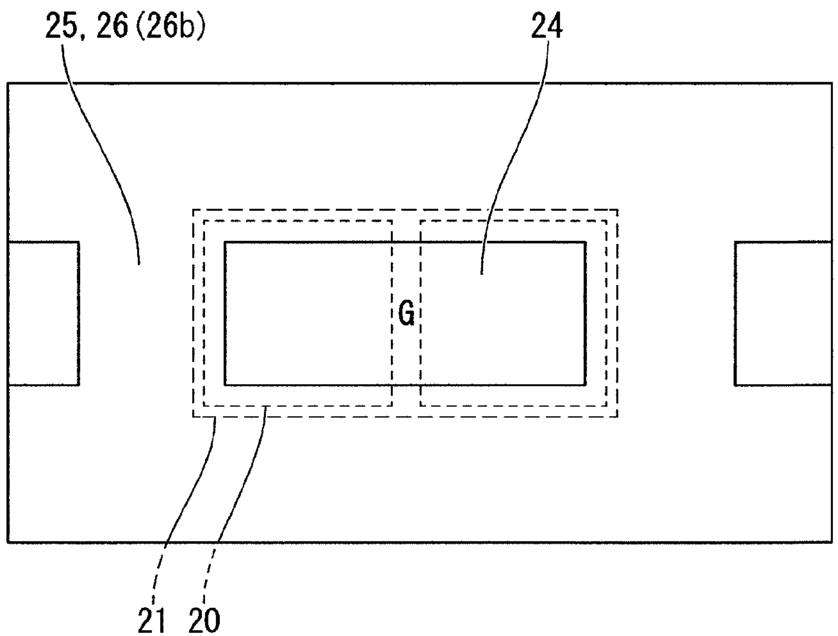
FIG. 20 is a view illustrating a cross-sectional configuration of a solid-state imaging device according to a modification taken at a position corresponding to line C-C in FIG. 13A.
Figure 21:
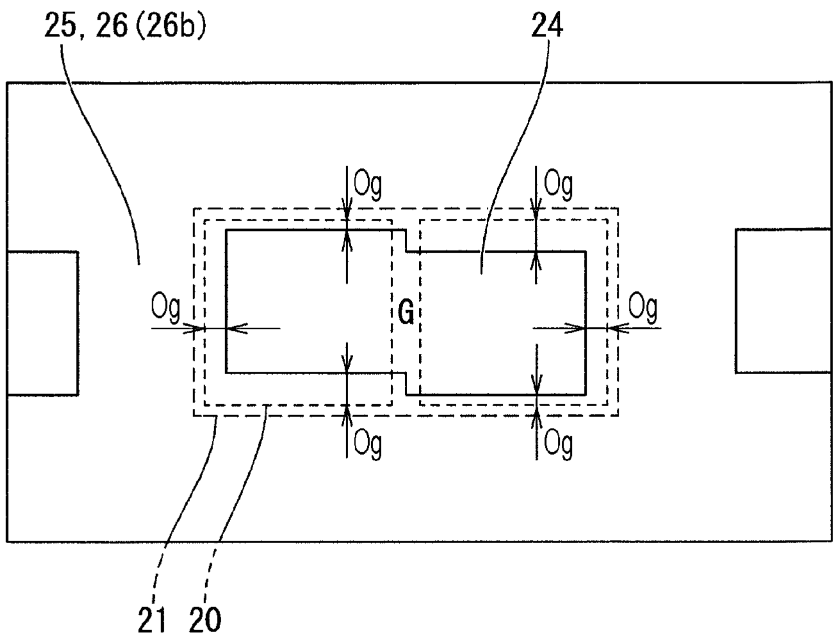
FIG. 21 is a view illustrating a cross-sectional configuration of a solid-state imaging device according to a modification taken at a position corresponding to line C-C in FIG. 13A.

(9) Furthermore, for example, as illustrated in FIG. 20, the photoelectric conversion unit group 21 may include two (2×1) photoelectric conversion units 20. FIG. 20 illustrates a case where two photoelectric conversion units 20, aligned in a row direction and adjacent to each other, constitute the photoelectric conversion unit group 21. Therefore, one color filter 24 and one microlens 27 can be shared by the two adjacent photoelectric conversion units 20. The configuration of the photoelectric conversion unit group 21 illustrated in FIG. 20 can also be applied to the solid-state imaging devices 1 illustrated in FIGS. 8 to 19. Furthermore, for example, in the case of being applied to the solid-state imaging devices 1 illustrated in FIGS. 13A, 13B, 14, 15, 16, 17, and 18, the width-direction protruding amounts Or, Og, and Ob (only "Og" is illustrated in FIG. 21) of the low-refractive-index layer 25 with respect to the color filter 24 side may be changed in each part of the low-refractive-index layer 25 surrounding one color filter 24 as illustrated in FIG. 21.

Figure 22A:
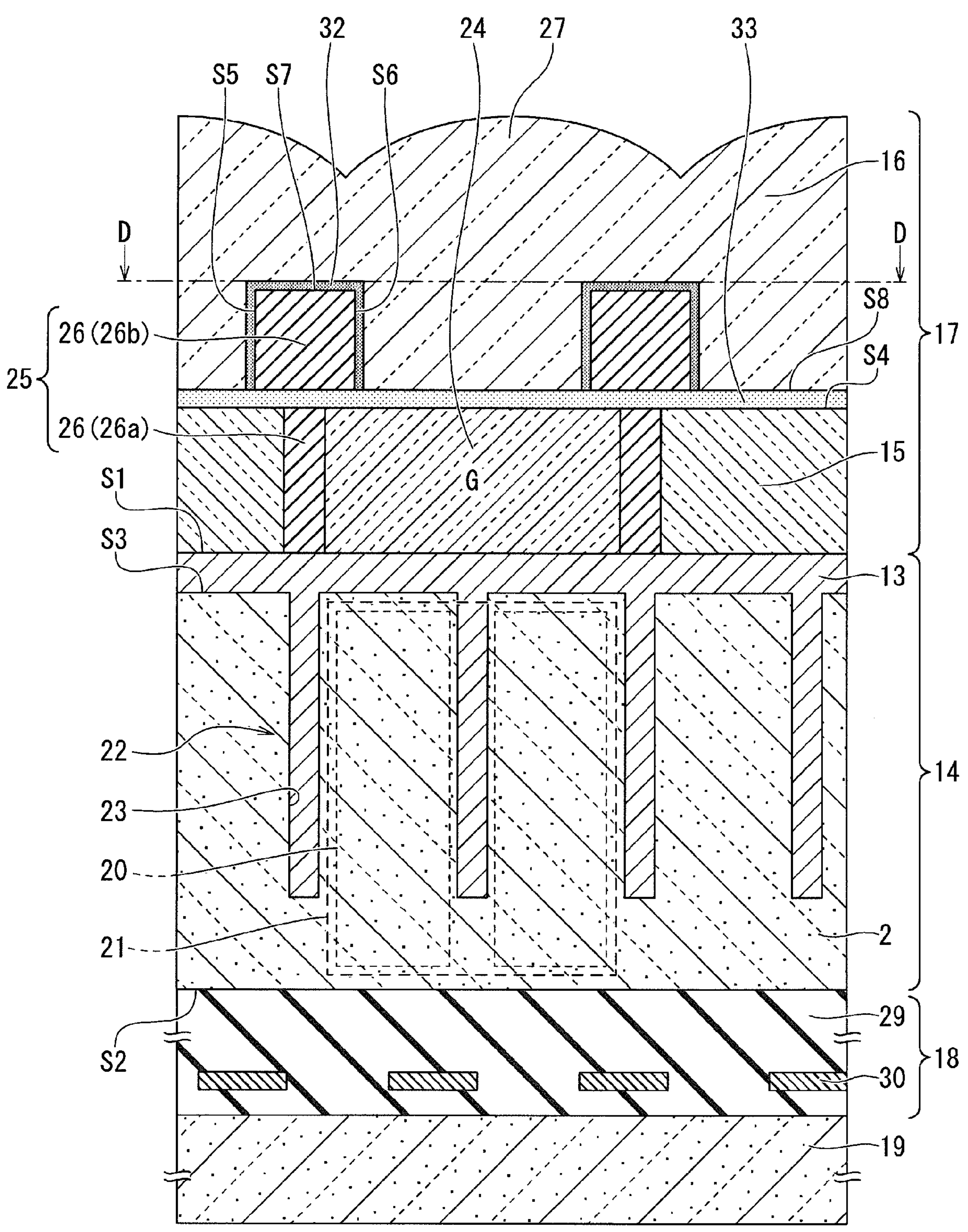
FIG. 22A is a view illustrating a cross-sectional configuration of a solid-state imaging device according to a modification.
Figure 22B:
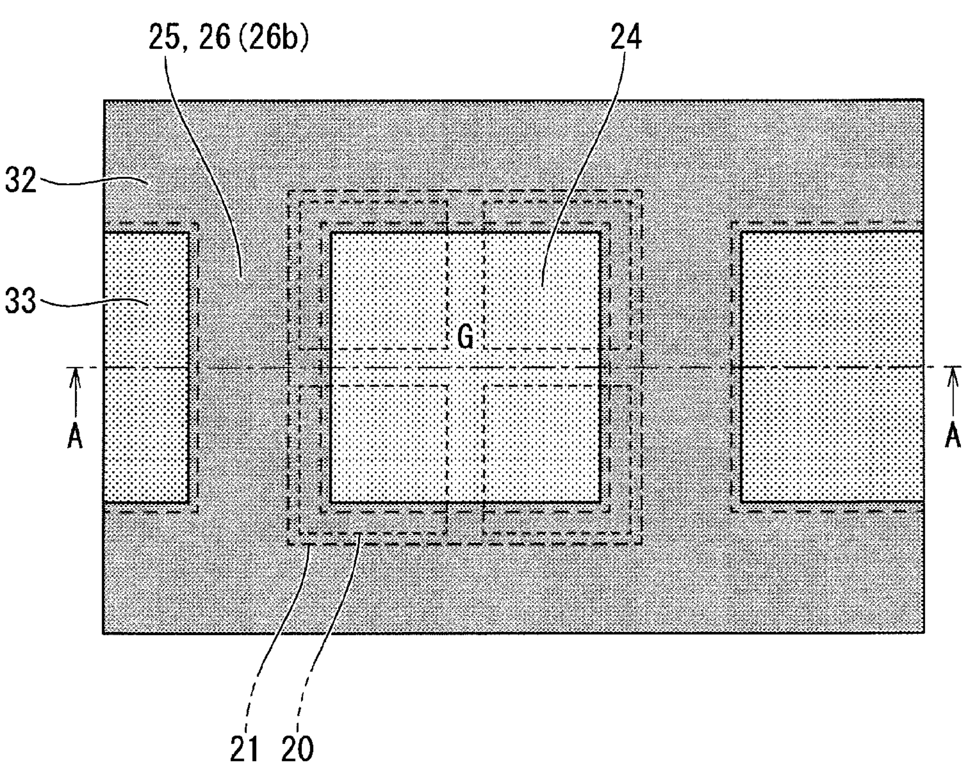
FIG. 22B is a view illustrating a cross-sectional configuration of the solid-state imaging device taken along line D-D in FIG. 22A.

(10) Furthermore, for example, as illustrated in FIGS. 22A and 22B, a configuration may be adopted in which a protective film 32 that is arranged between the upper partition layer 26*b* and the microlens 27 and covers the upper partition layer 26*b* is provided. In FIG. 21A, the protective film 32 is arranged only on side surfaces (hereinafter, also referred to as "side surfaces S5 and S6") of the upper partition layer 26*b* in the width direction and a surface (hereinafter, also referred to as a "back surface S7") on a side opposite to a surface on the color filter 24 side. As the protective film 32, for example, a film that prevents a material of the microlens 27 from entering (being impregnated into) the upper partition layer 26*b* can be adopted. As the material of the protective film 32, for example, a material that prevents the material of the microlens 27 from passing therethrough can be adopted. Examples thereof include a low temperature oxide (LTO) film such as a silicon oxide film or a silicon nitride film. Therefore, it is possible to suppress the material of the microlens 27 (transparent resin having a relatively higher refractive index) from being impregnated into a material of the upper partition layer 26*b* (a low-refractive-index resin having a relatively lower refractive index), and it is possible to suppress an increase in the refractive index of the material of the upper partition layer 26*b* (low-refractive-index resin). Therefore, the light-condensed spot 31 can be formed at a more appropriate position. FIG. 22B is a view illustrating a cross-sectional configuration of the solid-state imaging device 1 in a case of being taken along line D-D in FIG. 22A. Note that the microlens 27 is omitted in FIG. 22B to make the protective film 32 apparent.

Furthermore, in FIG. 22A, the lower partition layer 26*a* is entirely present between the color filters 24, and the upper partition layer 26*b* is present closer to the microlens 27 side than the back surface S4 (light receiving surface) of the color filter 24. Furthermore, a stopper film (hereinafter, also referred to as a "first stopper film 33"), which is arranged on the back surface S4 (light receiving surface) of the color filter 24 and covers the entire back surface S4 (light receiving surface) of the color filter 24, is further provided in FIG. 22A. Then, the upper partition layer 26*b* is arranged on a light receiving surface (hereinafter, also referred to as a "back surface S8") of the first stopper film 33 in a state of being covered with the protective film 32. As the first stopper film 33, for example, a film that functions as an etching stopper can be adopted. As a material of the first stopper film 33, for example, a material with a low etching rate can be adopted. Examples thereof include titanium oxide ($TiO_2$). Here, for example, at the time of forming the upper partition layer 26*b*, first, layers including the materials of the first stopper film 33 and the protective film 32, respectively, are formed in this order on the back surface S4 of the color filter 24. Subsequently, dry etching is performed to form the upper partition layer 26*b*. In such a procedure, the etching can be stopped by the first stopper film 33 so that the color filter 24 is not etched according to the solid-state imaging device 1 illustrated in FIG. 22A.

Figure 23A:
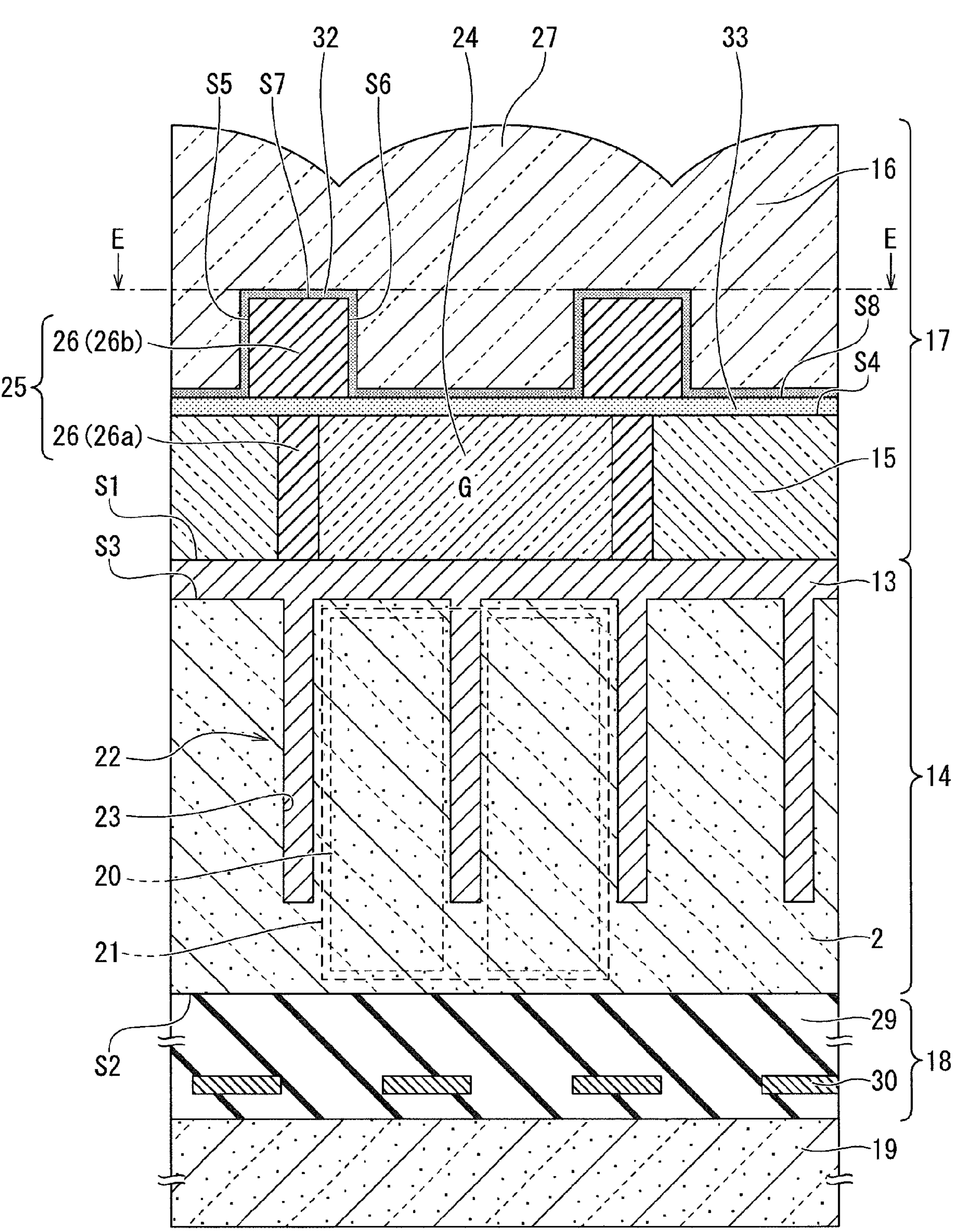
FIG. 23A is a view illustrating a cross-sectional configuration of a solid-state imaging device according to a modification.
Figure 23B:
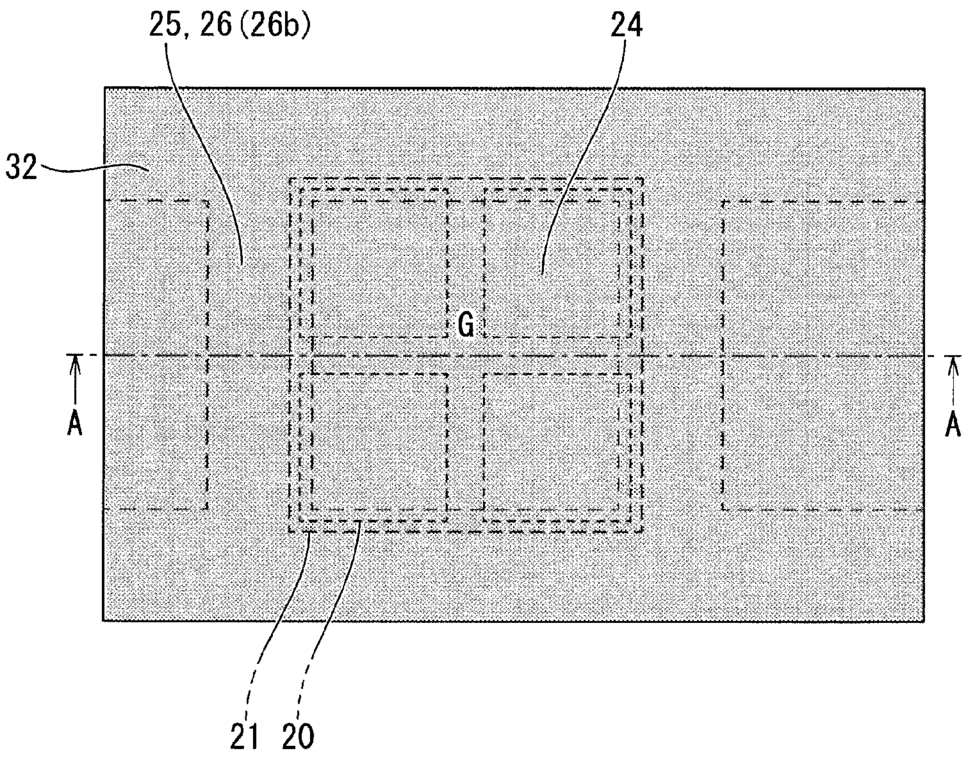
FIG. 23B is a view illustrating a cross-sectional configuration of the solid-state imaging device taken along line E-E in FIG. 23A.

(11) Furthermore, for example, as illustrated in FIGS. 23A and 23B, the solid-state imaging device 1 illustrated in FIGS. 22A and 22B may adopt a configuration in which the protective film 32 is arranged between the upper partition layer 26*b* and the microlens 27 and between a plurality of the upper partition layers 26*b* to continuously cover the plurality of upper partition layers 26*b*. FIG. 23A illustrates a case where the protective film 32 is arranged so as to continuously cover the side surfaces S5 and S6 and the back surfaces S7 of the plurality of upper partition layers 26*b* and regions of the back surface S8 of the first stopper film 33 where the upper partition layers 26*b* are not present, with respect to each of the plurality of upper partition layers 26*b* arranged on the first stopper film 33 (the back surface S8). Therefore, the configuration of the protective film 32 can be simplified, and the protective film 32 can be easily manufactured. FIG. 23B is a view illustrating a cross-sectional configuration of the solid-state imaging device 1 in a case of being taken along line E-E in FIG. 23A. Note that the microlens 27 is omitted in FIG. 23B to make the protective film 32 apparent.

Figure 24:
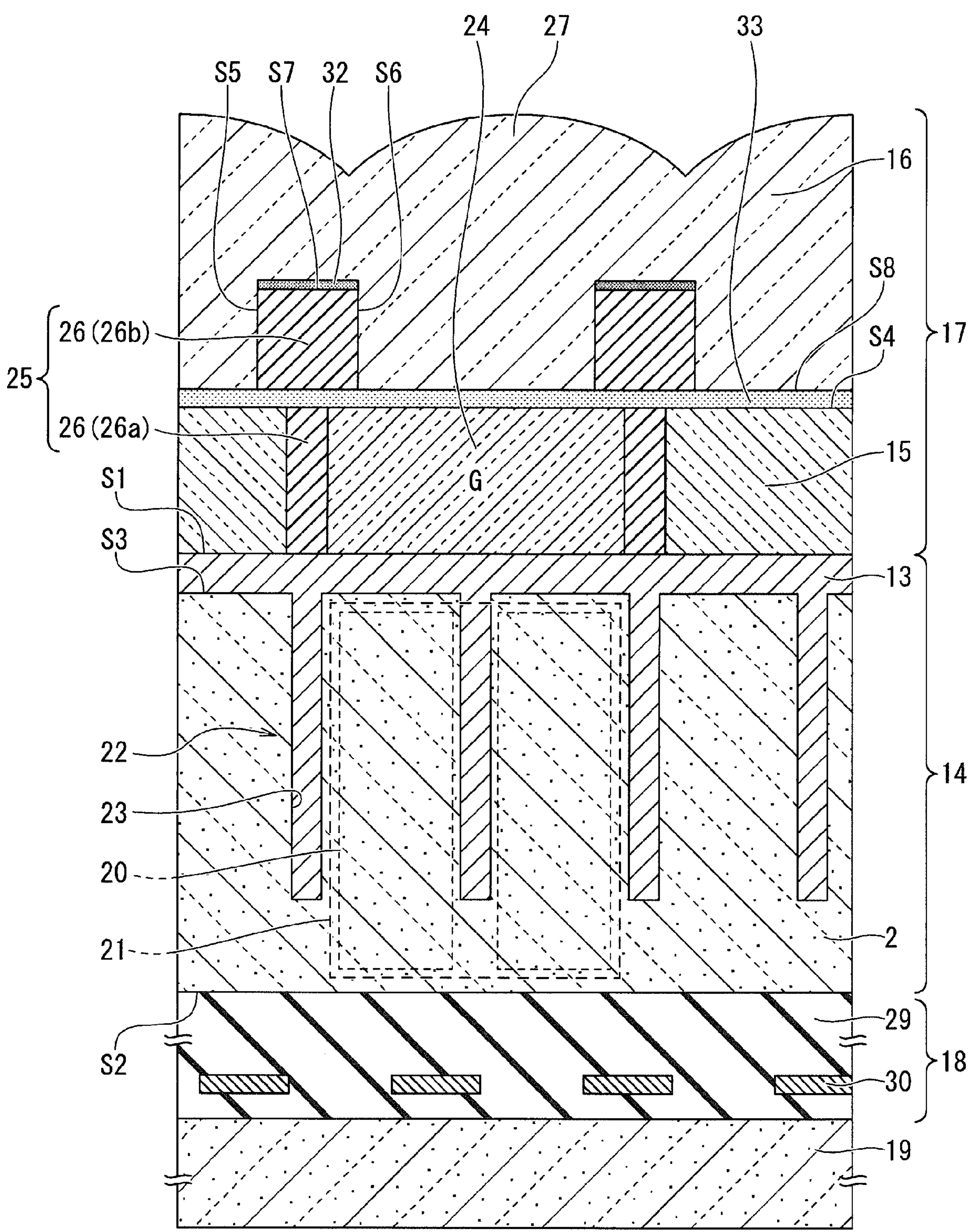
FIG. 24 is a view illustrating a cross-sectional configuration of a solid-state imaging device according to a modification.

(12) Furthermore, for example, as illustrated in FIG. 24, the solid-state imaging device 1 illustrated in FIG. 22A may adopt a configuration in which the protective film 32 is arranged between the upper partition layer 26*b* and the microlens 27 to cover only the back surface S7 (surface on the side opposite to the surface on the color filter 24 side) of the upper partition layer 26*b*. Therefore, it is possible to suppress the material of the microlens 27 (a transparent resin having a relatively higher refractive index) from being impregnated into a portion of the upper partition layer 26*b* (a low-refractive-index resin having a relatively lower refractive index) that is hit by the incident light 28 illustrated in FIG. 2A, that is, a portion that greatly affects diffraction characteristics.

Figure 25:
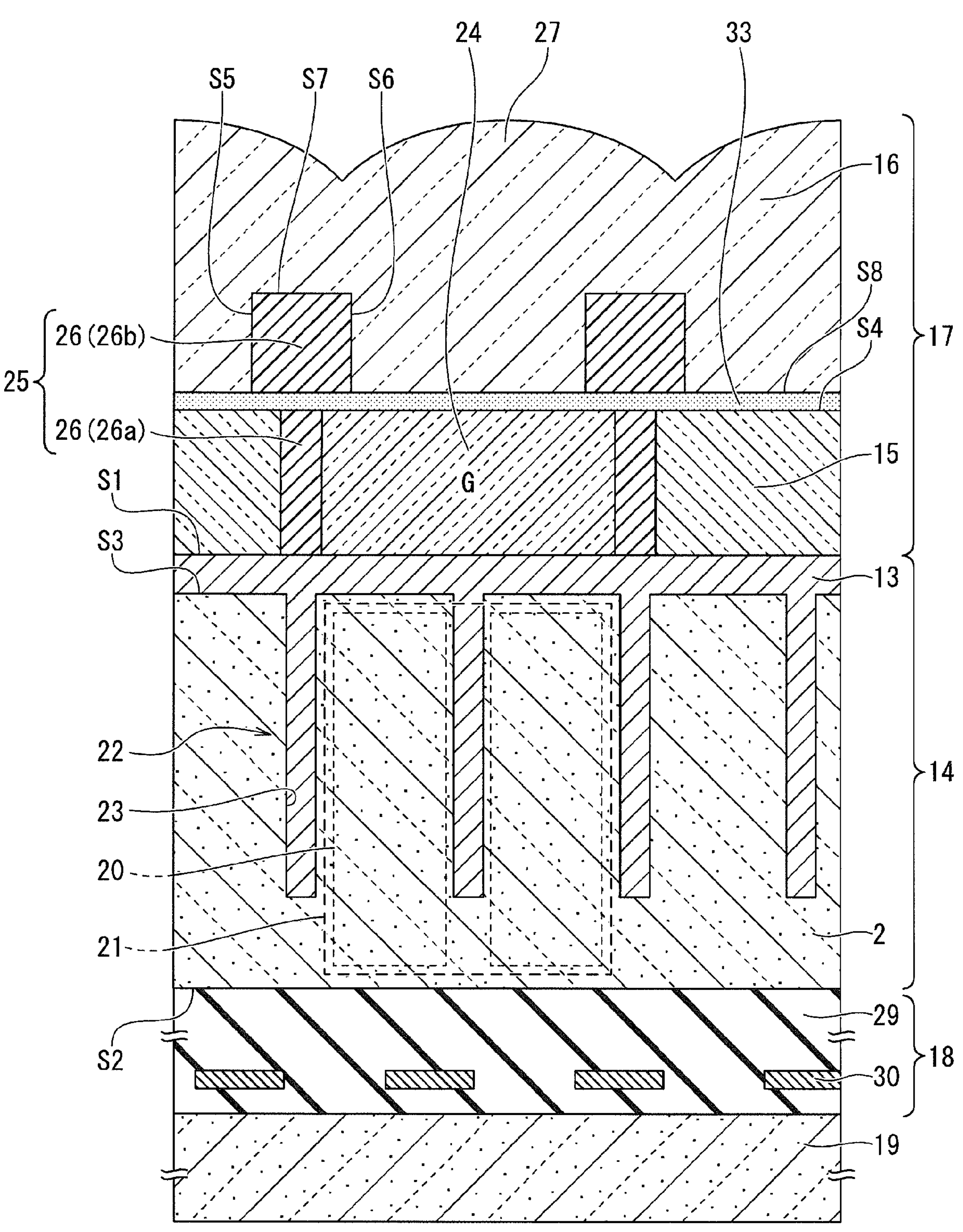
FIG. 25 is a view illustrating a cross-sectional configuration of a solid-state imaging device according to a modification.

(13) Furthermore, for example, as illustrated in FIG. 25, a configuration may be adopted in which the protective film 32 is omitted from the solid-state imaging device 1 illustrated in FIGS. 22A, 23A, and 24, and only the first stopper film 33 out of the protective film 32 and the first stopper film 33 is provided. FIG. 25 illustrates a case where the upper partition layer 26*b* is arranged on the back surface S8 of the first stopper film 33.

Figure 26:
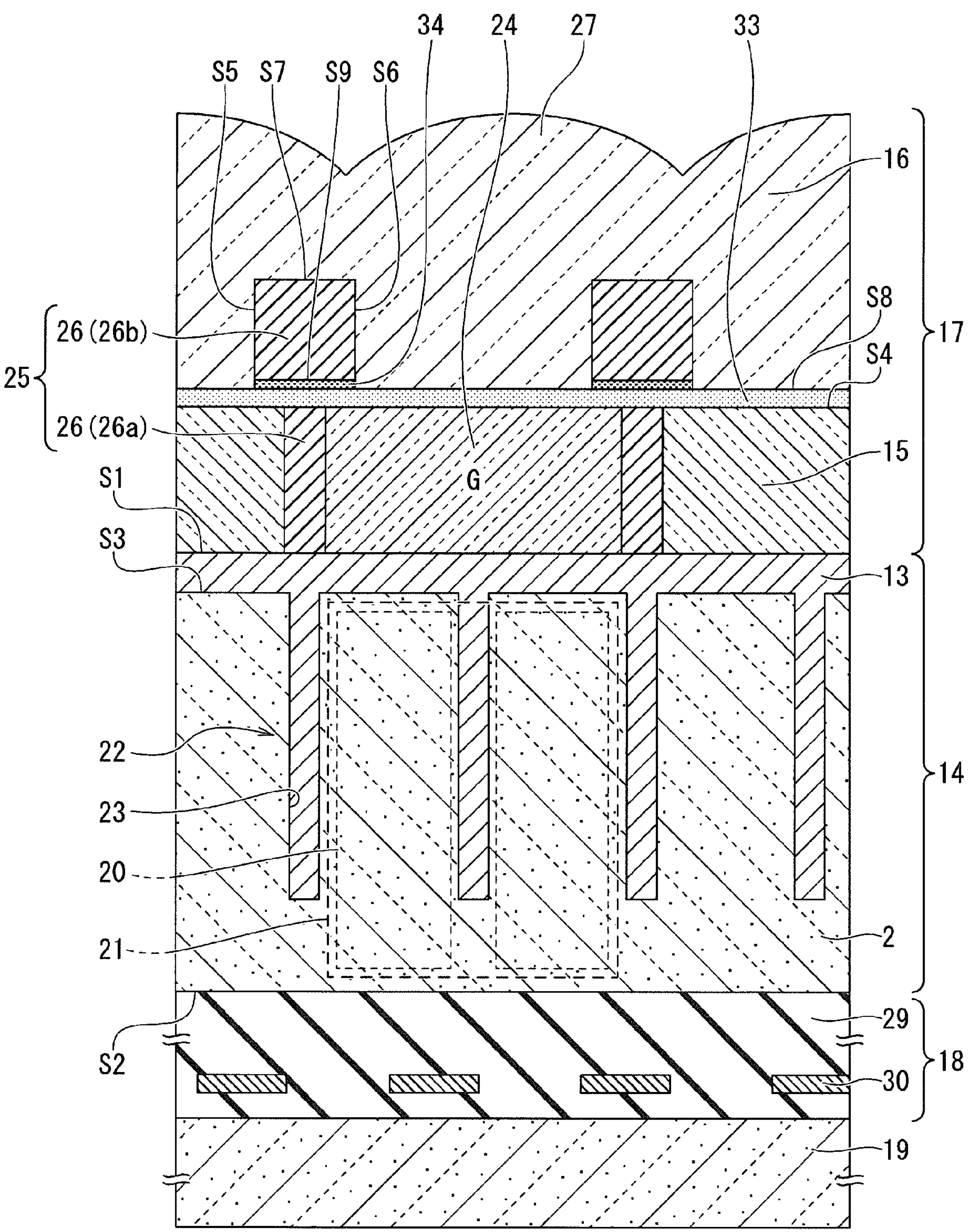
FIG. 26 is a view illustrating a cross-sectional configuration of a solid-state imaging device according to a modification.
Figure 27A:
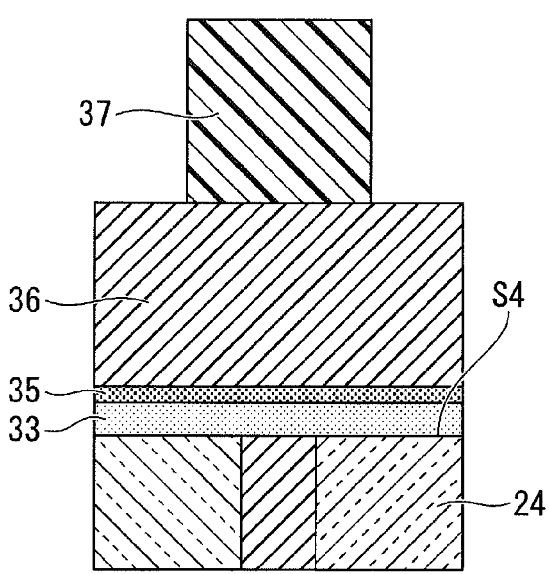
FIG. 27A is a view illustrating a method for forming an upper partition layer.
Figure 27B:
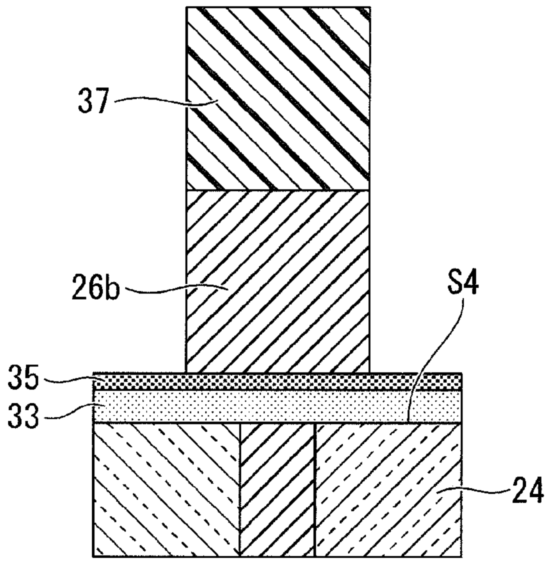
FIG. 27B is a view illustrating the method of forming an upper partition layer.
Figure 27C:
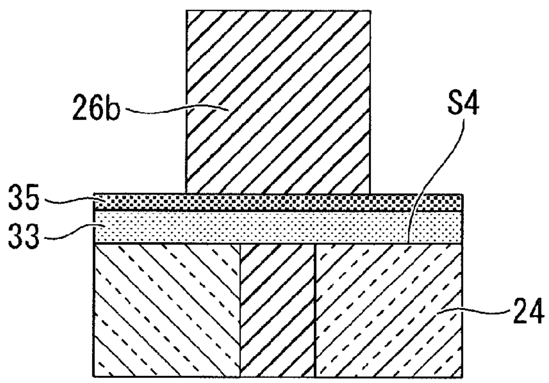
FIG. 27C is a view illustrating the method of forming an upper partition layer.
Figure 27D:
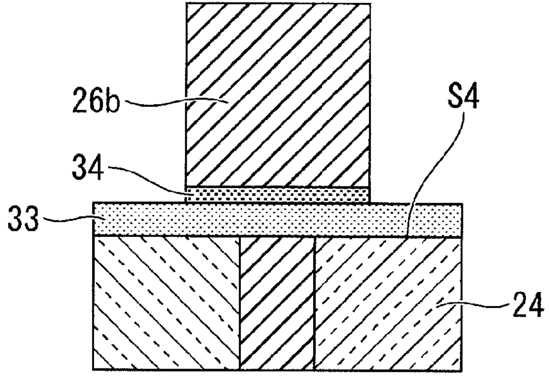
FIG. 27D is a view illustrating the method of forming an upper partition layer.

(14) Furthermore, for example, as illustrated in FIG. 26, the solid-state imaging device 1 illustrated in FIG. 25 may include a second stopper film 34 that is arranged on the back surface S8 (light receiving surface) of the first stopper film 33 and covers only a portion of the back surface S8 (light receiving surface) of the first stopper film 33 opposing the upper partition layer 26*b*. In FIG. 26, the first stopper film 33 is arranged on the back surface S4 (light receiving surface) of the color filter 24 to cover the entire back surface S4 (light receiving surface) of the color filter 24. Furthermore, the upper partition layer 26*b* is arranged on a light receiving surface (hereinafter, also referred to as a "back surface S9") of the second stopper film 34. As a material of the second stopper film 34, for example, silicon oxynitride (SiON) can be adopted. Here, at the time of forming the upper partition layer 26*b*, first, as illustrated in FIG. 27A, the first stopper film 33, a layer 35 including the material of the second stopper film 34, a layer 36 including a material of the upper partition layer 26*b*, and an etching mask 37 including a resist are formed in this order on the back surface S4 of the color filter 24. Subsequently, dry etching is performed to form the upper partition layer 26*b* as illustrated in FIG. 27B, ashing is performed to remove the etching mask 37 as illustrated in FIG. 27C, and the second stopper film 34 is formed by an electron beam (EB) as illustrated in FIG. 27D. In such a procedure, damage to the first stopper film 33 caused by the ashing can be prevented by the second stopper film 34, and peeling of the upper partition layer 26*b* can be prevented according to the solid-state imaging device 1 illustrated in FIG. 26.

Figure 28:
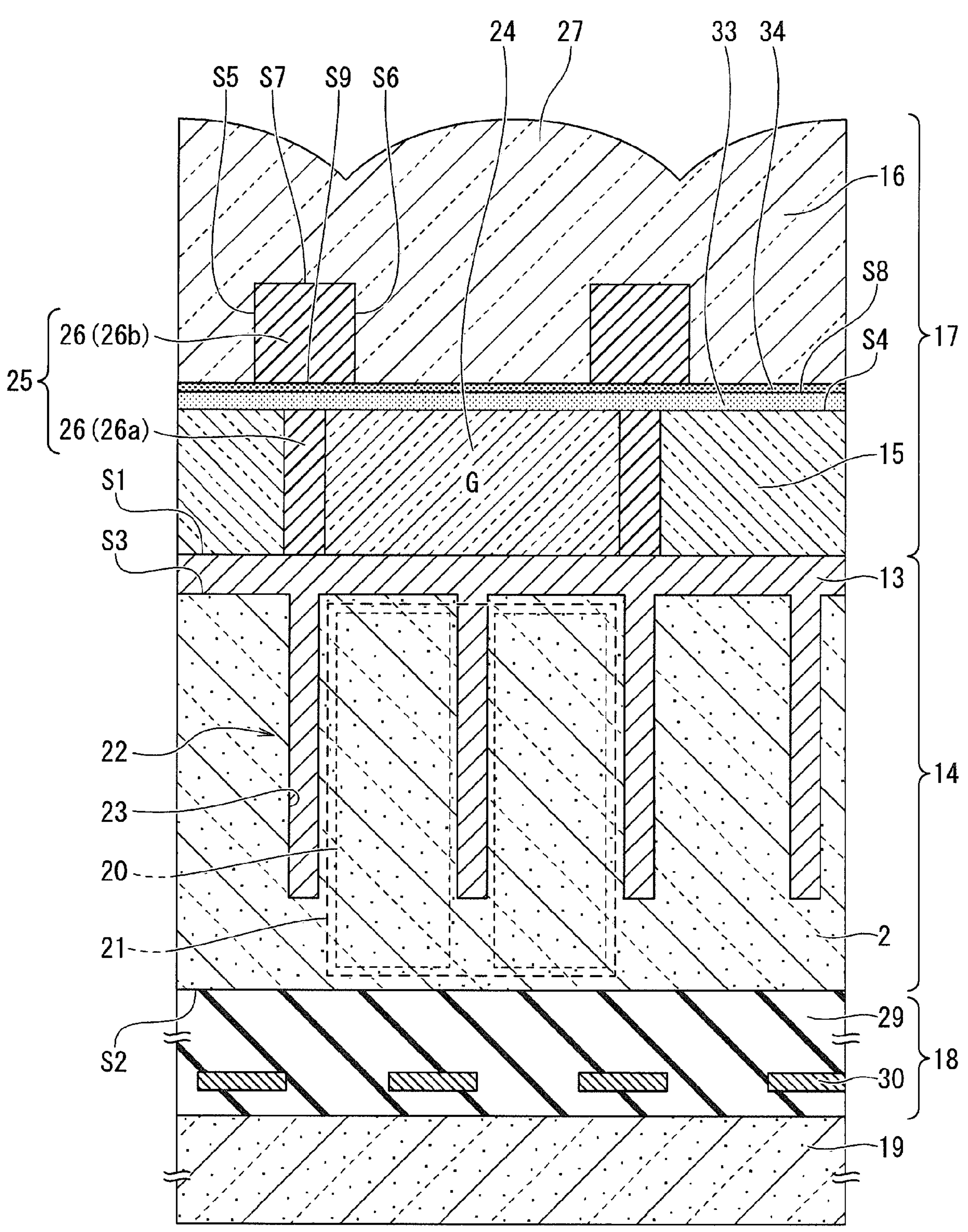
FIG. 28 is a view illustrating a cross-sectional configuration of a solid-state imaging device according to a modification.

(15) Furthermore, for example, as illustrated in FIG. 28, the solid-state imaging device 1 illustrated in FIG. 26 may adopt a configuration in which the second stopper film 34 is arranged on the back surface S8 (light receiving surface) of the first stopper film 33 to cover the entire back surface S8 (light receiving surface) of the first stopper film 33. In FIG. 28, the first stopper film 33 is arranged on the back surface S4 (light receiving surface) of the color filter 24 to cover the entire back surface S4 (light receiving surface) of the color filter 24. Furthermore, the upper partition layer 26*b* is arranged on the back surface S9 (light receiving surface) of the second stopper film 34. Therefore, the second stopper film 34 can be simplified and easily manufactured.

Figure 29:
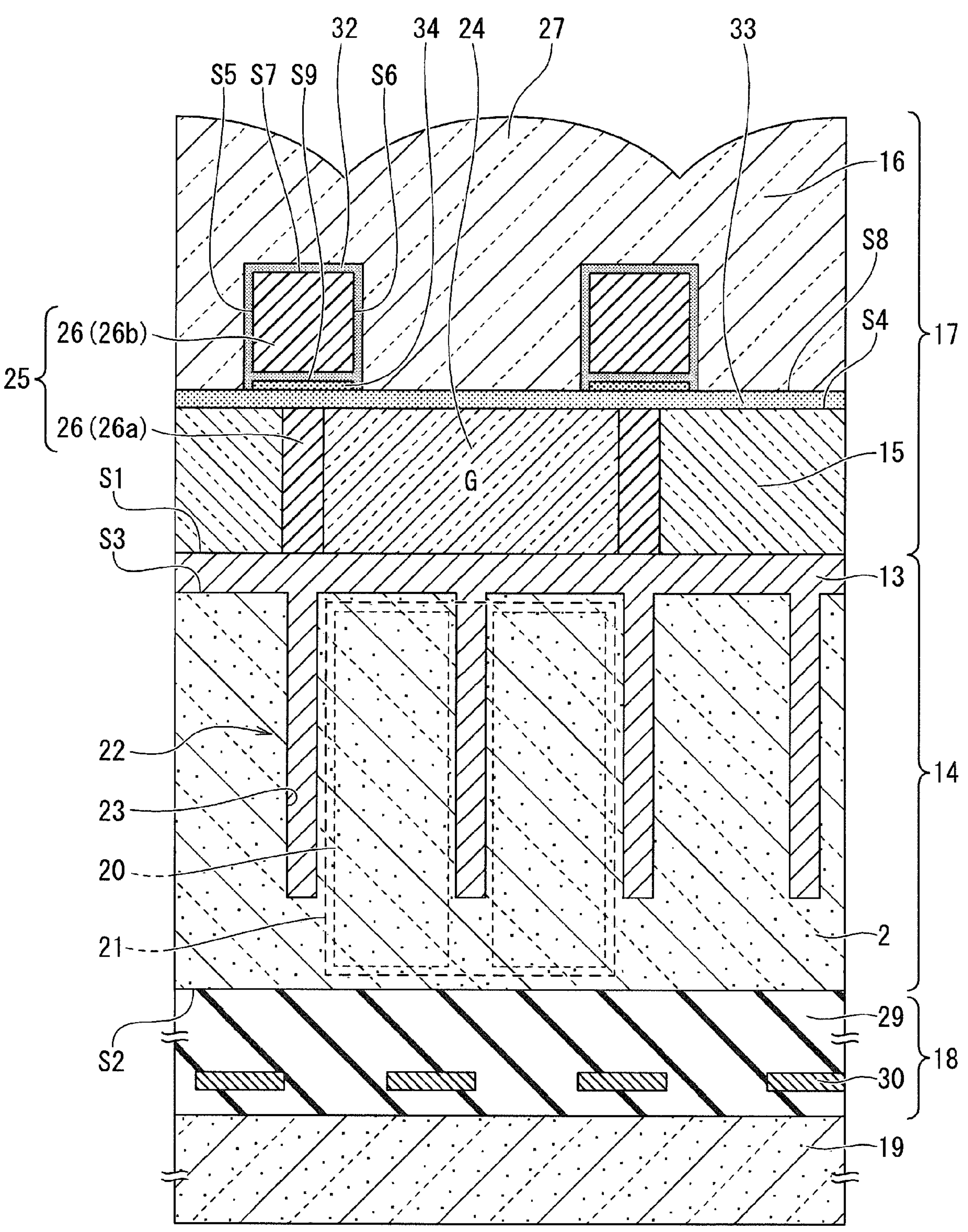
FIG. 29 is a view illustrating a cross-sectional configuration of a solid-state imaging device according to a modification.

(16) Furthermore, for example, as illustrated in FIG. 29, the solid-state imaging device 1 illustrated in FIG. 26 may include the protective film 32 that covers the upper partition layer 26*b*. In FIG. 29, the first stopper film 33 is arranged on the back surface S4 (light receiving surface) of the color filter 24 to cover the entire back surface S4 (light receiving surface) of the color filter 24. Furthermore, the second stopper film 34 is arranged on the back surface S8 (light receiving surface) of the first stopper film 33, and covers only a portion opposing the upper partition layer 26*b*. Furthermore, the upper partition layer 26*b* is arranged on the back surface S9 (light receiving surface) of the second stopper film 34 in a state of being covered with the protective film 32. Therefore, a material of the microlens 27 can be suppressed from being impregnated into a material of the upper partition layer 26*b*, and an increase in a refractive index of the material (low-refractive-index resin) of the upper partition layer 26*b* can be suppressed.

Figure 30:
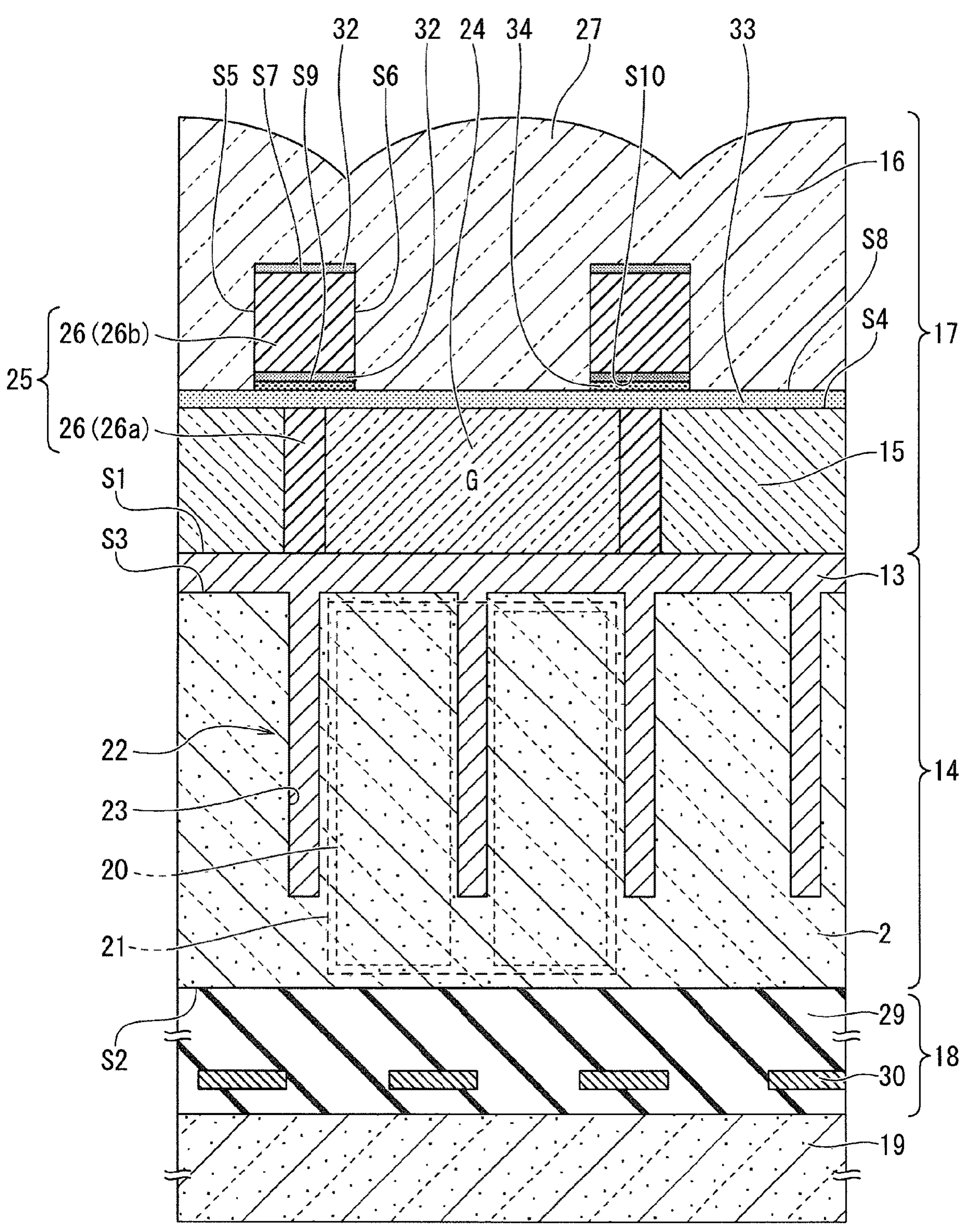
FIG. 30 is a view illustrating a cross-sectional configuration of a solid-state imaging device according to a modification.

(17) Furthermore, for example, as illustrated in FIG. 30, the solid-state imaging device 1 illustrated in FIG. 26 may include the protective film 32 that covers only a surface (hereinafter, also referred to as a "front surface S10") of the upper partition layer 26*b* on the color filter 24 side and the back surface S7 (surface on the side opposite to the front surface S10). In FIG. 30, the upper partition layer 26*b* is arranged on the back surface S9 (light receiving surface) of the second stopper film 34 in a state of being covered with the protective film 32. Therefore, it is possible to suppress the material of the microlens 27 (a transparent resin having a relatively higher refractive index) from being impregnated into a portion of the upper partition layer 26*b* that is hit by the incident light 28 illustrated in FIG. 2A, that is, a portion that greatly affects diffraction characteristics.

Figure 31:
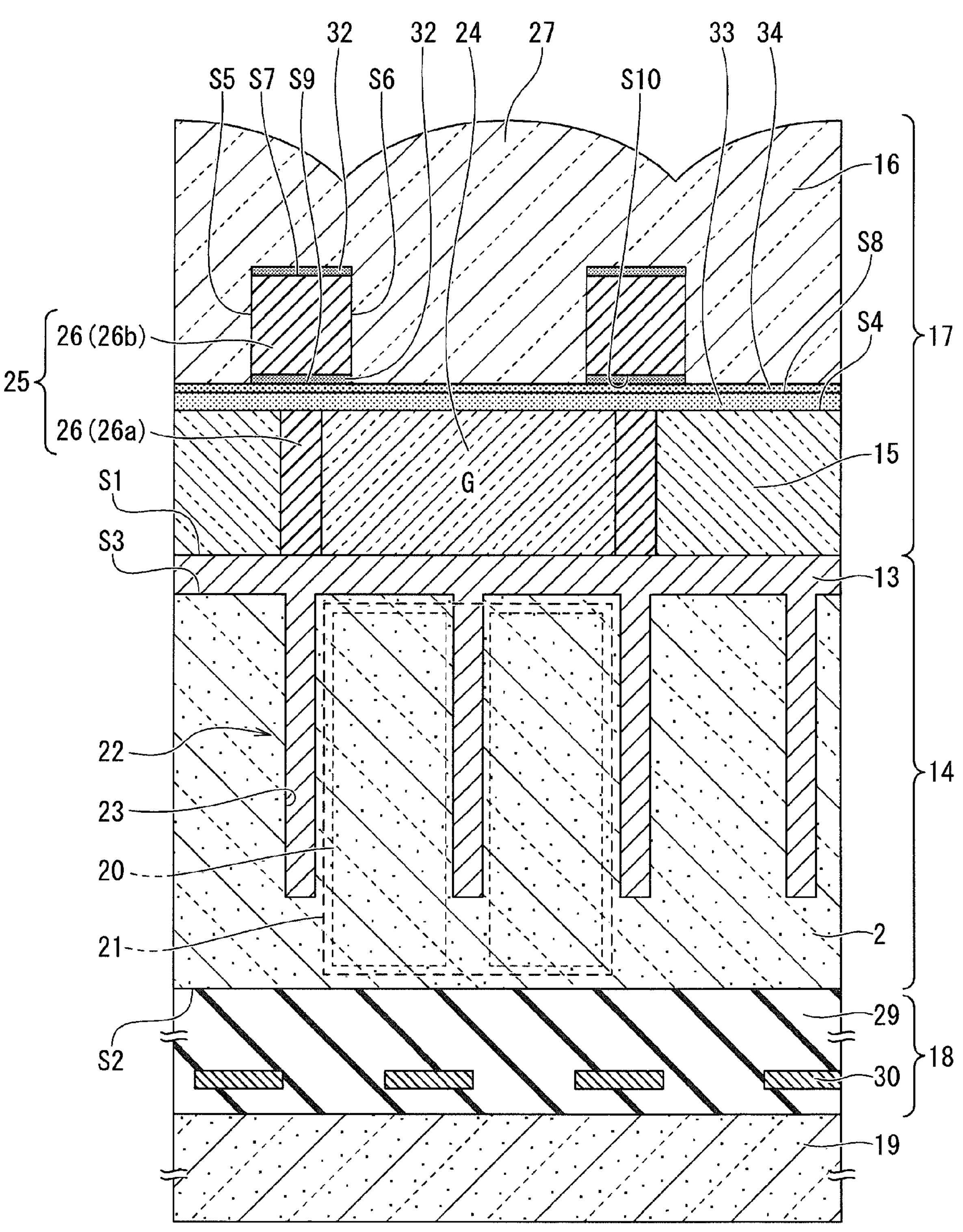
FIG. 31 is a view illustrating a cross-sectional configuration of a solid-state imaging device according to a modification.

(18) Furthermore, for example, as illustrated in FIG. 31, the solid-state imaging device 1 illustrated in FIG. 28 may include the protective film 32 that covers only the front surface S10 (surface on the color filter 24 side) and the back surface S7 (surface on the side opposite to the front surface S10) of the upper partition layer 26*b*. In FIG. 31, the first stopper film 33 is arranged on the back surface S4 (light receiving surface) of the color filter 24 to cover the entire back surface S4 (light receiving surface) of the color filter 24. Furthermore, the second stopper film 34 is arranged on the back surface S8 (light receiving surface) of the first stopper film 33, and covers the entire back surface S8 (light receiving surface) of the first stopper film 33. Furthermore, the upper partition layer 26*b* is arranged on the back surface S9 (light receiving surface) of the second stopper film 34 in a state of being covered with the protective film 32.

Figure 32:
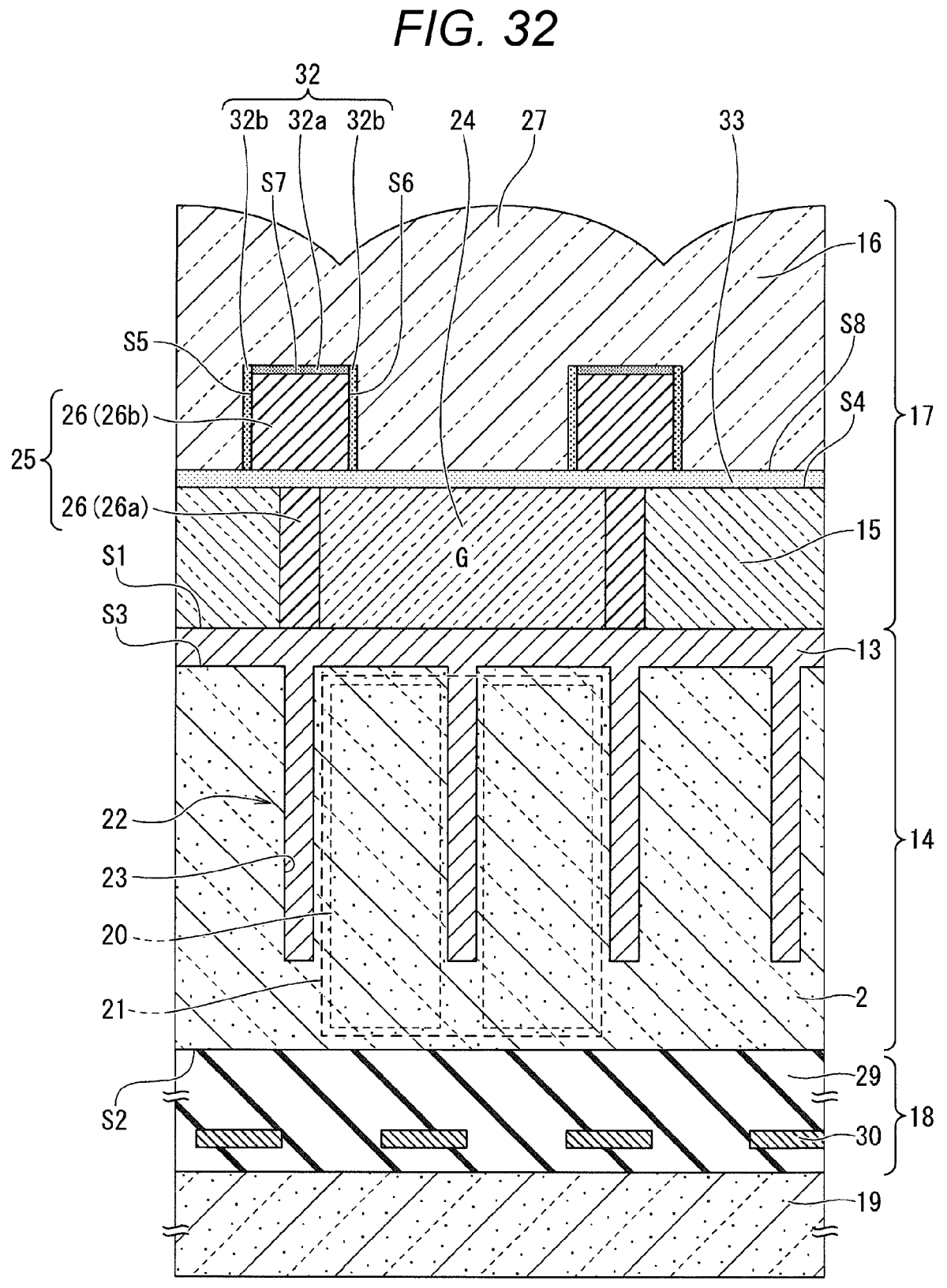

(19) Furthermore, for example, as illustrated in FIG. 32, the solid-state imaging device 1 illustrated in FIG. 22A may adopt a configuration in which, in the protective film 32, a portion (hereinafter, also referred to as a "first portion 32*a*") on the back surface S7 side of the upper partition layer 26*b* and a portion (that is, a portion different from the first portion 32*a*, which is also referred to as a "second portion 32*b*" hereinafter) on the side surfaces S5 and S6 side are separately formed. In FIG. 32, the first stopper film 33 is arranged on the back surface S4 (light receiving surface) of the color filter 24 to cover the entire back surface S4 (light receiving surface) of the color filter 24. Furthermore, the protective film 32 is arranged between the upper partition layer 26*b* and the microlens 27 to cover the upper partition layer 26*b*. In the protective film 32, a material of the first portion 32*a* is different from a material of the second portion 32*b*. Examples of the material of the first portion 32*a* include an LTO film. Furthermore, examples of the material of the second portion 32*b* include silicon oxynitride (SiON). Note that the first portion 32*a* and the second portion 32*b* may include the same material.

Figure 33:
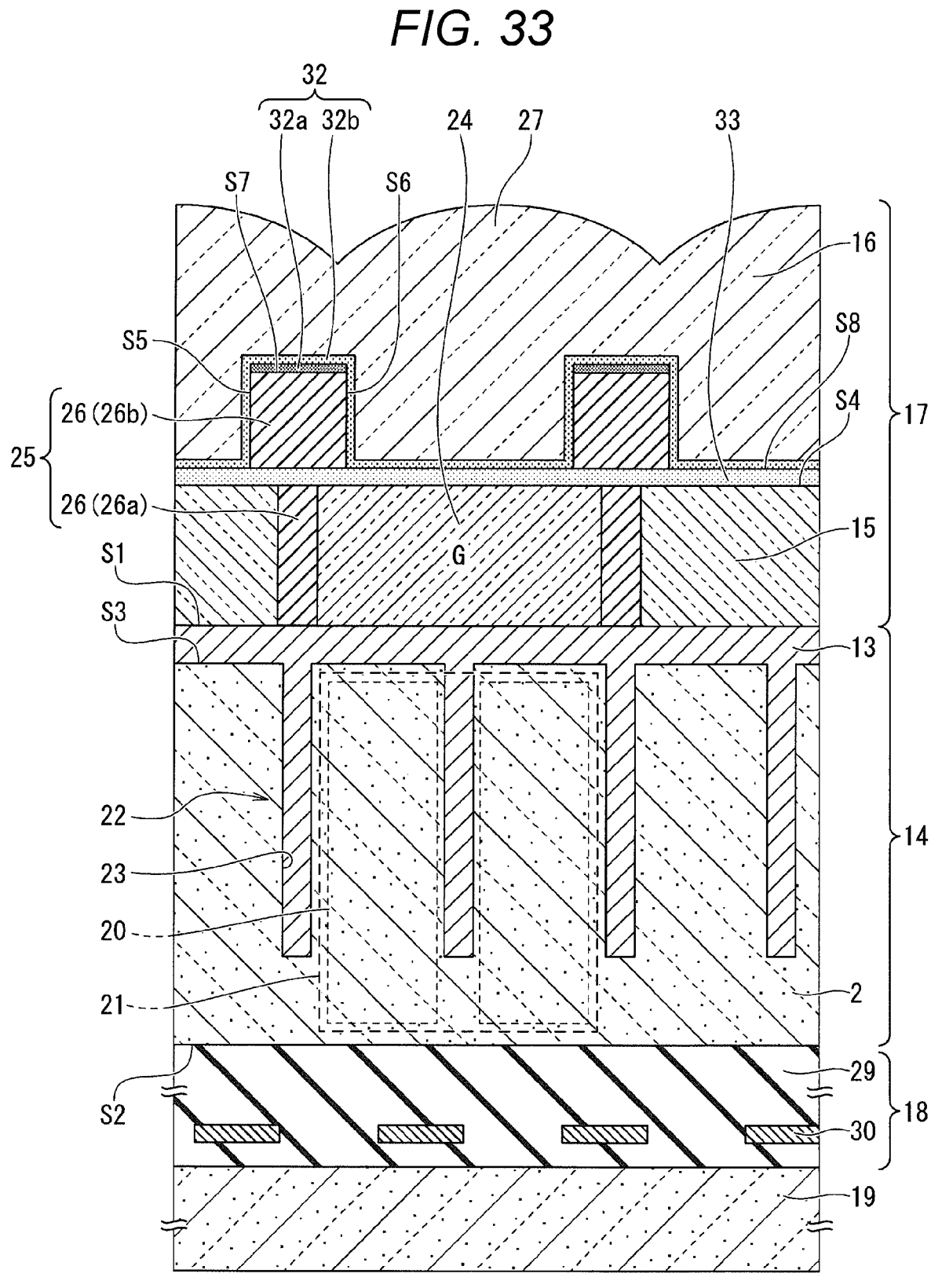

Note that the first portion 32*a* may be any portion of the protective film 32, and the second portion 32*b* is only required to be any portion different from the first portion 32*a*. For example, as illustrated in FIG. 33, in the solid-state imaging device 1 illustrated in FIG. 23A, in the protective film 32, a portion on the back surface S7 side of the upper partition layer 26*b* may have a two-layer structure in which a portion on a lower layer side is the first portion 32*a* and a remaining portion including a portion on an upper layer side is the second portion 32*b*. In FIG. 33, the first stopper film 33 is arranged on the back surface S4 (light receiving surface) of the color filter 24 to cover the entire back surface S4 (light receiving surface) of the color filter 24. Furthermore, the protective film 32 is arranged between the upper partition layer 26*b* and the microlens 27 and between the plurality of upper partition layers 26*b* to continuously cover the plurality of upper partition layers 26*b*. Note that the first portion 32*a* and the second portion 32*b* may include the same material, or may have a configuration in which other elements such as a film thickness are separately formed.

Figure 34:
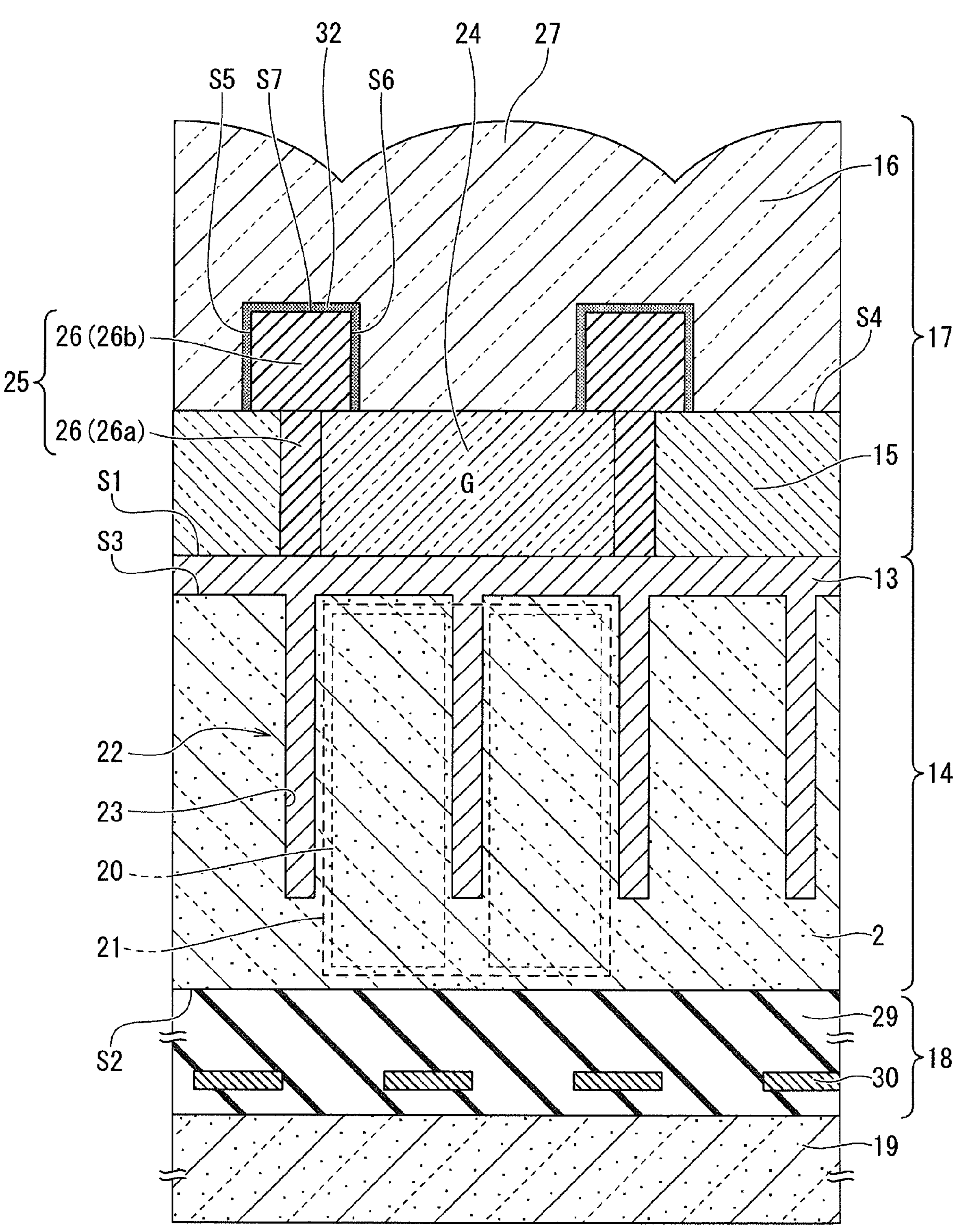
FIG. 34 is a view illustrating a cross-sectional configuration of a solid-state imaging device according to a modification.

(20) Furthermore, for example, as illustrated in FIG. 34, a configuration may be adopted in which the first stopper film 33 and the second stopper film 34 are omitted from the solid-state imaging devices 1 illustrated in FIGS. 22A, 22B, 23A, 23B, 24, 25, 26, 27A, 27B, 27C, 27D, 28, 29, 30, 31, 32, and 33. FIG. 34 is a view illustrating a case where the first stopper film 33 is omitted from the configuration of FIG. 22A.

Figure 35A:
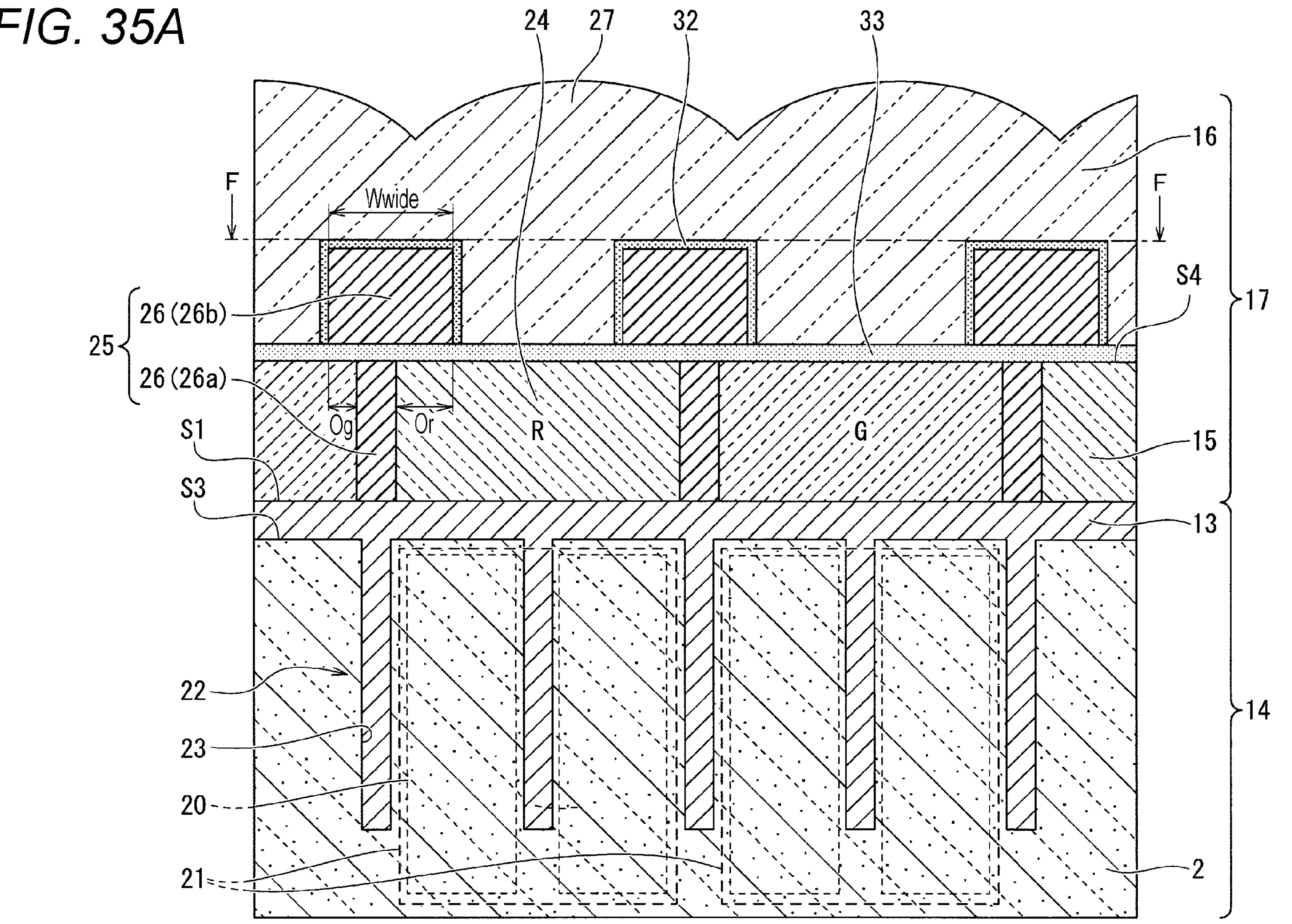
FIG. 35A is a view illustrating a cross-sectional configuration of a solid-state imaging device according to a modification.
Figure 35B:
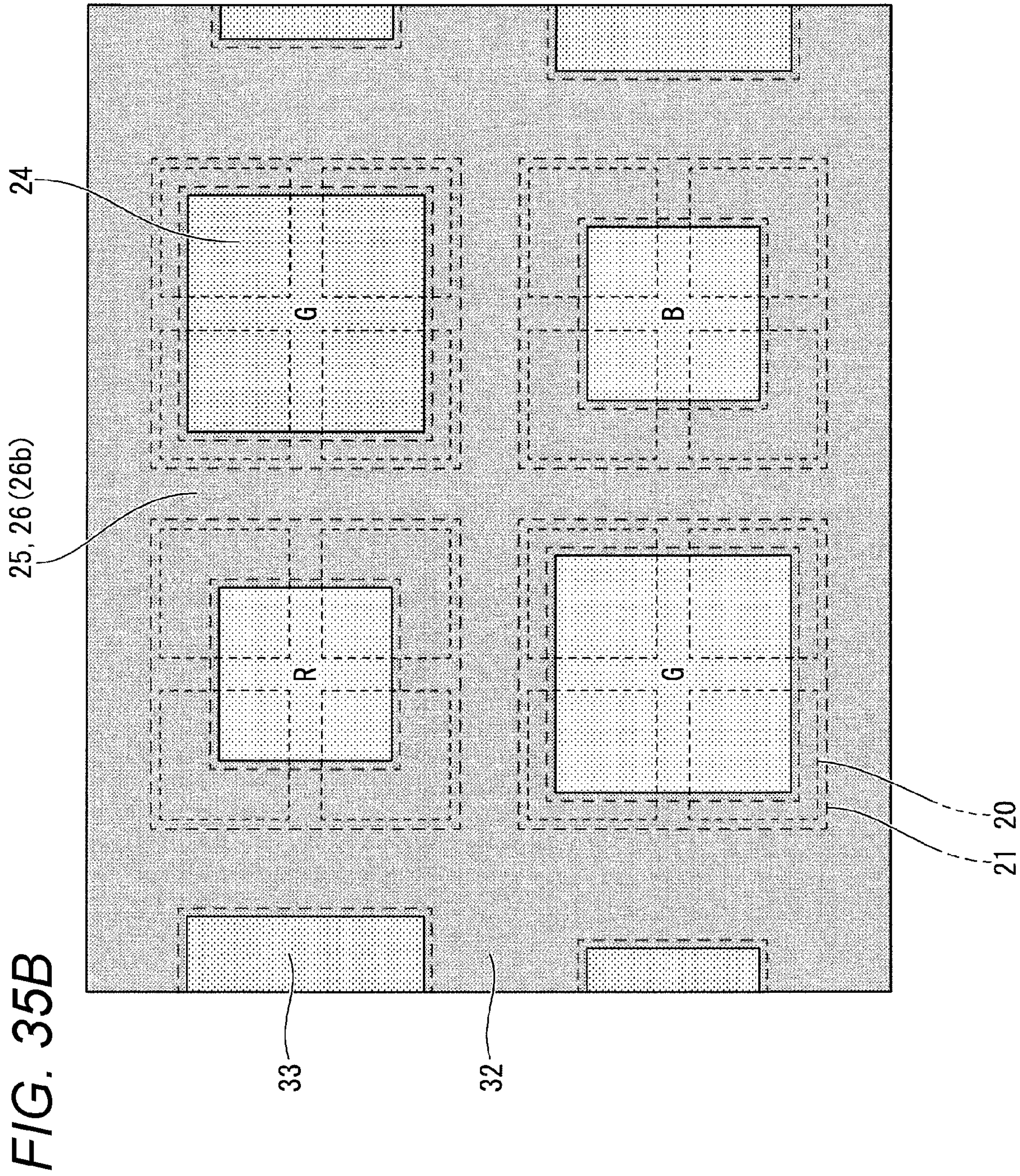
FIG. 35B is a view illustrating a cross-sectional configuration of the solid-state imaging device taken along line F-F in FIG. 35A.

(21) Furthermore, for example, as illustrated in FIGS. 35A and 35B, the solid-state imaging device 1 illustrated in FIGS. 22A and 22B may adopt a configuration in which a width of the low-refractive-index layer 25 is varied in a horizontally and vertically asymmetric manner according to any one of an incident wavelength, an incident angle (CRA), a pixel array, and a height of the low-refractive-index layer 25. FIGS. 35A and 35B illustrate a case of being applied to the solid-state imaging device 1 illustrated in FIGS. 22A and 22B. FIG. 35A illustrates a case of adopting a configuration in which the width-direction protruding amounts Or, Og, and Ob of a portion (the upper partition layer 26*b*) having the first width Wwide of the low-refractive-index layer 25 with respect to the color filter 24 side are made different for each type of the color filter 24 to which the portion protrudes. As an example, the width-direction protruding amount Or with respect to the color filter 24 that transmits red light=the width-direction protruding amount Ob with respect to the color filter 24 that transmits blue light>the width-direction protruding amount Og with respect to the color filter 24 that transmits green light. Therefore, for example, even if diffraction characteristics of light are different depending on a type, a wavelength, and a peripheral structure of the color filter 24, the light-condensed spot 31 can be formed at a more appropriate position by setting the width-direction protruding amounts Or, Og, and Ob of the low-refractive-index layer 25 to obtain the light-condensed spot 31 at the same position. FIG. 35B is a view illustrating a cross-sectional configuration of the solid-state imaging device 1 in a case of being taken along line F-F in FIG. 35A. Note that the microlens 27 is omitted in FIG. 35B to make the first stopper film 33 apparent.

Figure 36:
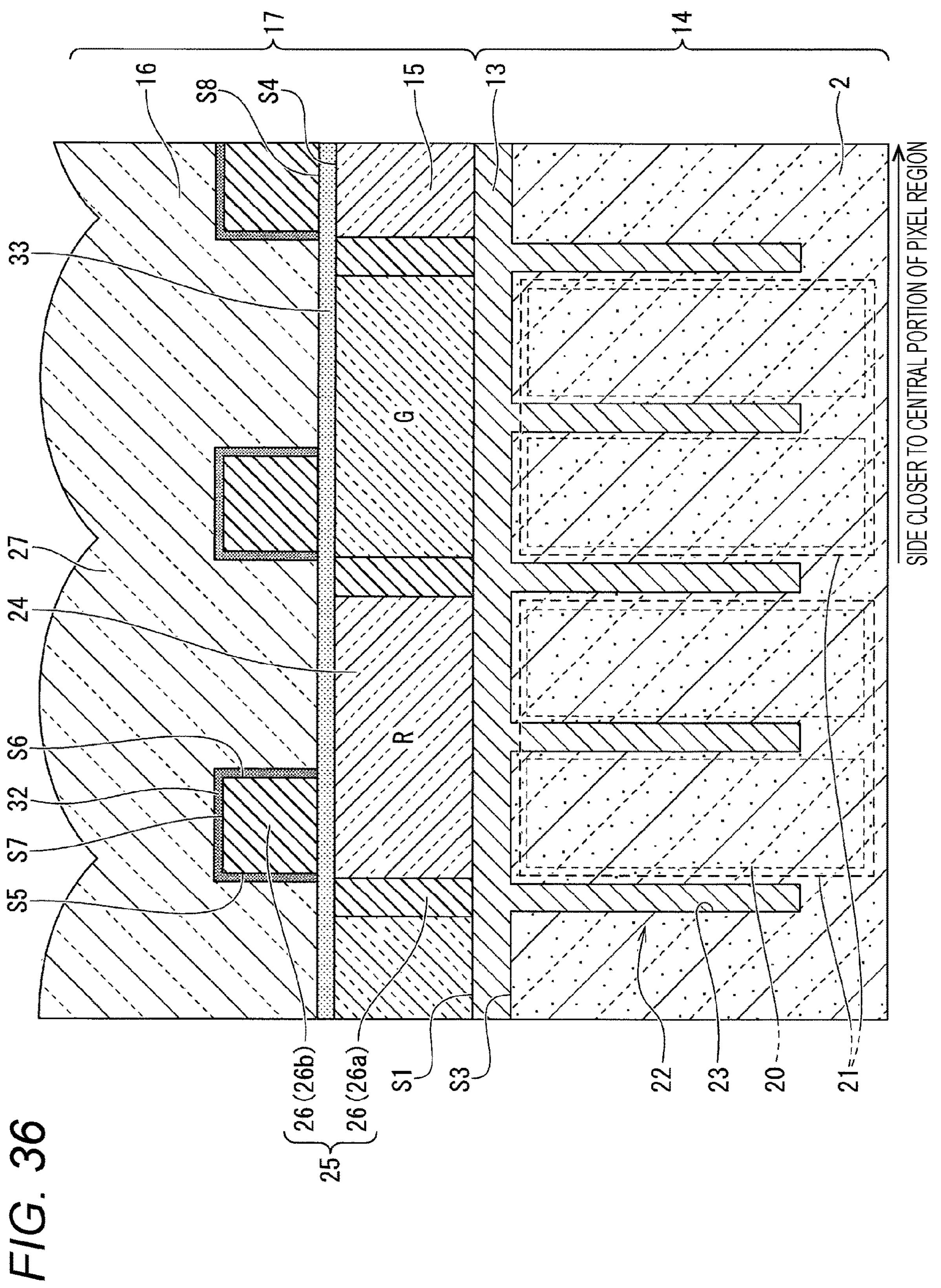
FIG. 36 is a view illustrating a cross-sectional configuration of a solid-state imaging device according to a modification.
Figure 37:
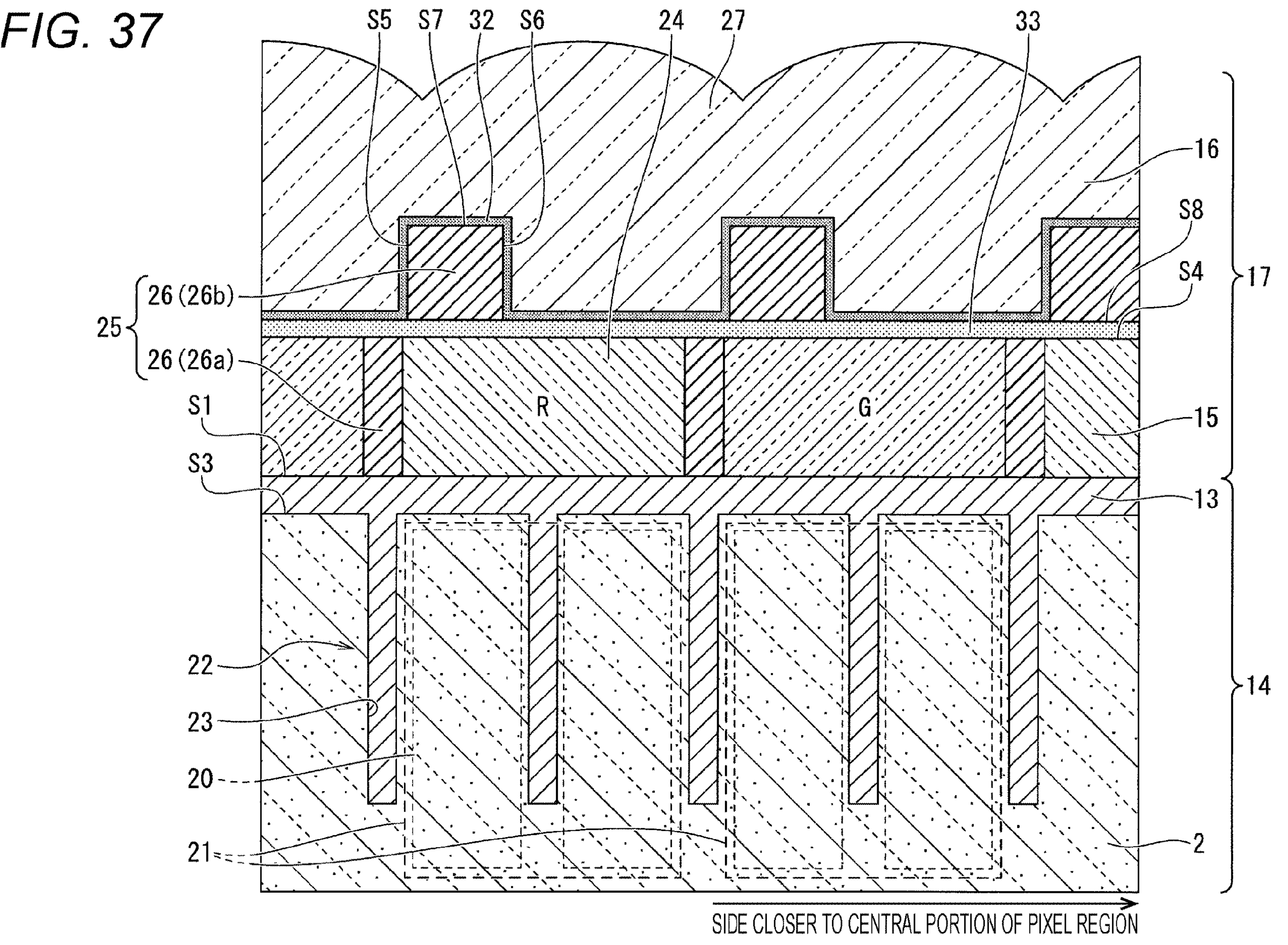
FIG. 37 is a view illustrating a cross-sectional configuration of a solid-state imaging device according to a modification.
Figure 38:
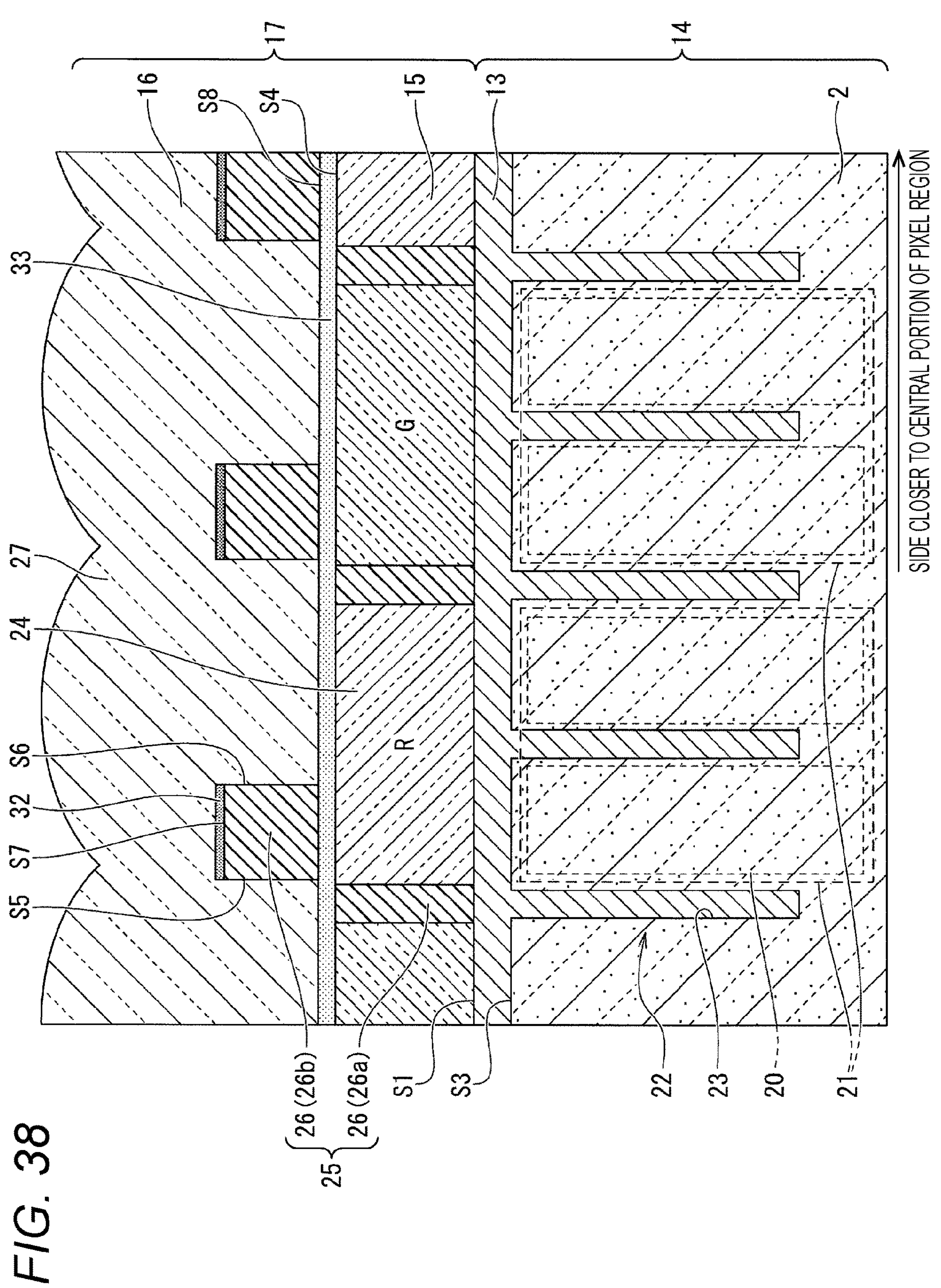
FIG. 38 is a view illustrating a cross-sectional configuration of a solid-state imaging device according to a modification.
Figure 39:
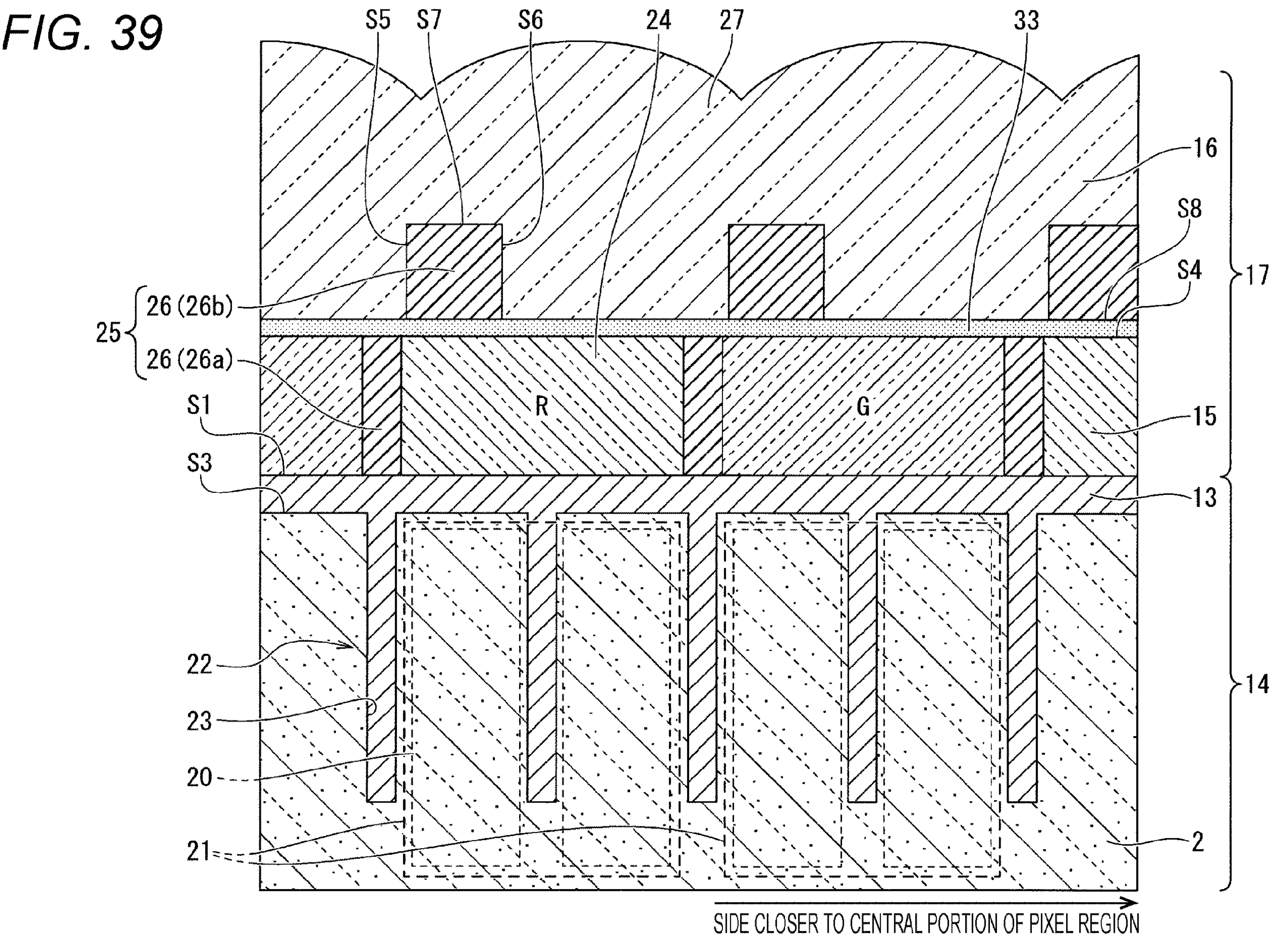
FIG. 39 is a view illustrating a cross-sectional configuration of a solid-state imaging device according to a modification.
Figure 40:
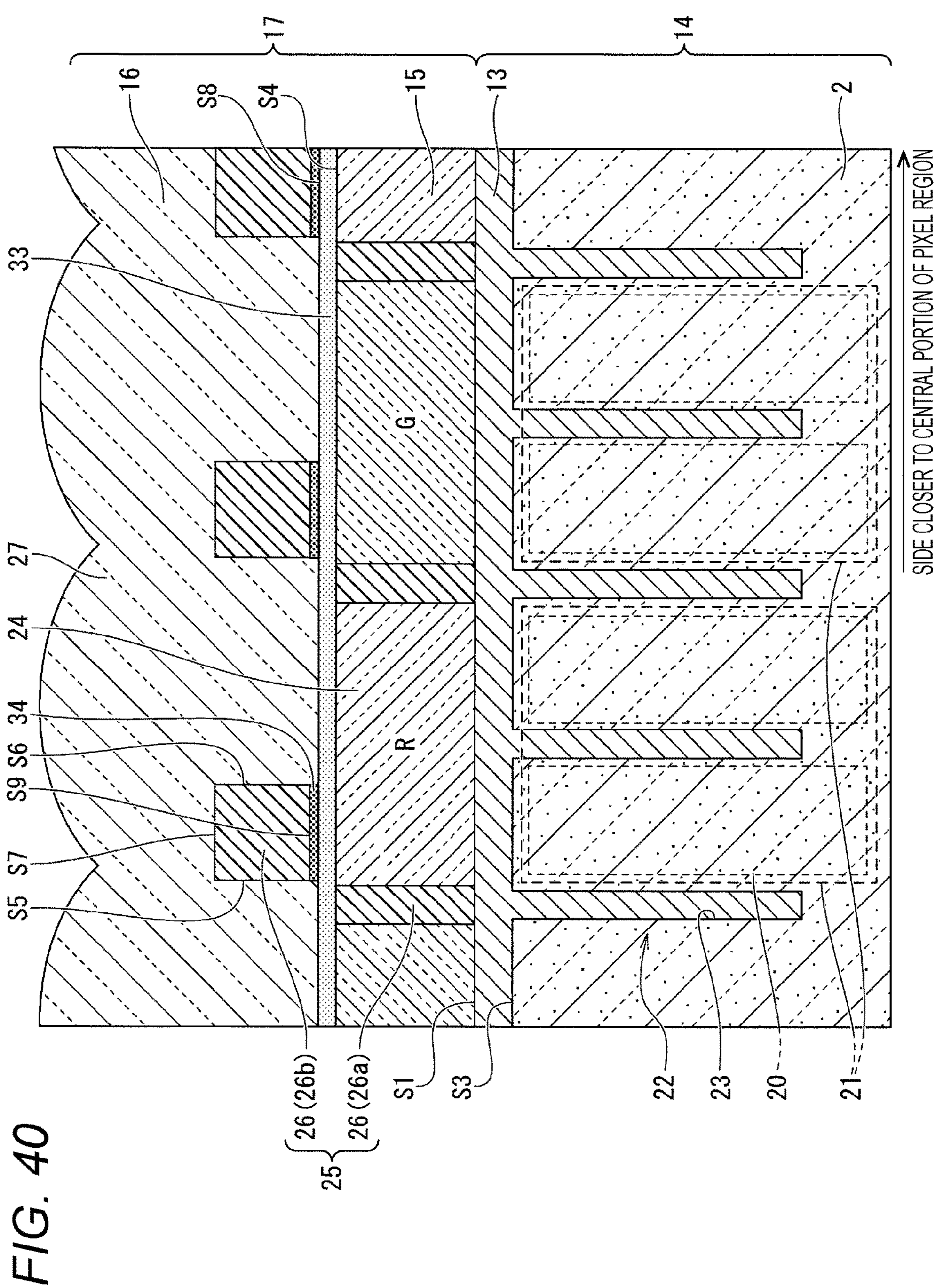
FIG. 40 is a view illustrating a cross-sectional configuration of a solid-state imaging device according to a modification.
Figure 41:
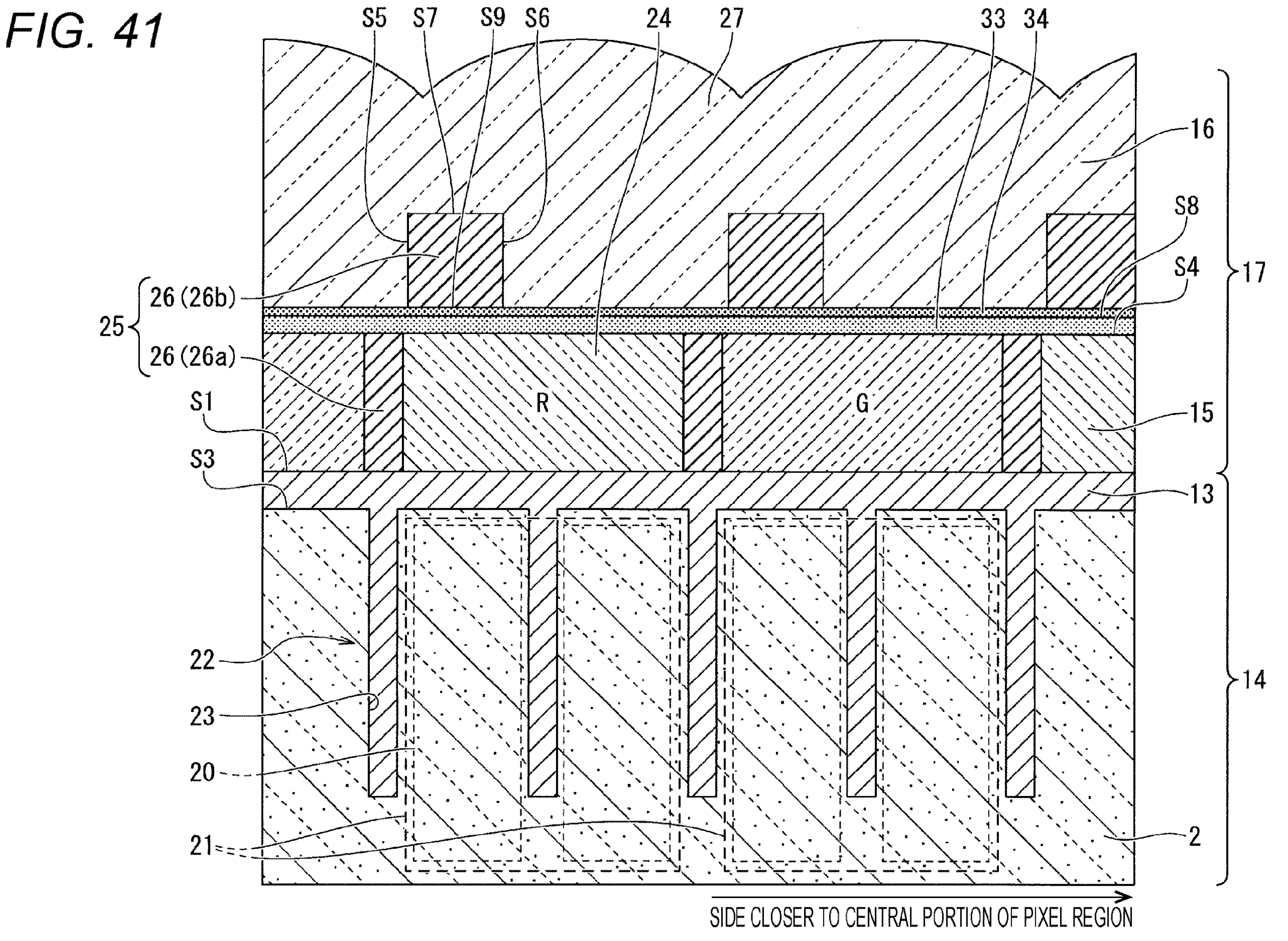
FIG. 41 is a view illustrating a cross-sectional configuration of a solid-state imaging device according to a modification.
Figure 42:
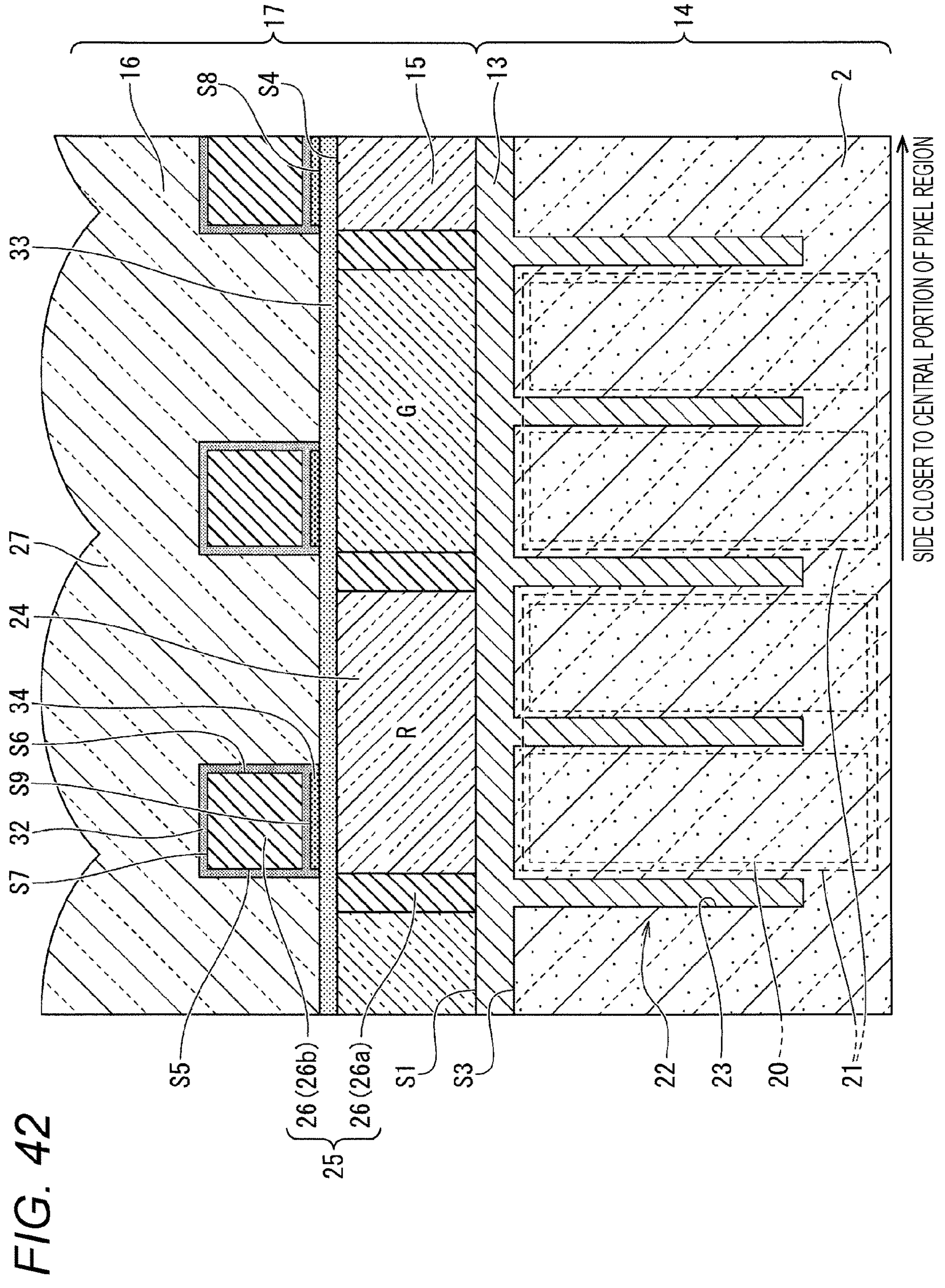
FIG. 42 is a view illustrating a cross-sectional configuration of a solid-state imaging device according to a modification.
Figure 43:
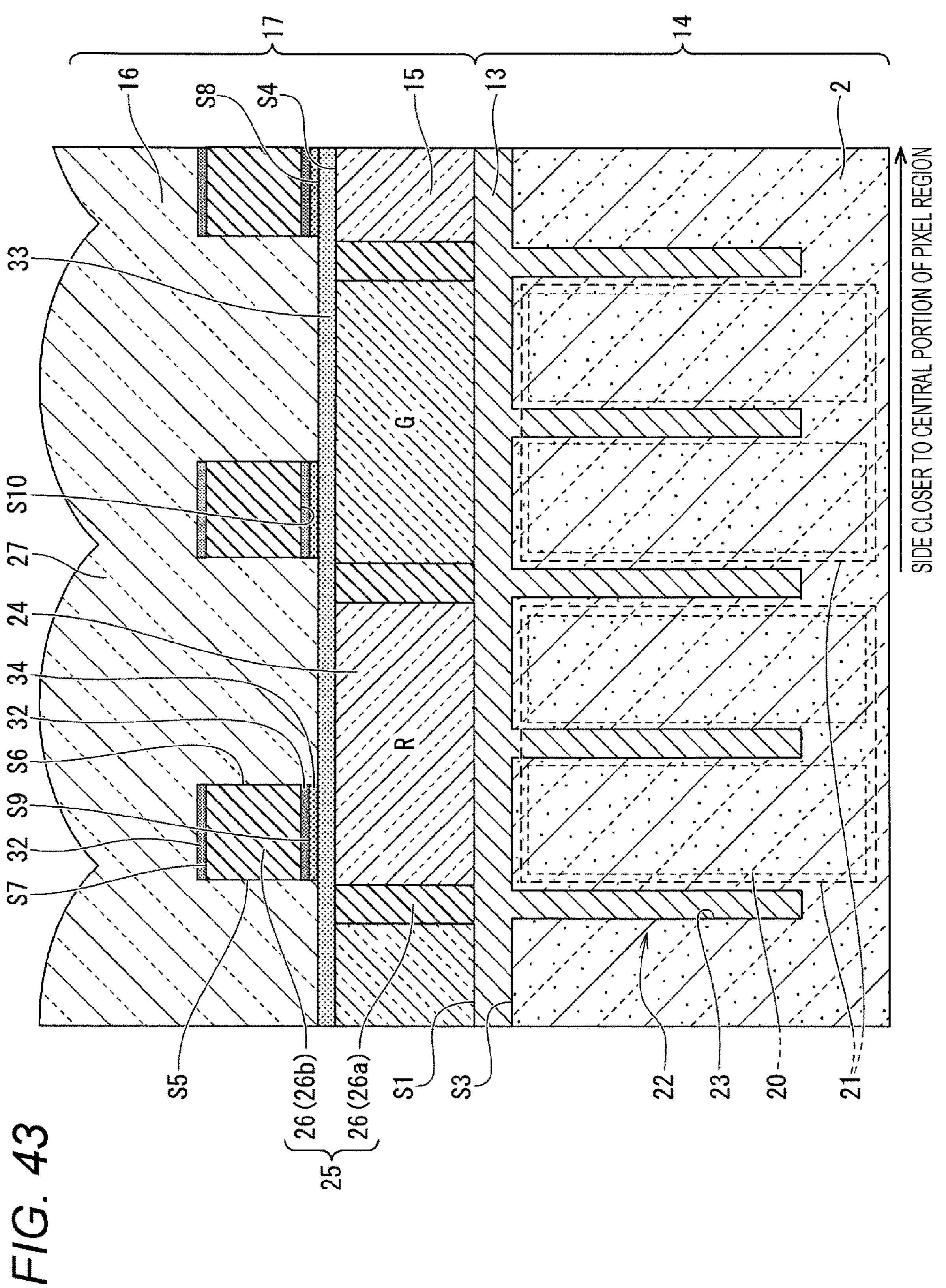
FIG. 43 is a view illustrating a cross-sectional configuration of a solid-state imaging device according to a modification.
Figure 44:
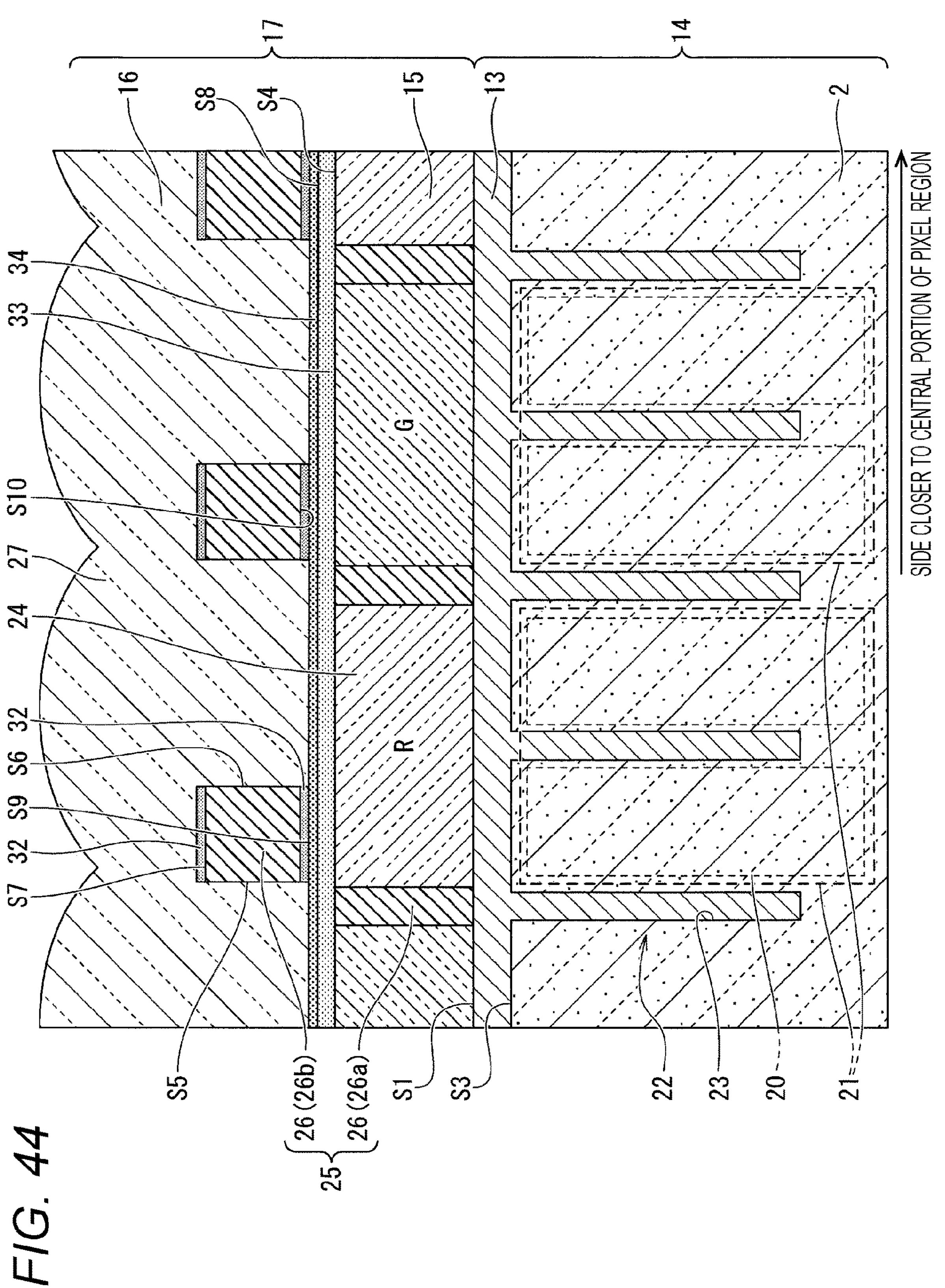
FIG. 44 is a view illustrating a cross-sectional configuration of a solid-state imaging device according to a modification.
Figure 45:
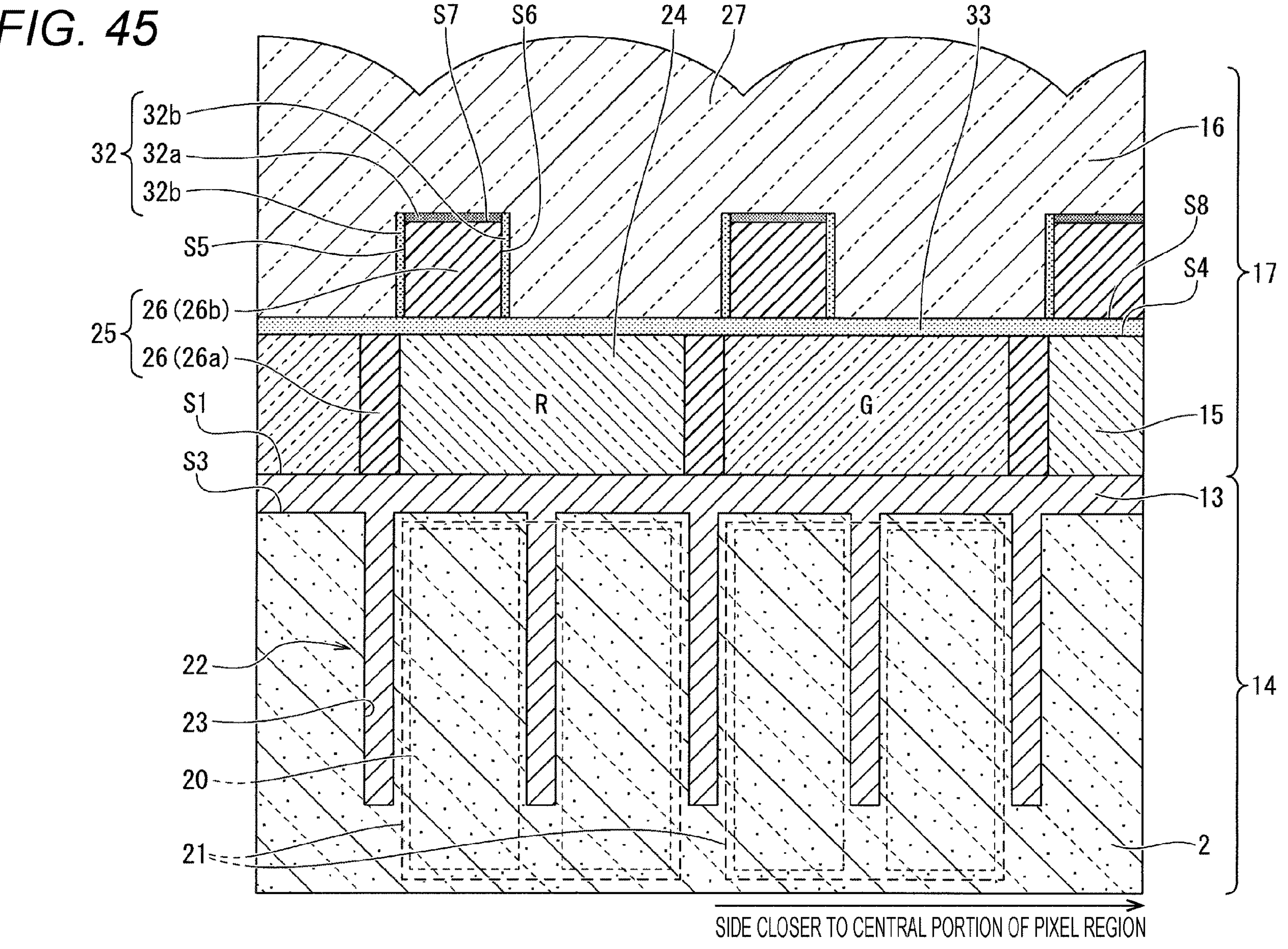
FIG. 45 is a view illustrating a cross-sectional configuration of a solid-state imaging device according to a modification.
Figure 46:
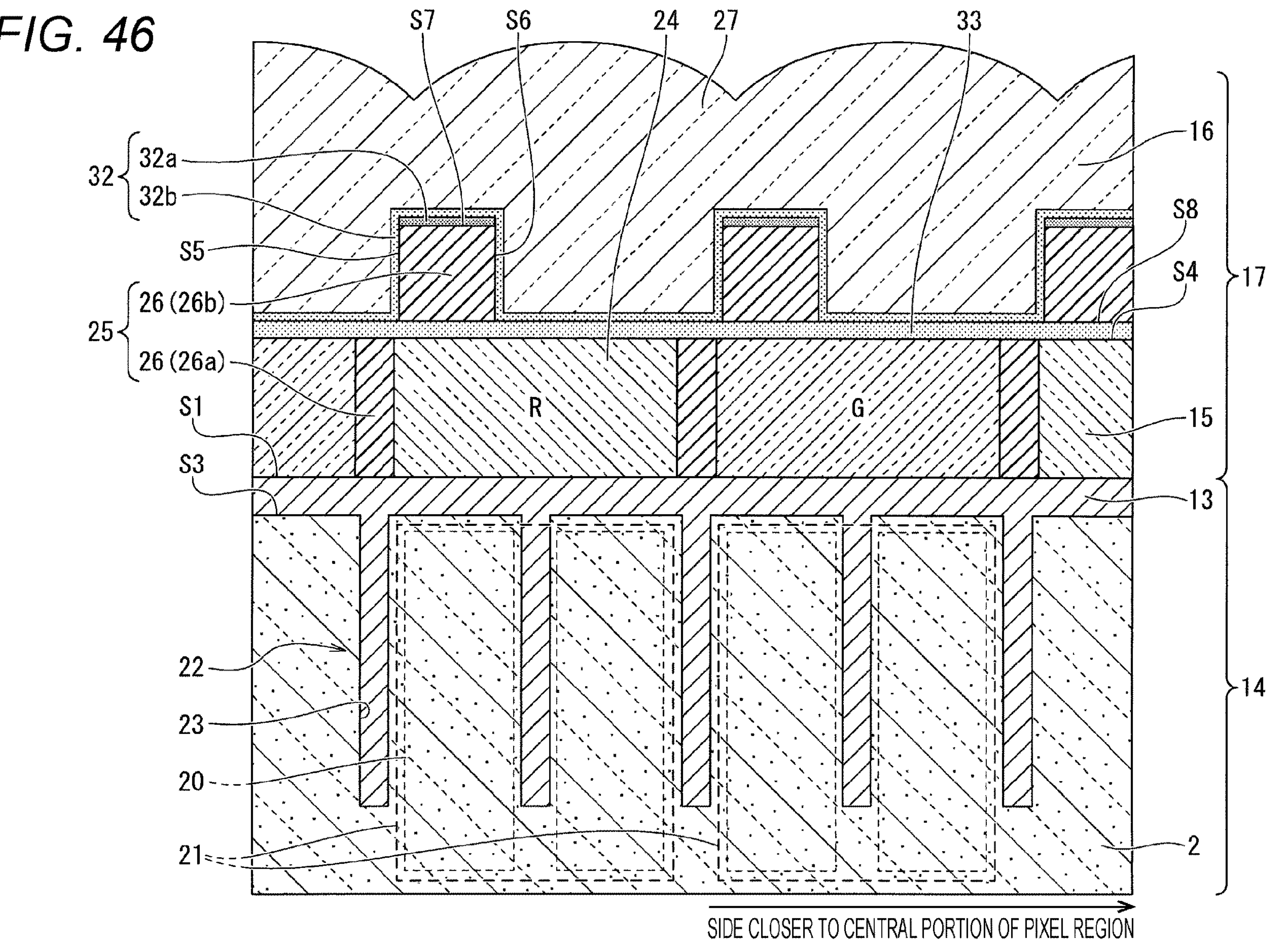
FIG. 46 is a view illustrating a cross-sectional configuration of a solid-state imaging device according to a modification.

(22) Furthermore, for example, as illustrated in FIG. 36, the solid-state imaging device 1 illustrated in FIG. 22A may adopt a configuration in which the low-refractive-index layer 25 is arranged at a position obtained by pupil correction. FIG. 36 illustrates a case of being applied to the solid-state imaging device 1 illustrated in FIG. 22A. Similarly, FIGS. 37, 38, 39, 40, 41, 42, 43, 44, 45, and 46 illustrate cases of being applied to the solid-state imaging devices 1 illustrated in FIGS. 23A, 24, 25, 26, 28, 29, 30, 31, 32, and 33, respectively. In FIGS. 36 to 46, the upper partition layer 26*b* is arranged at the position obtained by pupil correction. That is, from a central portion to an end portion side of the pixel region 3, linear portions constituting a lattice of the upper partition layer 26*b* in a plan view are shifted to a side closer to the central portion of the pixel region 3 than linear portions constituting a lattice of the pixel separation portion 22. The arrangement at the position obtained by the pupil correction enables suppression of unevenness in light receiving sensitivity between the photoelectric conversion units 20 included in the photoelectric conversion unit group 21 on the end portion side (high image height side) of the pixel region 3, and enables reduction in a light receiving sensitivity difference (inter-same-color sensitivity difference) between the photoelectric conversion units 20. Note that a correction amount of the color filter 24, a correction amount of the lower partition layer 26*a*, a correction amount of the upper partition layer 26*b*, and a correction amount of the microlens 27 may be different from each other in the pupil correction.

Figure 47:
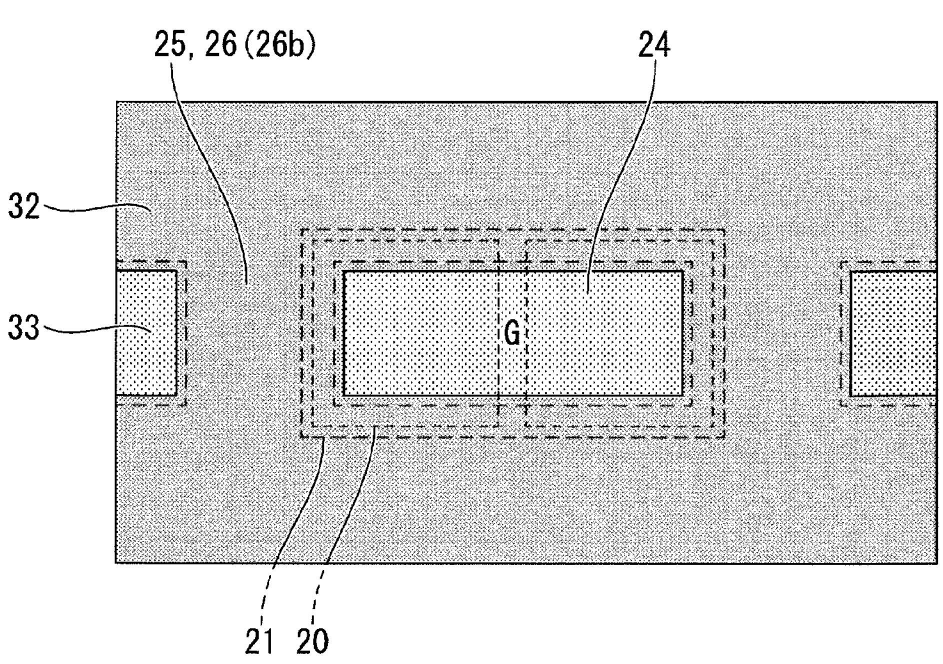
FIG. 47 is a view illustrating a cross-sectional configuration of a solid-state imaging device according to a modification taken at a position corresponding to line D-D in FIG. 22A.
Figure 48:
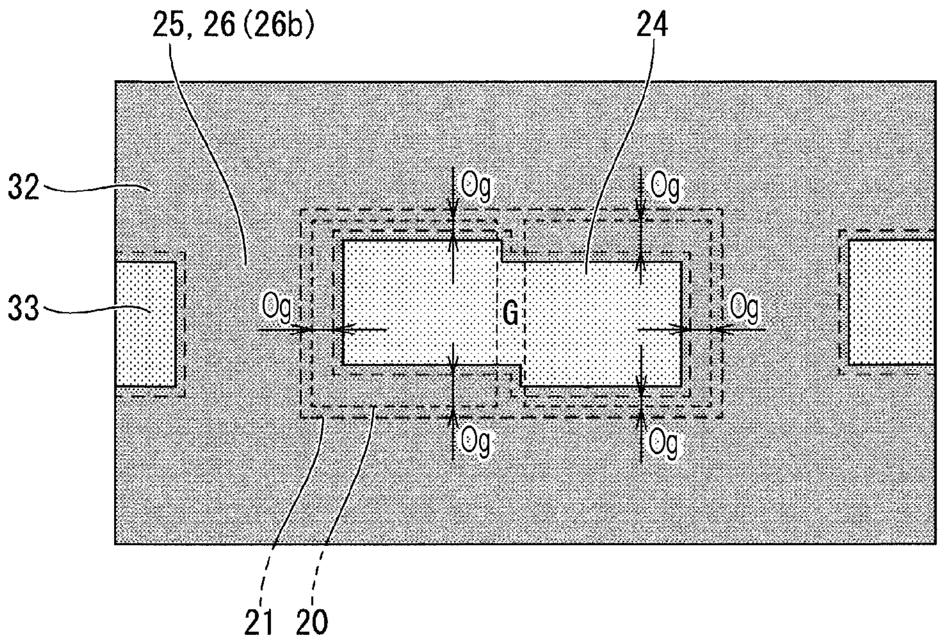
FIG. 48 is a view illustrating a cross-sectional configuration of a solid-state imaging device according to a modification taken at a position corresponding to line D-D in FIG. 22A.

(23) Furthermore, for example, as illustrated in FIG. 47, in the solid-state imaging device 1 illustrated in FIG. 22A, the photoelectric conversion unit group 21 may include two (2×1) photoelectric conversion units 20. FIG. 47 illustrates a case where two photoelectric conversion units 20, aligned in a row direction (horizontal direction in FIG. 47) and adjacent to each other, constitute the photoelectric conversion unit group 21. Therefore, one color filter 24 and one microlens 27 can be shared by the two adjacent photoelectric conversion units 20. The configuration of the photoelectric conversion unit group 21 illustrated in FIG. 47 can also be applied to the solid-state imaging devices 1 illustrated in FIGS. 23A, 23B, 24, 25, 26, 27A, 27B, 27C, 27D, 28, 29, 30, 31, 32, 33, 34, 35A, 35B, 36, 37, 38, 39, 40, 41, 42, 43, 44, 45, and 46. Furthermore, for example, in the case of being applied to the solid-state imaging devices 1 illustrated in FIGS. 36 to 45, the width-direction protruding amounts Or, Og, and Ob (only "Og" is illustrated in FIG. 48) of the low-refractive-index layer 25 with respect to the color filter 24 side may be changed in each part of the low-refractive-index layer 25 surrounding one color filter 24 as illustrated in FIG. 48.

(24) Furthermore, the present technology is applicable to any light detection device including not only the above-described solid-state imaging device as an image sensor but also a ranging sensor also called a time of flight (ToF) sensor that measures a distance, and the like. The ranging sensor is a sensor that emits irradiation light toward an object, detects reflected light that is the irradiation light reflected off a surface of the object, and calculates a distance to the object on the basis of a flight time from the emission of the irradiation light to the reception of the reflected light. As a light receiving pixel structure of the ranging sensor, the above-described structure of the pixel 9 may be adopted.

2. Second Embodiment: Example of Application to Electronic Device

The technology according to the present disclosure (present technology) may be applied to various electronic devices.

FIG. 49 is a diagram illustrating an example of a schematic configuration of an imaging device (a video camera, a digital still camera, or the like) as an electronic device to which the present disclosure is applied.

As depicted in FIG. 49, an imaging device 1000 includes the lens group 1001, the solid-state imaging device 1002 (the solid-state imaging device 1 according to the first embodiment), a digital signal processor (DSP) circuit 1003, a frame memory 1004, a monitor 1005, and a memory 1006. The DSP circuit 1003, the frame memory 1004, the monitor 1005, and the memory 1006 are connected to each other via a bus line 1007.

The lens group 1001 guides incident light (image light) from a subject to the solid-state imaging device 1002, and forms an image on a light receiving surface (pixel region) of the solid-state imaging device 1002.

The solid-state imaging device 1002 is configured using the CMOS image sensor according to the first embodiment described above. The solid-state imaging device 1002 converts an amount of incident light formed on the light receiving surface by the lens group 1001, into an electric signal on a pixel-by-pixel basis, and supplies the electric signal as a pixel signal, to the DSP circuit 1003.

The DSP circuit 1003 performs predetermined image processing on the pixel signal supplied from the solid-state imaging device 1002. Then, the DSP circuit 1003 supplies image signals after the image processing to the frame memory 1004 in units of frames, and temporarily stores the image signals in the frame memory 1004.

The monitor 1005 is configured using, for example, a panel display device such as a liquid crystal panel or an organic electro luminescence (EL) panel. The monitor 1005 displays an image (moving image) of the subject on the basis of the pixel signals in units of frames temporarily stored in the frame memory 1004.

The memory 1006 is configured using a DVD, a flash memory, and the like. The memory 1006 reads and records the pixel signals in units of frames temporarily stored in the frame memory 1004.

Note that the electronic device to which the solid-state imaging device 1 can be applied is not limited to the imaging device 1000, and the solid-state imaging device 1 can also be applied to other electronic devices.

Furthermore, the solid-state imaging device 1 according to the first embodiment is used as the solid-state imaging device 1002 in the configuration, other configurations can also be adopted. For example, other light detection devices to which the present technology is applied, such as the solid-state imaging devices 1 according to the modifications of the first embodiment, may be used.

Note that the present technology may also have the following configurations.

(1)

A light detection device including:

a substrate having a plurality of photoelectric conversion units arranged in a two-dimensional array;

a microlens layer that is arranged on a side close to a light receiving surface of the substrate and includes a plurality of microlenses formed to correspond to a photoelectric conversion unit group including at least two adjacent photoelectric conversion units among the plurality of photoelectric conversion units;

a color filter layer that is arranged between the substrate and the microlens layer, and includes a plurality of color filters transmitting light of a predetermined wavelength component contained in light condensed by the microlens; and a low-refractive-index layer that is at least partially arranged between the color filters, and contains air or a low-refractive-index material having a lower refractive index than a material of an adjacent layer, in which the low-refractive-index layer has a first width on a side close to the microlens and has a second width narrower than the first width on a side closer to the substrate than a portion having the first width. In other words, this (1) can also be said to be "a light detection device including:

a substrate having a plurality of photoelectric conversion units arranged in a two-dimensional array;

a microlens layer that is arranged on a side close to a light receiving surface of the substrate and includes a plurality of microlenses formed to correspond to a photoelectric conversion unit group including at least two adjacent photoelectric conversion units among the plurality of photoelectric conversion units;

a color filter layer that is arranged between the substrate and the microlens layer, and includes a plurality of color filters transmitting light of a predetermined wavelength component contained in light condensed by the microlens; and a low-refractive-index layer that is at least partially arranged between the color filters, in which the low-refractive-index layer contains air or a low-refractive-index material having a lower refractive index than a substance in contact with the refractive index layer in a direction parallel to the light receiving surface of the substrate, and further has a first width on a side close to the microlens and a second width narrower than the first width on a side closer to the substrate than a portion having the first width."

(2)

The light detection device according to (1), in which the low-refractive-index layer includes a plurality of stages of partition layers that is at least partially arranged between the color filters and is arrayed in a direction perpendicular to the light receiving surface of the substrate.

(3)

The light detection device according to (2), in which the low-refractive-index layer includes the partition layers in two stages, and a width of an upper partition layer, which is the partition layer in a stage on the side close to the microlens, is wider than a width of a lower partition layer which is the partition layer in a stage on a side close to the substrate.

(4)

The light detection device according to (3), in which the width of the upper partition layer continuously increases toward the side close to the microlens.

(5)

The light detection device according to (3) or (4), in which the lower partition layer is entirely present between the color filters, and the upper partition layer is entirely present on a side closer to the microlens than a light receiving surface of the color filter.

(6)

The light detection device according to (5), further including a protective film that is arranged between the upper partition layer and the microlens and covers the upper partition layer.

(7)

The light detection device according to (6), further including a first stopper film that is arranged on the light receiving surface of the color filter and covers a whole of the light receiving surface of the color filter, in which the upper partition layer is arranged on a light receiving surface of the first stopper film in a state of being covered with the protective film.

(8)

The light detection device according to (5), further including a protective film that is arranged between the upper partition layer and the microlens and between a plurality of the upper partition layers and continuously covers a plurality of the upper partition layers.

(9)

The light detection device according to (5), further including a protective film that is arranged between the upper partition layer and the microlens and covers only a surface of the upper partition layer on a side opposite to a surface on a side close to the color filter.

(10)

The light detection device according to (5), further including a first stopper film that is arranged on the light receiving surface of the color filter and covers a whole of the light receiving surface of the color filter, in which the upper partition layer is arranged on a light receiving surface of the first stopper film.

(11)

The light detection device according to (5), further including:

a first stopper film that is arranged on the light receiving surface of the color filter and covers a whole of the light receiving surface of the color filter; and a second stopper film that is arranged on a light receiving surface of the first stopper film and covers only a portion of the light receiving surface of the first stopper film, the portion opposing the upper partition layer, in which the upper partition layer is arranged on a light receiving surface of the second stopper film.

(12)

The light detection device according to (5), further including:

a first stopper film that is arranged on the light receiving surface of the color filter and covers a whole of the light receiving surface of the color filter; and a second stopper film that is arranged on a light receiving surface of the first stopper film and covers a whole of the light receiving surface of the first stopper film, in which the upper partition layer is arranged on a light receiving surface of the second stopper film.

(13)

The light detection device according to (5), further including:

a first stopper film that is arranged on the light receiving surface of the color filter and covers a whole of the light receiving surface of the color filter;

a second stopper film that is arranged on a light receiving surface of the first stopper film and covers only a portion opposing the upper partition layer; and a protective film covering the upper partition layer, in which the upper partition layer is arranged on a light receiving surface of the second stopper film in a state of being covered with the protective film.

(14)

The light detection device according to (5), further including:

a first stopper film that is arranged on the light receiving surface of the color filter and covers a whole of the light receiving surface of the color filter;

a second stopper film that is arranged on a light receiving surface of the first stopper film and covers only a portion opposing the upper partition layer; and a protective film covering only a surface of the upper partition layer on a side close to the color filter and a surface opposite to the surface, in which the upper partition layer is arranged on a light receiving surface of the second stopper film in a state of being covered with the protective film.

(15)

The light detection device according to (5), further including:

a first stopper film that is arranged on the light receiving surface of the color filter and covers a whole of the light receiving surface of the color filter;

a second stopper film that is arranged on a light receiving surface of the first stopper film and covers a whole of the light receiving surface of the first stopper film; and a protective film covering only a surface of the upper partition layer on a side close to the color filter and a surface opposite to the surface, in which the upper partition layer is arranged on a light receiving surface of the second stopper film in a state of being covered with the protective film.

(16)

The light detection device according to (6), in which the protective film has a first portion and a second portion different from the first portion which are separately formed.

(17)

The light detection device according to (8), in which the protective film has a first portion and a second portion different from the first portion which are separately formed.

(18)

The light detection device according to (2), in which the low-refractive-index layer includes the partition layers in three stages, and a width of the partition layer in a stage on a side closest to the microlens and a width of the partition layer in a stage on a side closest to the substrate are wider than a width of the partition layer in a stage between both the stages.

(19)

The light detection device according to any one of (2) to (6), in which the partition layer in one stage among the plurality of stages of the partition layers and the partition layer in another stage, adjacent to the partition layer in the one stage, are separated from each other.

(20)

The light detection device according to (1), in which the low-refractive-index layer has a width continuously increasing toward the side close to the microlens over a whole of the low-refractive-index layer.

(21)

The light detection device according to any one of (1) to (20), in which the low-refractive-index layer has a refractive index different at each height position in the low-refractive-index layer.

(22)

The light detection device according to any one of (1) to (21), in which a width-direction protruding amount of the portion having the first width of the low-refractive-index layer with respect to a side close to the color filter is different for each type of the color filter to which the portion protrudes.

(23)

The light detection device according to any one of (1) to (22), in which the low-refractive-index layer is arranged at a position where pupil correction has been performed.

(24)

The light detection device according to any one of (1) to (23), in which the photoelectric conversion unit group includes four photoelectric conversion units in two rows and two columns or two photoelectric conversion units in one row and two columns among the plurality of photoelectric conversion units (25)

An electronic device including a light detection device that includes:

a substrate having a plurality of photoelectric conversion units arranged in a two-dimensional array;

a microlens layer that is arranged on a side close to a light receiving surface of the substrate and includes a plurality of microlenses formed to correspond to a photoelectric conversion unit group including at least two adjacent photoelectric conversion units among the plurality of photoelectric conversion units;

a color filter layer that is arranged between the substrate and the microlens layer, and includes a plurality of color filters transmitting light of a predetermined wavelength component contained in light condensed by the microlens; and a low-refractive-index layer that is at least partially arranged between the color filters, and contains air or a low-refractive-index material having a lower refractive index than a material of an adjacent layer, in which the low-refractive-index layer has a first width on a side close to the microlens and has a second width narrower than the first width on a side closer to the substrate than a portion having the first width.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9 Pixel
10 Pixel drive wiring
11 Vertical signal line
12 Horizontal signal line
13 Insulating film
14 Light receiving layer
15 Color filter layer
16 Microlens layer
17 Light condensing layer
18 Wiring layer
19 Support substrate
20 Photoelectric conversion unit
21 Photoelectric conversion unit group
22 Pixel separation portion
23 Trench
24 Color filter
25 Low-refractive-index layer 25 Partition layer
**26*a*** Lower partition layer
**26*b*** Upper partition layer
**26*c*** Uppermost partition layer
**26*d*** Lower partition layer
**26*e*** Middle partition layer
**26*f*** Upper partition layer
27 Microlens
28 Incident light
29 Interlayer insulating film
30 Wiring
31 Light-condensed spot
32 Protective film
**32*a*** First portion
**32*b*** Second portion
33 First stopper film
34 Second stopper film

The invention claimed is:

1. A light detection device, comprising:

a substrate having a plurality of photoelectric conversion units in a two-dimensional array;

a microlens layer on a side close to a light receiving surface of the substrate, wherein the microlens layer includes a plurality of microlenses, and each microlens of the plurality of microlenses is formed to correspond to a photoelectric conversion unit group including at least two adjacent photoelectric conversion units among the plurality of photoelectric conversion units;

a color filter layer between the substrate and the microlens layer, wherein the color filter layer includes a plurality of color filters configured to transmit light of a specific wavelength component contained in light condensed by the plurality of microlenses; and a low-refractive-index layer at least partially between color filters of the plurality of color filters, wherein the low-refractive-index layer contains air or a low-refractive-index material having a refractive index lower than a refractive index of a material of an adjacent layer, the low-refractive-index layer has a first width on a side close to the microlens layer and has a second width on a side closer to the substrate than a portion having the first width, the second width of the low-refractive-index layer is narrower than the first width of the low-refractive-index layer, the low-refractive-index layer includes partition layers in two stages that are at least partially arranged between the color filters and are arrayed in a direction perpendicular to the light receiving surface of the substrate, a width of an upper partition layer, which is a partition layer in an upper stage on the side close to the microlens layer, is wider than a width of a lower partition layer, which is a partition layer in a lower stage on a side close to the substrate, the lower partition layer is entirely present between the color filters, and the upper partition layer is entirely present on a side closer to the microlens layer than a light receiving surface of the color filters.

2. The light detection device according to claim 1, wherein the width of the upper partition layer continuously increases toward the side close to the microlens layer.

3. The light detection device according to claim 1, further comprising a protective film between the upper partition layer and the microlens layer, wherein the protective film covers the upper partition layer.

4. The light detection device according to claim 3, further comprising a first stopper film on the light receiving surface of the color filters, wherein the first stopper film covers a whole of the light receiving surface of the color filters, and the upper partition layer is on a light receiving surface of the first stopper film in a state of being covered with the protective film.

5. The light detection device according to claim 3, wherein the protective film has a first portion and a second portion which are separately formed, and the first portion is different from the second portion.

6. The light detection device according to claim 1, further comprising a protective film between the upper partition layer and the microlens layer and between a plurality of upper partition layers, wherein the protective film continuously covers the plurality of upper partition layers, and the plurality of upper partition layers include the upper partition layer.

7. The light detection device according to claim 6, wherein the protective film has a first portion and a second portion which are separately formed, and the first portion is different from the second portion.

8. The light detection device according to claim 1, further comprising a protective film between the upper partition layer and the microlens layer, wherein the protective film covers only a surface of the upper partition layer on a side opposite to a surface on a side close to the color filters.

9. The light detection device according to claim 1, further comprising a first stopper film on the light receiving surface of the color filters, wherein the first stopper film covers a whole of the light receiving surface of the color filters, and the upper partition layer is on a light receiving surface of the first stopper film.

10. The light detection device according to claim 1, further comprising:

a first stopper film on the light receiving surface of the color filters, wherein the first stopper film covers a whole of the light receiving surface of the color filters; and a second stopper film on a light receiving surface of the first stopper film, wherein the second stopper film covers only a portion of the light receiving surface of the first stopper film, the portion is opposite to the upper partition layer, and the upper partition layer is on a light receiving surface of the second stopper film.

11. The light detection device according to claim 1, further comprising:

a first stopper film on the light receiving surface of the color filters, wherein the first stopper film covers a whole of the light receiving surface of the color filters; and a second stopper film on a light receiving surface of the first stopper film, wherein the second stopper film covers a whole of the light receiving surface of the first stopper film, and the upper partition layer is on a light receiving surface of the second stopper film.

12. The light detection device according to claim 1, further comprising:

a first stopper film on the light receiving surface of the color filters, wherein the first stopper film covers a whole of the light receiving surface of the color filters;

a second stopper film on a light receiving surface of the first stopper film, wherein the second stopper film covers only a portion opposing the upper partition layer; and a protective film that covers the upper partition layer, wherein the upper partition layer is on a light receiving surface of the second stopper film in a state of being covered with the protective film.

13. The light detection device according to claim 1, further comprising:

a first stopper film on the light receiving surface of the color filters, wherein the first stopper film covers a whole of the light receiving surface of the color filters;

a second stopper film on a light receiving surface of the first stopper film, wherein the second stopper film covers only a portion opposing the upper partition layer; and a protective film that covers only a surface of the upper partition layer on a side close to the color filters and a surface opposite to the surface, wherein the upper partition layer is on a light receiving surface of the second stopper film in a state of being covered with the protective film.

14. The light detection device according to claim 1, further comprising:

a first stopper film on the light receiving surface of the color filters, wherein the first stopper film covers a whole of the light receiving surface of the color filters;

a second stopper film on a light receiving surface of the first stopper film, wherein the second stopper film covers a whole of the light receiving surface of the first stopper film; and a protective film that covers only a surface of the upper partition layer on a side close to the color filters and a surface opposite to the surface, wherein the upper partition layer is on a light receiving surface of the second stopper film in a state of being covered with the protective film.

15. The light detection device according to claim 1, wherein the low-refractive-index layer includes the partition layers in three stages, and a width of a partition layer in a first stage on a side closest to the microlens layer and a width of a partition layer in a second stage on a side closest to the substrate are wider than a width of a partition layer in a third stage between the first stage and the second stage.

16. The light detection device according to claim 1, wherein the partition layer in the upper stage and the partition layer in the lower stage, adjacent to the partition layer in the upper stage, are separated from each other.

17. The light detection device according to claim 1, wherein the low-refractive-index layer has a width that continuously increases toward the side close to the microlens layer over a whole of the low-refractive-index layer.

18. The light detection device according to claim 1, wherein the low-refractive-index layer has a refractive index different at each height position in the low-refractive-index layer.

19. The light detection device according to claim 1, wherein a width-direction protruding amount of the portion having the first width of the low-refractive-index layer with respect to a side close to the color filters is different for each type of the color filters to which the portion protrudes.

20. The light detection device according to claim 1, wherein the low-refractive-index layer is at a position where pupil correction has been performed.

21. The light detection device according to claim 1, wherein the photoelectric conversion unit group includes four photoelectric conversion units in two rows and two columns or two photoelectric conversion units in one row and two columns among the plurality of photoelectric conversion units.

22. An electronic device, comprising:

a light detection device that includes:

a substrate having a plurality of photoelectric conversion units in a two-dimensional array;

a microlens layer on a side close to a light receiving surface of the substrate, wherein the microlens layer includes a plurality of microlenses, and each microlens of the plurality of microlenses is formed to correspond to a photoelectric conversion unit group including at least two adjacent photoelectric conversion units among the plurality of photoelectric conversion units;

a color filter layer between the substrate and the microlens layer, wherein the color filter layer includes a plurality of color filters configured to transmit light of a specific wavelength component contained in light condensed by the plurality of microlenses; and a low-refractive-index layer at least partially between color filters of the plurality of color filters, wherein the low-refractive-index layer contains air or a low-refractive-index material having a refractive index lower than a refractive index of a material of an adjacent layer, the low-refractive-index layer has a first width on a side close to the microlens layer and has a second width on a side closer to the substrate than a portion having the first width, the second width of the low-refractive-index layer is narrower than the first width of the low-refractive-index layer, the low-refractive-index layer includes partition layers in two stages that are at least partially arranged between the color filters and are arrayed in a direction perpendicular to the light receiving surface of the substrate, a width of an upper partition layer, which is a partition layer in a stage on the side close to the microlens layer, is wider than a width of a lower partition layer, which is a partition layer in a stage on a side close to the substrate, the lower partition layer is entirely present between the color filters, and the upper partition layer is entirely present on a side closer to the microlens layer than a light receiving surface of the color filters.

* * * * *